United States Patent
Uenishi et al.

(10) Patent No.: US 6,962,766 B2
(45) Date of Patent: Nov. 8, 2005

(54) POSITIVE PHOTORESIST COMPOSITION

(75) Inventors: Kazuya Uenishi, Shizuoka (JP); Toshiaki Aoai, Shizuoka (JP); Kenichiro Sato, Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 160 days.

(21) Appl. No.: 10/109,872

(22) Filed: Apr. 1, 2002

(65) Prior Publication Data

US 2003/0031950 A1 Feb. 13, 2003

(30) Foreign Application Priority Data

Mar. 30, 2001 (JP) ..................................... P.2001-100300

(51) Int. Cl.$^7$ ............................................. G03F 7/004
(52) U.S. Cl. ................................................... 430/270.1
(58) Field of Search ..................................... 430/270.1

(56) References Cited

U.S. PATENT DOCUMENTS

| | | | | |
|---|---|---|---|---|
| 5,879,857 A | * | 3/1999 | Chandross et al. | ...... 430/270.1 |
| 6,280,898 B1 | * | 8/2001 | Hasegawa et al. | ....... 430/270.1 |
| 6,383,713 B1 | * | 5/2002 | Uetani et al. | ............ 430/270.1 |
| 6,479,211 B1 | * | 11/2002 | Sato et al. | ................ 430/270.1 |
| 6,492,091 B2 | * | 12/2002 | Kodama et al. | .......... 430/270.1 |
| 6,548,220 B2 | * | 4/2003 | Uetani et al. | ............ 430/270.1 |
| 6,579,659 B2 | * | 6/2003 | Uetani et al. | ............ 430/270.1 |
| 2002/0168581 A1 | * | 11/2002 | Takeda et al. | ........... 430/270.1 |
| 2003/0039918 A1 | * | 2/2003 | Takata et al. | ............ 430/270.1 |

FOREIGN PATENT DOCUMENTS

| | | |
|---|---|---|
| JP | 9-90637 | 4/1997 |
| JP | 10-207069 | 8/1998 |
| JP | 10-274852 | 10/1998 |
| JP | 11-305444 | 11/1999 |

\* cited by examiner

*Primary Examiner*—Yvette C. Thornton
(74) *Attorney, Agent, or Firm*—Sughrue Mion, PLLC

(57) ABSTRACT

A positive photoresist composition comprises: an acid-decomposable resin containing a specified repeating unit; an acid-generator; and a specified dissolution-inhibiting compound.

16 Claims, No Drawings

POSITIVE PHOTORESIST COMPOSITION

FIELD OF THE INVENTION

The present invention relates to a positive photoresist composition used in micro-lithographic processes for the manufacture of VLSI's and micro-tips with large capacities, and other photo-fabrication processes. More specifically, the invention relates to a positive photoresist composition capable of forming fine patterns with use of a deep ultraviolet light including excimer laser lights, in particular, those having a wavelength not longer than 250 nm.

BACKGROUND OF THE INVENTION

Integrated circuits are still more and more highly integrated; in the manufacture of semiconductor tips such as VLSI's, processing of ultra-fine patterns comprising line widths below half a micron is required. To satisfy such a requirement, the wavelength of the light used for photolithographic exposure is becoming shorter and shorter. Recently, the use of excimer laser (including XeCl, KrF and ArF) lights that belong to shorter wavelength regions of deep UV light is being investigated.

For the lithographic pattern formation with the lights in such wavelength regions, chemically amplified resists have been proposed.

Generally speaking, chemically amplified resists can be classified into three types, i.e., a so-called two-component system, a two and a half-component system, and a three-component system. The two-component system consists of a compound which photolytically generates an acid (Such a compound will be called a photo acid-generator hereinafter.) and a binder resin. The binder resin contains a group that undergoes decomposition by the action of the acid to increase the solubility of the resin into an alkaline developer. Such a group is sometimes called an acid-decomposable group. The two and a half-component system contains a low molecular weight compound having an acid-decomposable group in addition to such two components. The three-component system comprises a photo acid-generator, an alkali-soluble resin and the low molecular weight compound.

Although the above described chemically amplified resists are suited for the exposure to UV or deep UV light, they must further keep up with various requirements for practical use. As the photoresist composition designed for ArF light sources, those comprising a (meth) acrylic resin that shows a still weaker absorption than partially hydroxylated styrene-based resins for the ArF light combined with a photo acid-generating compound have been proposed.

For example, Japanese Patent Laid-Open Nos. 199467/1995 and 252324/1995 describe such photoresist compositions. In particular, Japanese Patent Laid-Open No. 289615/1994 discloses a resin in which a tertiary carbon-containing organic group is bonded via an ester linkage to the oxygen in the carboxyl group of acrylic acid.

Japanese Patent Laid-Open No. 234511/1995 discloses acid-decomposable resins comprising repeating units of acrylate esters or fumarate esters, but these resins are not yet satisfactorily used due to their insufficient pattern profiles and poor adhesion to substrates.

Separately, there are proposed resins to which an alicyclic hydrocarbon part is introduced for the purpose of imparting the resistance to dry etching.

Japanese Patent Laid-Open Nos. 73173/1997, 90637/1997 and 16131/1998 disclose a resist material comprising an acid-responsive compound having a structural unit in which an alkali-soluble group protected with a group having an alicyclic structure is attacked by an acid to release said alkali-soluble group thus converting the unit soluble in an alkali.

Further, Japanese Patent Laid-Open Nos. 90637/1997, 207069/1998 and 274852/1998 describe resist compositions based on an acid-decomposable resin having a specified lactone structure.

In the lithographic processes for the manufacture of devices using design rules of 0.18 $\mu$m and not exceeding 0.13 $\mu$m. 193 nm wavelength light is often used to expose resists. Accordingly, resist polymers not abundant in ethylenically unsaturated structure are desired.

Although the resists disclosed in Japanese Patent Laid-Open Nos. 10739/1998 and 307401/1998 have an improved transmittance to 193 nm wavelength light, they do not always exhibit a sufficiently high sensitivity. In the case of applying those resists to the lithography using design rules of 0.13 $\mu$m or shorter, the resist characteristics cannot meet practical requirements such as pattern resolution.

In Japanese Patent Laid-Open No. 130340/1998, chemically amplified resists comprising a terpolymer containing a specified norbornene repeating unit in its principal chain.

In Japanese Patent Laid-Open No. 305444/1999, resins are described comprising a repeating unit having an adamantane structure in its side chain together with another repeating unit of maleic anhydride.

However, all of these chemically amplified resists are still unsatisfactory as regards to the resolution for fine contact hole patterns or trench patterns, and also pattern pitch dependency.

A contact hole is provided to lead an electrode metal of a semiconductor device to the semiconductor surface. Recently, in the manufacture of semiconductor devices, not only the pattern line width but also the configuration of the contact hole is becoming finer. Accordingly, positive photoresist compositions which can well resolve very fine contact hole patterns are eagerly desired. Unfortunately, it has not been clarified how to optimally design a resist composition that can resolve extremely fine contact holes. Moreover, it is now being recognized that resists suited for obtaining fine line width patterns are not always suited for resolving extremely fine contact hole patterns.

A trench, which indicates a connected groove pattern, is also becoming finer similarly to contact holes. Hence, positive photoresist compositions that can resolve fine trench patterns are also eagerly desired.

Further, the structure of devices is becoming more and more complicated, and in particular in logic-related devices it is necessary to simultaneously form patterns of various pitches ranging from crowded patterns to isolated ones. Unfortunately, since the conventional resist materials exhibit sensitivities strongly dependent on pattern pitch, desired pattern dimensions have not been reproduced with the same exposure for crowded and isolated patterns. Solution of such an issue, sometimes called pattern pitch dependency, has been earnestly expected.

SUMMARY OF THE INVENTION

Accordingly, the purpose of the invention is to provide a positive photoresist composition exhibiting not only high resolution for contact hole patterns as well as trench patterns, but also an weak dependence on pattern pitch in the manufacture of semiconductor devices.

As a result of an extensive study on the resist composition for positive, chemically amplified systems, the present inventors have found that the purpose of the invention can be achieved with use of acid-decomposable resins having a lactone group of specified structure, and devised the invention.

The above-cited purpose can be achieved by the following construction.

(1) A positive photoresist composition comprising:

(A) a compound capable of generating an acid upon irradiation with one of an actinic ray and a radiation;

(B) a resin capable of decomposing by the action of an acid to increase the solubility in an alkali, in which the resin contains a repeating unit having at least one of groups represented by formulae (I-1) to (I-4) below; and (C) at least one compound selected from the group consisting of:

a compound represented by formula (CI) below;

a compound represented by formula (CII) below; and a compound containing at least two structures, each of which includes a polycyclic structure represented by formula (CIII) below, wherein the polycyclic structure has at least one substituent containing a carboxylic acid group protected by an acid-labile group:

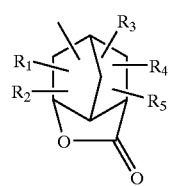
(I-1)

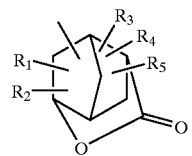
(I-2)

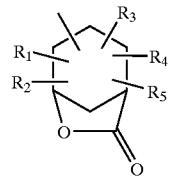
(I-3)

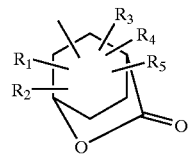
(I-4)

wherein $R^1$ to $R_5$, which are the same or different, each represents a hydrogen atom, an alkyl, a cycloalkyl or an alkenyl group; two of $R_1$ to $R_5$ may combine together to form a ring:

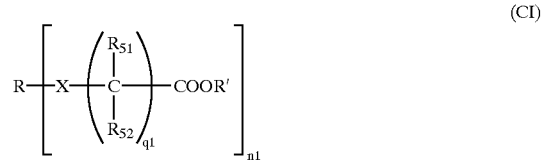
(CI)

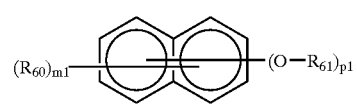
(CII)

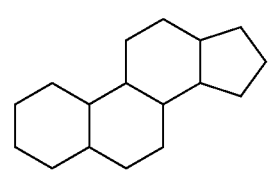
(CIII)

wherein X represents an oxygen atom, a sulfur atom, —N($R_{53}$)— or a single bond; $R_{51}$, $R_{52}$ and $R_{53}$ each independently represents a hydrogen atom or an alkyl group; R' represents a group necessary to form an acid-decomposable group of —COOR'; R represents a n1-valent residue containing a bridge-containing hydrocarbon, a saturated cyclic hydrocarbon or a naphthalene ring; n1 represents an integer of 1 to 4; q1 represents an integer of 0 to 10; $R_{60}$ represents an alkyl group or a halogen atom; $R_{61}$ represents a group necessary to form an acid-decomposable group of —O—$R_{61}$; m1 represents an integer of 0 to 4; p1 represents an integer of 1 to 4.

(2) The positive photoresist composition according to the item (1), wherein the resin (B) further includes a repeating unit containing an alkali-soluble group protected by at least one of groups containing an alicyclic hydrocarbon structure, which are represented by formulae (pI) to (pVI).

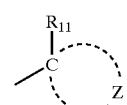
(pI)

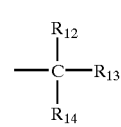
(pII)

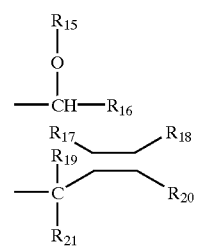
(pIII)

(pIV)

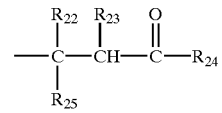
(pV)

-continued

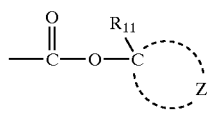
(pVI)

wherein $R_{11}$ represents methyl, ethyl, n-propyl, isopropyl, n-butyl, isobutyl or sec-butyl group; Z represents an atomic group necessary to form an alicyclic hydrocarbon group together with the carbon atom; $R_{12}$ to $R_{16}$ each independently represents a straight chain or branched alkyl group having 1 to 4 carbon atoms or an alicyclic hydrocarbon group, and at least one of $R_{12}$ to $R_{14}$, or at least one of $R_{15}$ and $R_{16}$ represents an alicyclic hydrocarbon group; $R_{17}$ to $R_{21}$ each independently represents a hydrogen atom, a straight chain or branched alkyl group having 1 to 4 carbon atoms or an alicyclic hydrocarbon group, and at least one of $R_{17}$ to $R_{21}$, represents an alicyclic hydrocarbon group; $R_{19}$ or $R_{21}$, represents a straight chain or branched alkyl group having 1 to 4 carbon atoms, or an alicyclic hydrocarbon group; $R_{22}$ to $R_{25}$ each independently represents a straight chain or branched alkyl group having 1 to 4 carbon atoms or an alicyclic hydrocarbon group, and at least one of $R_{22}$ to $R_{25}$ represents an alicyclic hydrocarbon group.

(3) The positive photoresist composition according to the item (2), wherein the group represented by formulae (pI) to (pVI) is represented by formula (II):

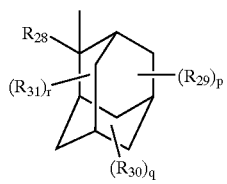
(II)

wherein $R_{28}$ represents an alkyl group; $R_{29}$ to $R_{31}$, which are the same or different, each represents hydroxyl group, a halogen atom, carboxyl group, alkyl, cycloalkyl, alkenyl, alkoxy, alkoxycarbonyl or acyl group; p, q and r each independently represents an integer of 0 to 3.

(4) The positive photoresist composition according to the item (1), wherein the resin (B) further contains a repeating unit represented by formula (a):

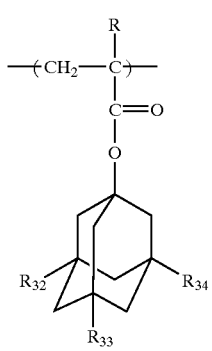
(a)

wherein R represents a hydrogen atom, a halogen atom, an alkyl group having 1 to 4 carbon atoms; $R_{32}$ to $R_{34}$, which are the same or different, each represents a hydrogen atom or hydroxyl group, and at least one of $R_{32}$ to $R_{34}$ represents hydroxyl group.

(5) The positive photoresist composition according to the item (1), wherein the resin (B) further contains at least one of repeating units represented by formulae (III-a) to (III-d)

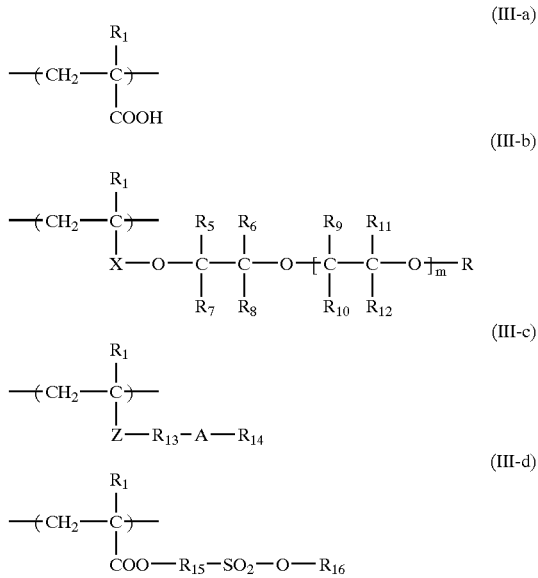

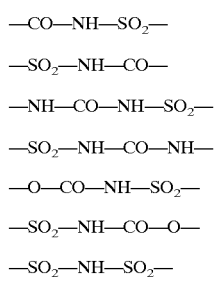

wherein $R_1$ represents a hydrogen atom, a halogen atom, an alkyl group having 1 to 4 carbon atoms; $R_5$ to $R_{12}$ each independently represents a hydrogen atom or an alkyl group; R represents a hydrogen atom, an alkyl, cycloalkyl, aryl or aralkyl group; m represents an integer of 1 to 10; X represents a single bond, an alkylene group, a cycloalkylene group, an arylene group, an ether group, a thioether group, a carbonyl group, an ester group, an amide group, a sulfonamide group, an urethane group, an urea group, or a divalent group which is not decomposed by the action of an acid, and which is a divalent group resulting from the combination of at least two groups selected from the group consisting of an alkylene group, a cycloalkylene group, an arylene group, an ether group, a thioether group, a carbonyl group, an ester group, an amide group, a sulfonamide group, an urethane group and an urea group; Z represents a single bond, an ether group, an ester group, an amide group, an alkylene group, or a divalent group resulting from the combination of at least two group of an ether group, an ester group, an amide group and an alkylene group; $R_{13}$ represents a single bond, an alkylene group, an arylene group, or a divalent group resulting from the combination of an alkylene group and an arylene group; $R_{15}$ represents an alkylene group, an arylene group, or a divalent group resulting from the combination of an alkylene group and an arylene group; $R_{14}$ represents an alkyl, cycloalkyl, aryl or aralkyl group; $R_{16}$ represents a hydrogen atom, an alkyl, cycloalkyl, alkenyl, aryl or aralkyl group; A represents one of the following functional groups:

—CO—NH—SO$_2$—

—SO$_2$—NH—CO—

—NH—CO—NH—SO$_2$—

—SO$_2$—NH—CO—NH—

—O—CO—NH—SO$_2$—

—SO$_2$—NH—CO—O—

—SO$_2$—NH—SO$_2$—

(6) The positive photoresist composition according to the item (1), wherein the resin (B) contains the repeating unit having at least one of groups represented by formulae (I-1) to (I-4) in an amount of 30 to 70 mol %, base on the total repeating units.

(7) The positive photoresist composition according to the item (2), wherein the resin (B) contains the repeating unit containing an alkali-soluble group protected by at least one of groups represented by formulae (pI) to (pVI) in an amount of 20 to 75 mol %, based on the total repeating units.

(8) The positive photoresist composition according to the item (4), wherein the resin (B) contains the repeating unit represented by formula (a) in an amount of 10 to 40 mol %, based on the total repeating units.

(9) The positive photoresist composition according to the item (5), wherein the resin (B) contains the repeating unit represented by formulae (III-a) to (III-d) in an amount of 0.1 to 30 mol %, based on the total repeating units.

(10) The positive photoresist composition according to the item (1), which further comprises (D) an organic basic compound.

(11) The positive photoresist composition according to the item (1), which further comprises (F) surfactant containing at least one of a fluorine atom and a silicon atom.

(12) The positive photoresist composition according to the item (1), wherein the compound (A) is at least one of a sulfonic acid salt of sulfonium and a sulfonic acid salt of iodonium.

(13) The positive photoresist composition according to the item (1), wherein the compound (A) is at least one of a sulfonate compound of N-hydroxy-imide and a sulfonyldiazomethane compound.

(14) The positive photoresist composition according to the item (1), which comprises the compound (A) in an amount of 0.01 to 30% by weight, based on the total solid content of the composition.

(15) The positive photoresist composition according to the item (1), which comprises the resin (B) in an amount of 40 to 99.99% by weight, based on the total solid content of the composition.

(16) The positive photoresist composition according to the item (1), which comprises the compound (C) in an amount of 1 to 40% by weight, based on the total solid content of the composition.

(17) The positive photoresist composition according to the item (1), which is a positive photoresist composition to be irradiated with a deep UV light having the wavelength range of from 150 to 220 nm.

DETAILED DESCRIPTION OF THE INVENTION

[1] (A) A Compound Capable of Generating an Acid Upon Irradiation with one of an Actinic Ray and a Radiation (Photo Acid-generator)

As the compounds used as the photo acid-generator, one can appropriately select from the photo-initiators for cationic photo-polymerization, the photo-initiators for radical photo-polymerization, photo-quenchers for dyes, photo-color modifiers, and the known compounds that generate an acid by the action of various kinds of light (including UV light of 400 to 200 nm wavelength regions, deep UV light, and in particular the g line, h line and i line light and KrF excimer laser light), ArF excimer laser light, electron beams, X-rays, molecular beams and ion beams. These compounds may be used individually or as mixtures depending on specific needs.

Other compounds used in the invention as the photo acid-generator include various onium salts such as, for example, diazonium salts, ammonium salts, phosphonium salts, iodonium salts, sulfonium salts, selenonium salts and arsonium salts, organic halogen compounds, organic metal/organic halogen compounds, photo acid-generators protected by an o-nitrobenzyl group, the compounds that generate sulfonic acid by photo-decomposition typified by iminosulfonate, disulfone compounds, diazoketosulfones and diazodisulfone compounds.

Furthermore, those polymeric compounds to the main- or side-chain of which these groups capable of generating an acid by the action of light are introduced can also be used.

Moreover, those compounds which generate an acid by the action of light and are set forth in the following patents and literatures can also be used: V. N. R. Pillai, Synthesis, (1), 1 (1980), A. Abad et al, Tetrahedron Lett., (47) 4555 (1971), D. H. R. Barton et al, J. Chem. Soc., (C), 329 (1970), U.S. Pat. No. 3,779,778 and EP No. 126,712.

Among the compounds enumerated above which are decomposed by the irradiation of an electron beam to generate acid, those which are used especially efficiently are described hereinafter.

(1) Oxazol derivatives represented by the following general formula PAG1 in which a trihalomethyl group is substituted, or S-triazine derivatives represented by general formula PAG2.

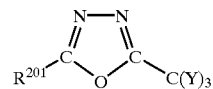

(PAG1)

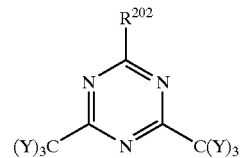

(PAG2)

In the formulae, $R^{201}$ represents a substituted or unsubstituted aryl or alkenyl group, $R^{202}$ represents a substituted or unsubstituted aryl, alkenyl or alkyl group, or —C(Y)$_3$. Y represents a chlorine or bromide atom.

Specific examples are shown below, but the scope of the invention is not restricted thereto at all.

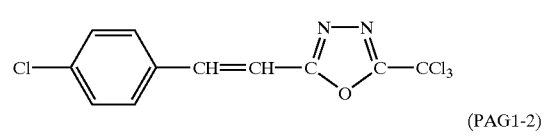

(PAG1-1)

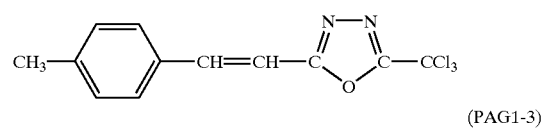

(PAG1-2)

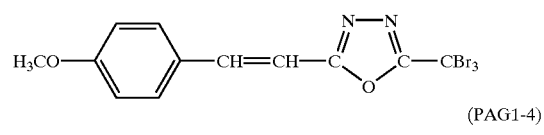

(PAG1-3)

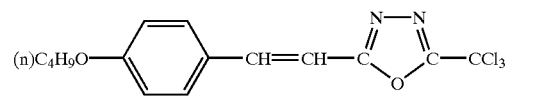

(PAG1-4)

-continued
(PAG1-5)
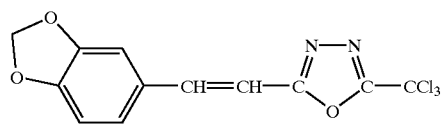
(PAG1-6)
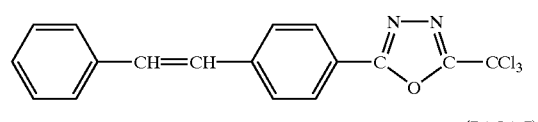
(PAG1-7)
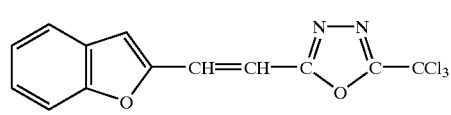
(PAG1-8)
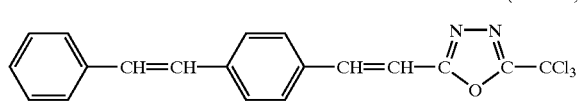
(PAG2-1)
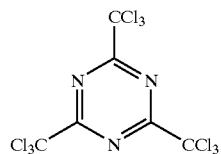
(PAG2-2)
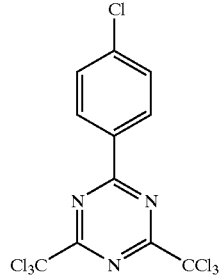
(PAG2-3)
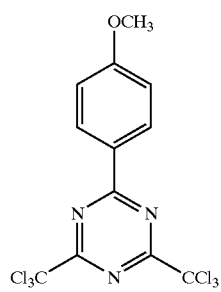
(PAG2-4)
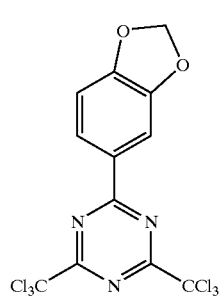
-continued
(PAG2-5)
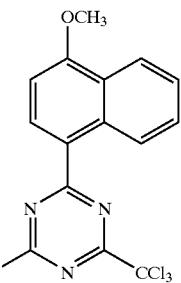
(PAG2-6)
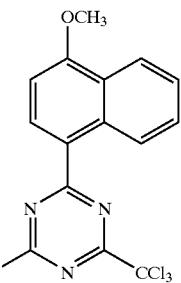
(PAG2-7)
(PAG2-8)
(PAG2-9)

-continued (PAG2-10)

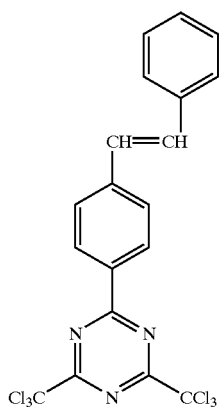

(2) The iodonium salts represented by the following general formula PAG3, or the sulfonium salts represented by general formula PAG4.

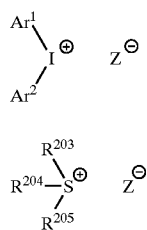

In the formulae, $Ar^1$ and $Ar^2$ each independently represents a substituted or unsubstituted aryl group.

$R^{203}$, $R^{204}$ and $R^{203}$ each independently represents a substituted or unsubstituted alkyl or aryl group.

$Z^-$ represents a counter anion including, for example, $BF_4^-$, $AsF_6^-$, $PF6^-$, $SbF_6^-$, $SiF_6^-$, $ClO_4^-$, a perfluoroalkane-sulfonic acid anion such as $CF_3SO_3^-$, pentafulorobenzene-sulfonic acid anion, a condensed polynuclear aromatic sulfonic acid anion such as naphthalne-1-sulfonic acid anion, anthraquinone sulfonic acid anion, and sulfonic acid group-containing dyes. However, $Z^-$ is not limited to them at all.

Two of $R^{203}$, $R^{204}$ and $R^{205\ 1}$, or $Ar^1$ and $Ar^2$ may combine together via their single bond or via a substituent.

Specific examples for PAG3 and PAG4 are shown below not to restrict the scope of the invention thereto.

(PAG3-1)

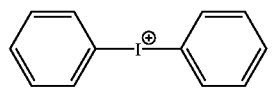 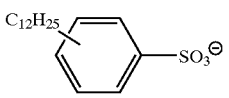

(PAG3-2)

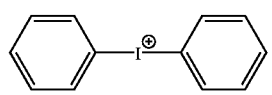 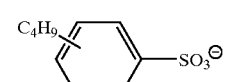

(PAG3-3)

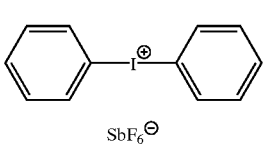

(PAG3-4)

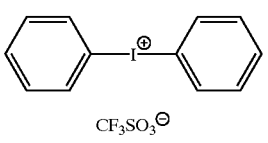

(PAG3-5)

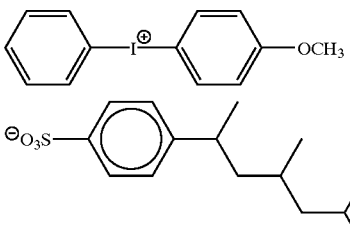

(PAG3-6)

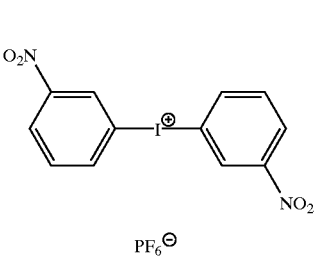

(PAG3-7)

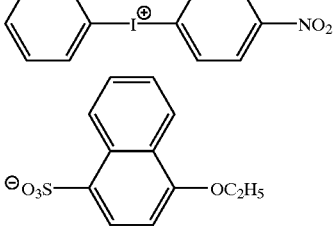

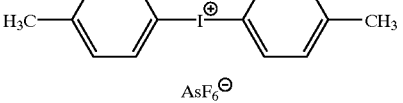

(PAG3-8)

(PAG3-9)

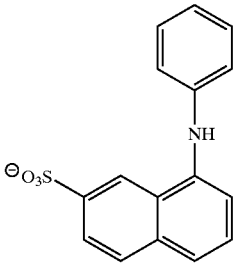

-continued
(PAG3-10)
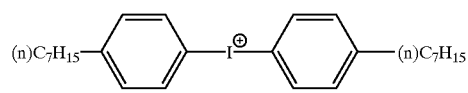
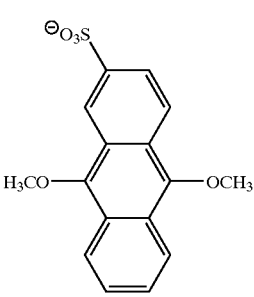
(PAG3-11)
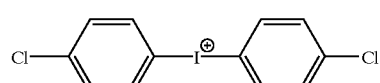
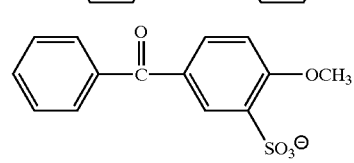
(PAG3-12)
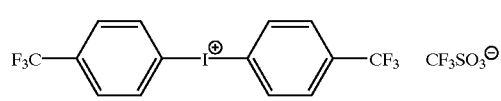
(PAG3-13)
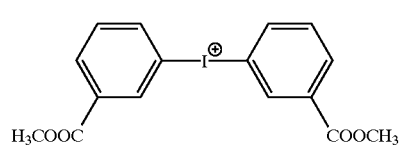
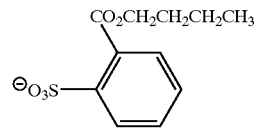
(PAG3-14)
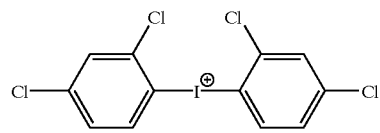
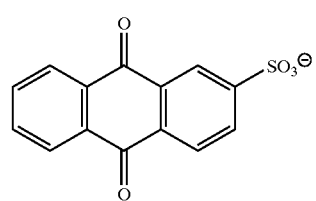
(PAG3-15)
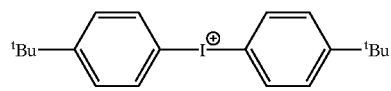
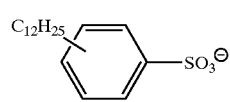
-continued
(PAG3-16)
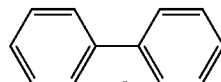
(PAG3-17)
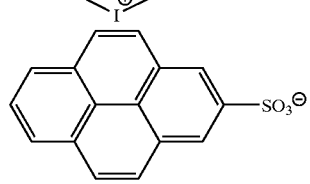
(PAG3-18)
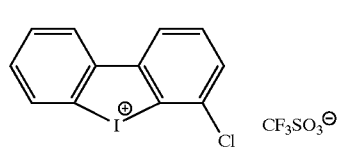
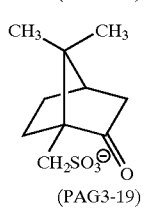
(PAG3-19)
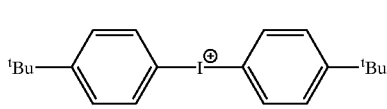
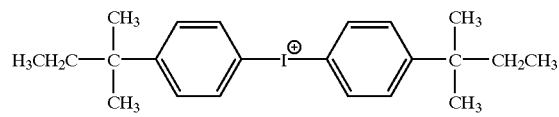
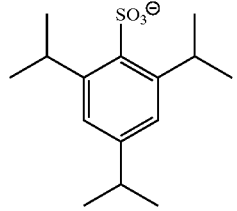
(PAG3-20)
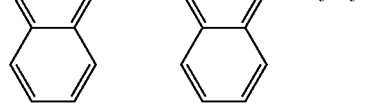
(PAG3-21)
(PAG3-22)
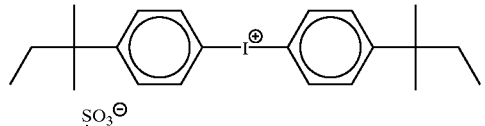
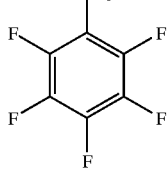

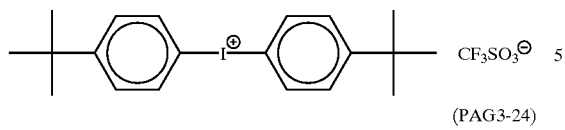
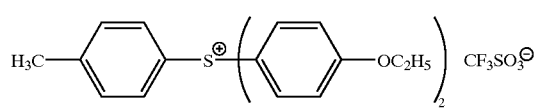
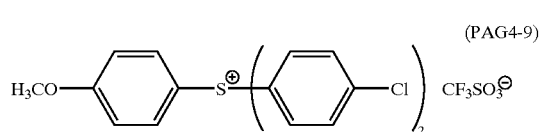
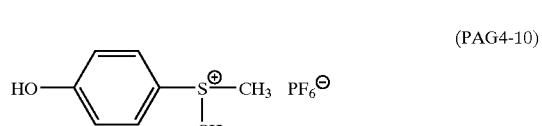
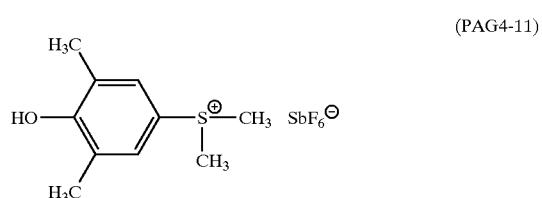
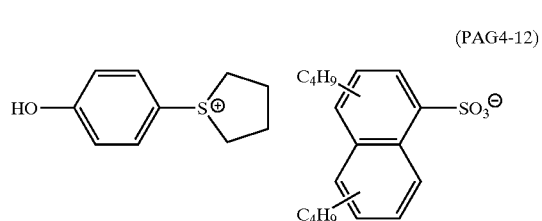
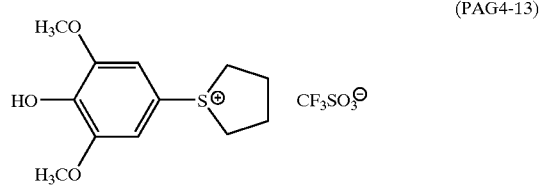
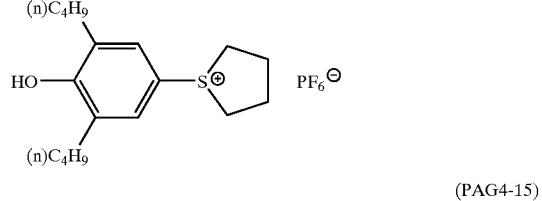
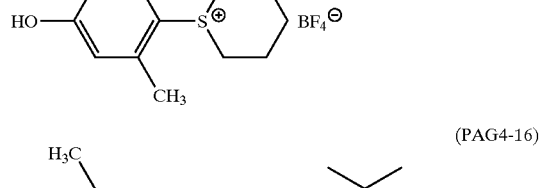

-continued
(PAG4-17)
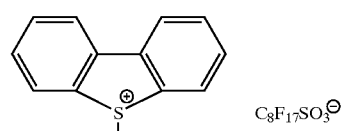
(PAG4-18)
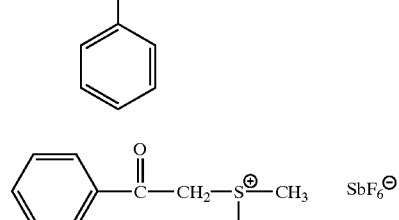
(PAG4-19)
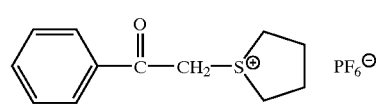
(PAG4-20)
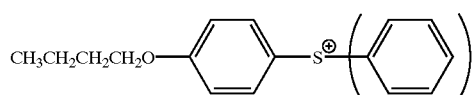
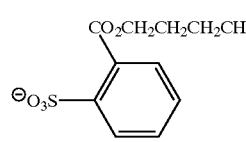
(PAG4-21)
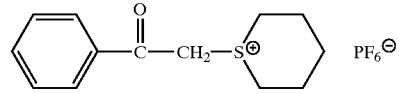
(PAG4-22)
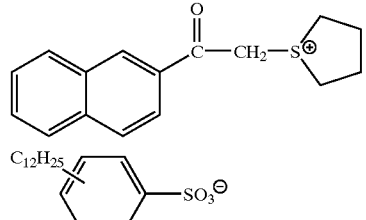
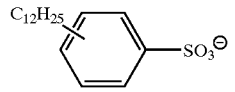
(PAG4-23)
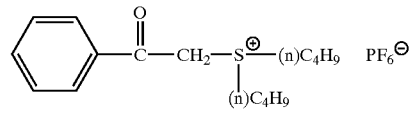
(PAG4-24)
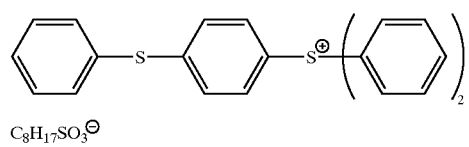
(PAG4-25)
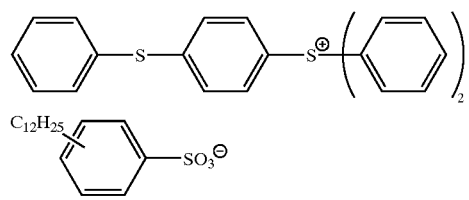
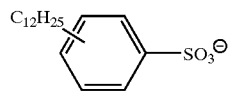
-continued
(PAG4-26)
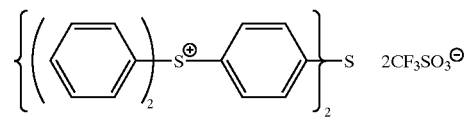
(PAG4-27)
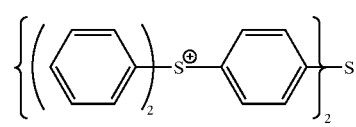
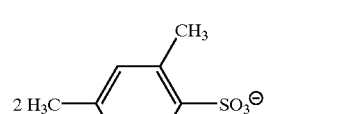
(PAG4-28)
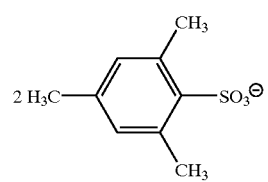
(PAG4-29)
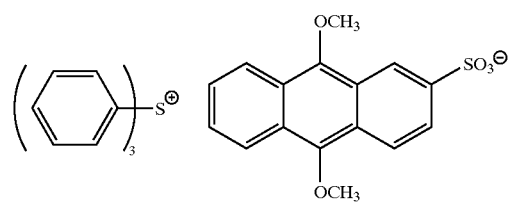
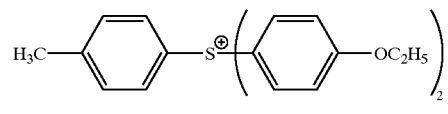
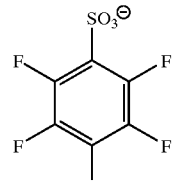
(PAG4-30)
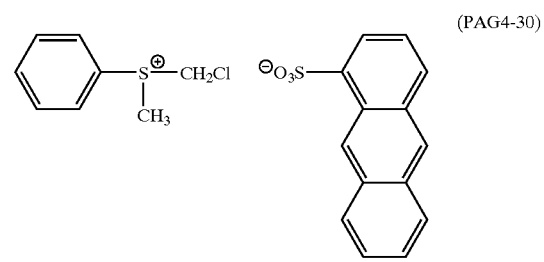
(PAG4-31)
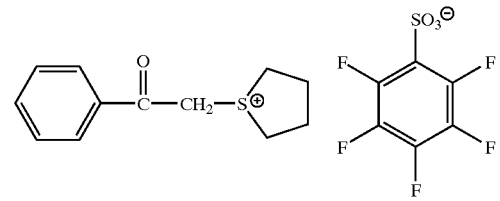

(PAG4-32)
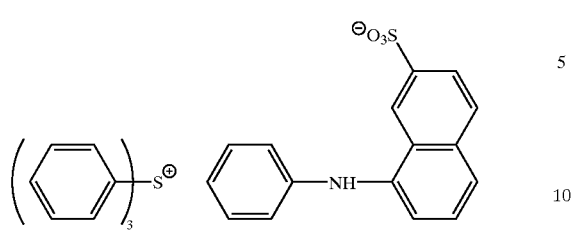
(PAG4-33)
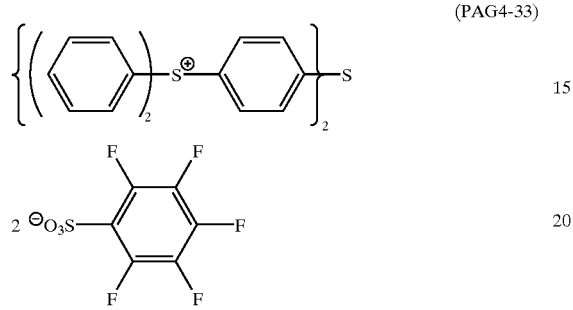
(PAG4-34)
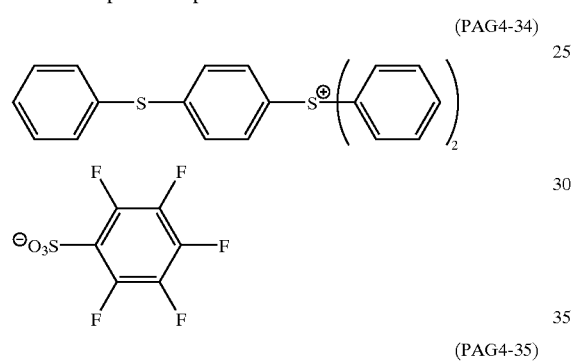
(PAG4-35)
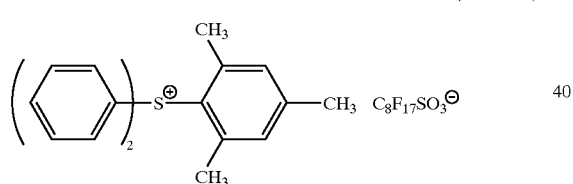
(PAG4-36)
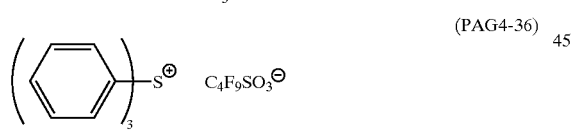
PAG4-37
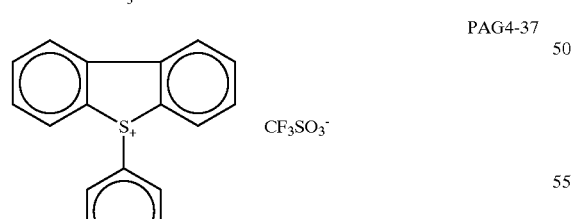
(PAG4-38)
(PAG4-39)
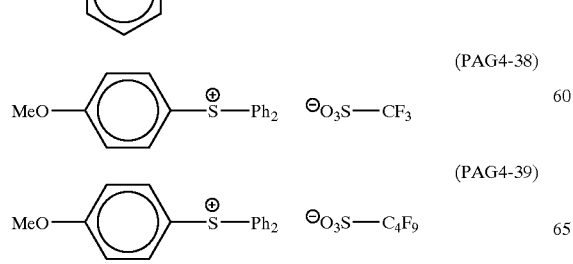
(PAG4-40)
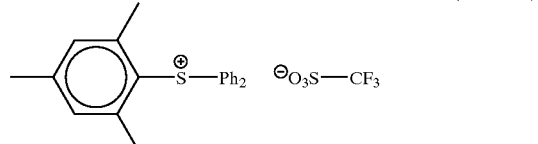
(PAG4-41)
(PAG4-42)
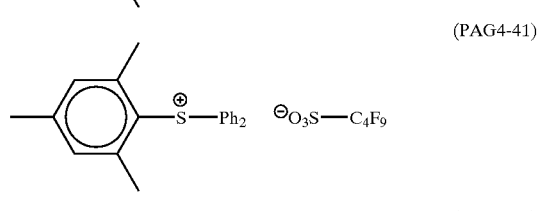
(PAG4-43)
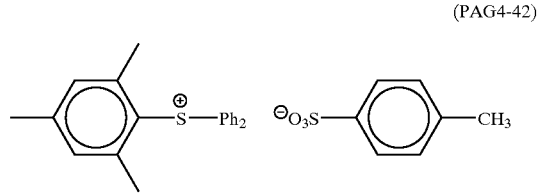
(PAG4-44)
(PAG4-45)
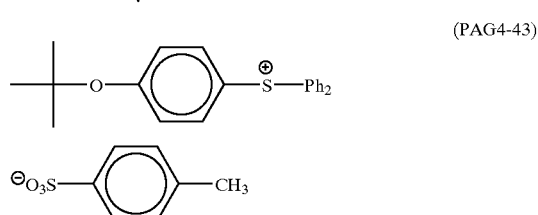
(PAG4-46)
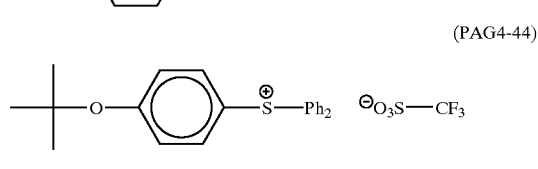
(PAG4-47)
(PAG4-48)
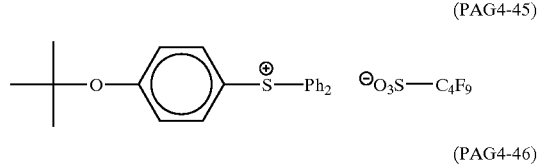
(PAG4-49)
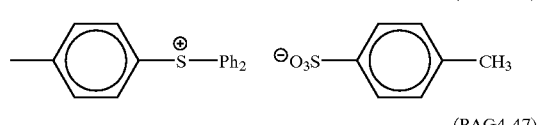
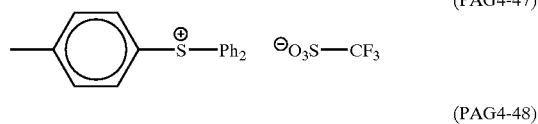
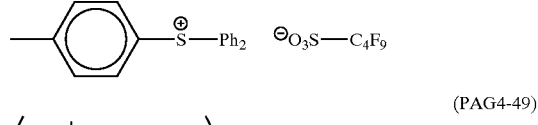
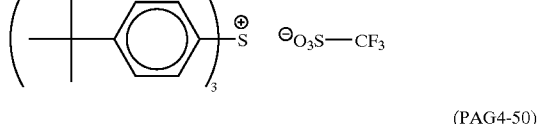
(PAG4-50)
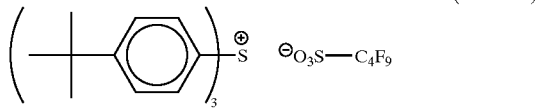

-continued

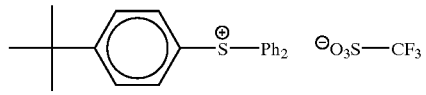
(PAG4-51)

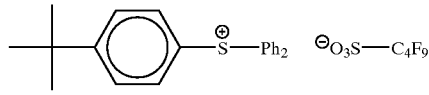
(PAG4-52)

In the above chemical structures, Ph indicates phenyl group.

The onium salts represented by general formulae PAG3 and PAG4, which are well known in the art, can be prepared by the synthetic methods described in, for example, U.S. Pat. Nos. 2,807,648 and 4,247,473 and Japanese Patent Laid-Open No. 101331/1978.

(3) The disulfone derivatives represented by the following general formula PAG5 or the iminosulfonate derivatives represented by general formula PAG6.

$$Ar^3-SO_2-SO_2-Ar^4 \quad \text{(PAG5)}$$

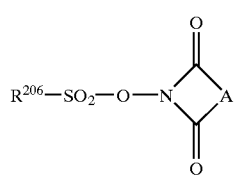
(PAG6)

In the formulae, $Ar^3$ and $Ar^4$ each independently represents a substituted or unsubstituted aryl group. $R^{206}$ represents a substituted or unsubstituted alkyl or aryl group. A represents a substituted or unsubstituted alkylene, alkenylene or arylene group.

Some specific examples will be shown below not to restrict the scope of the invention thereto.

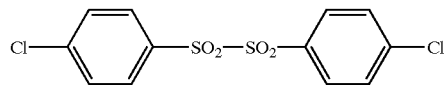
(PAG5-1)

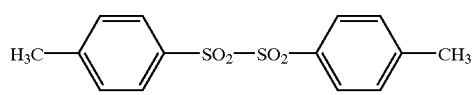
(PAG5-2)

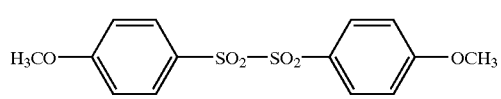
(PAG5-3)

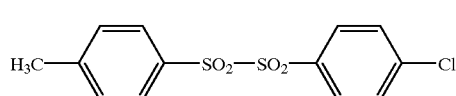
(PAG5-4)

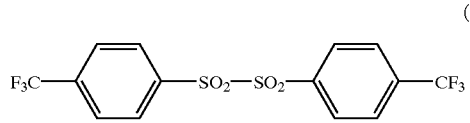
(PAG5-5)

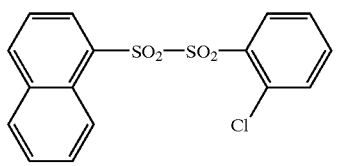
(PAG5-6)

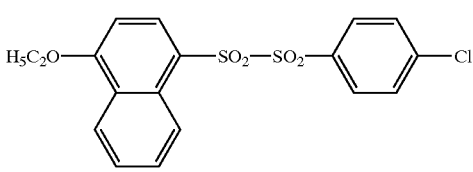
(PAG5-7)

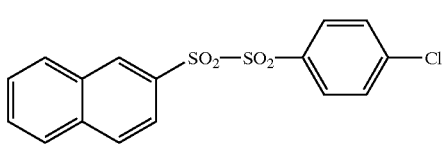
(PAG5-8)

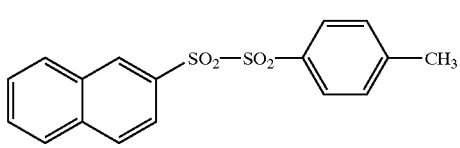
(PAG5-9)

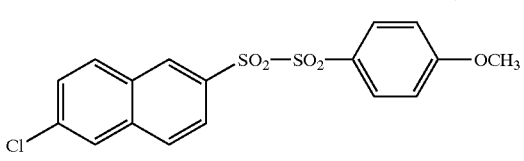
(PAG5-10)

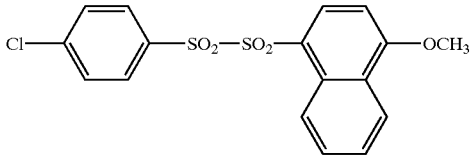
(PAG5-11)

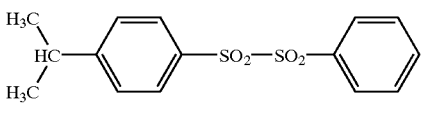
(PAG5-12)

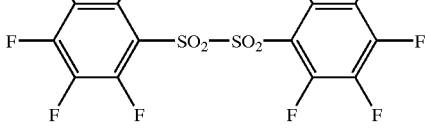
(PAG5-13)

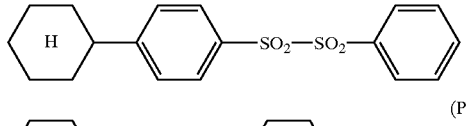
(PAG5-14)

(PAG5-15)

(PAG6-1)
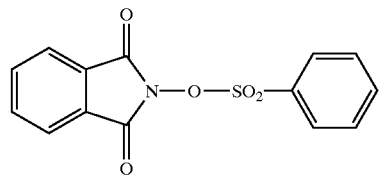
(PAG6-2)
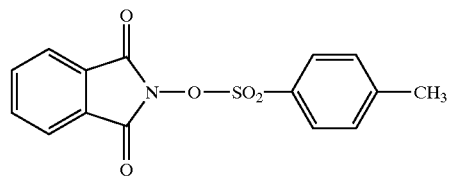
(PAG6-3)
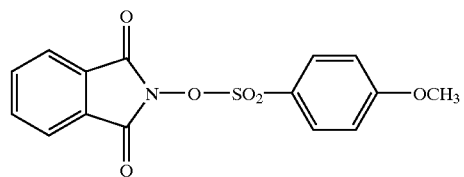
(PAG6-4)
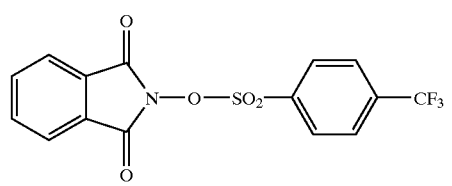
(PAG6-5)
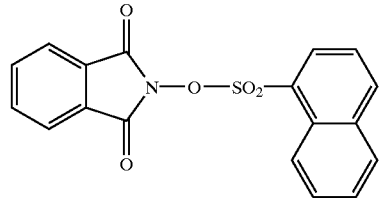
(PAG6-6)
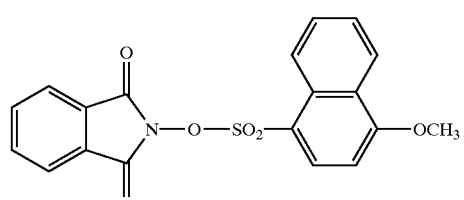
(PAG6-7)
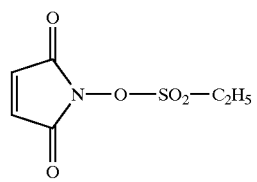
(PAG6-8)
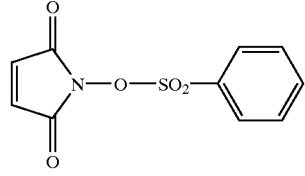
(PAG6-9)
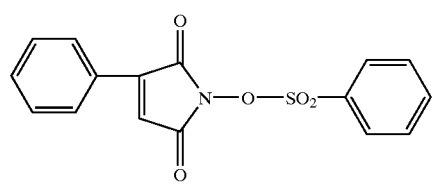
(PAG6-10)
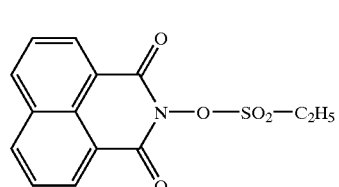
(PAG6-11)
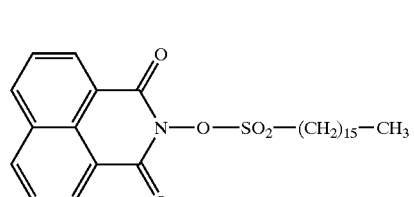
(PAG6-12)
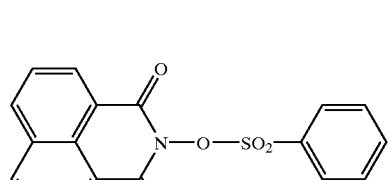
(PAG6-13)
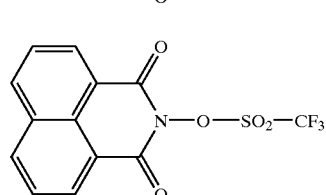
(PAG6-14)
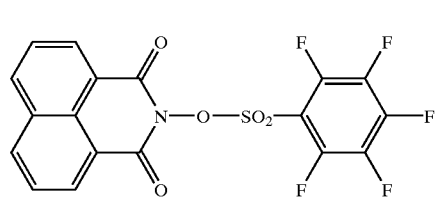
(PAG6-15)
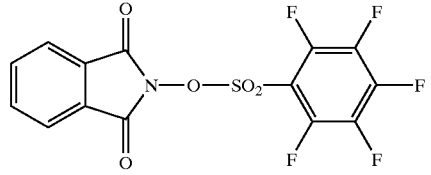
(PAG6-16)
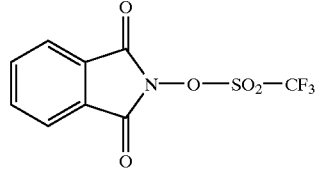

(PAG6-17)
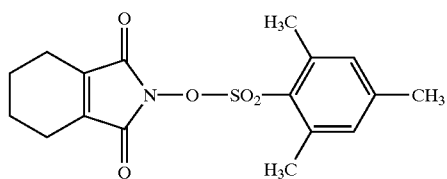
(PAG6-18)
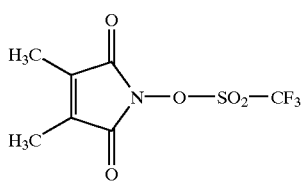
(PAG6-19)
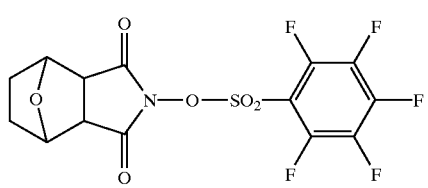
(PAG6-20)
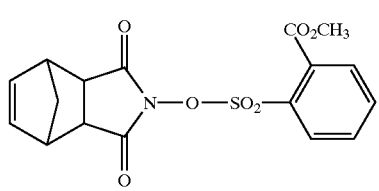
(PAG6-21)
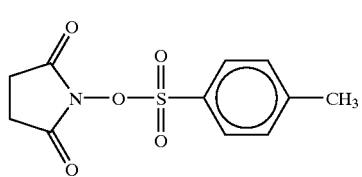
(PAG6-22)
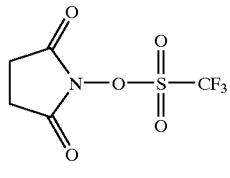
(PAG6-23)
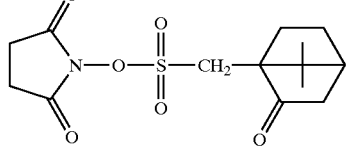
(PAG6-24)
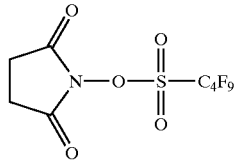
(PAG6-25)
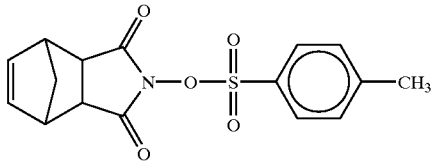
(PAG6-26)
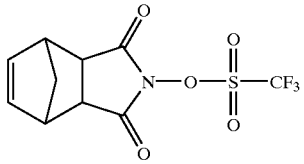
(PAG6-27)
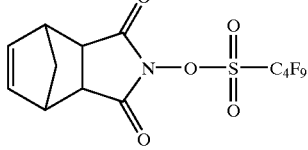
(PAG6-28)
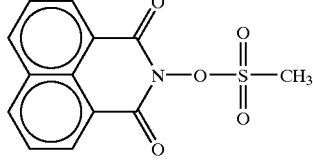
(PAG6-29)
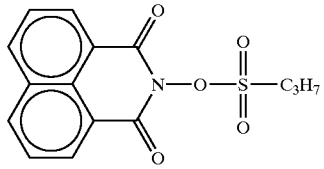
(PAG6-30)
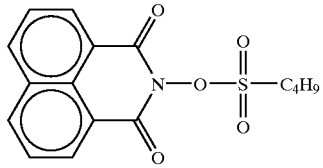
(PAG6-31)
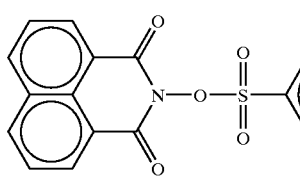
(PAG6-32)
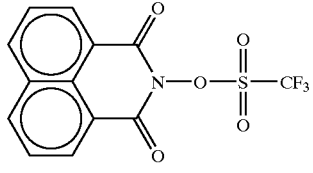
(PAG6-33)
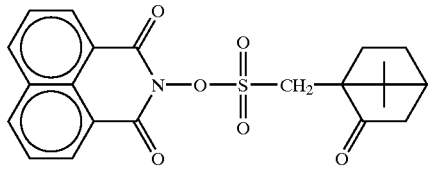

(PAG6-34)

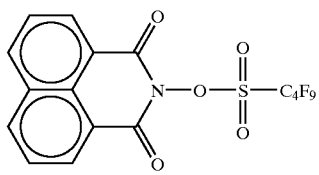

(4) The diazosulfone derivatives represented by the following general formula PAG7.

(PAG7)

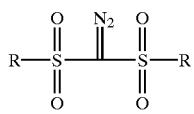

R in the above formula represents a straight-chain, branched-chain or cyclic alkyl group or an aryl group that may be substituted.

Some specific examples are shown below not to restrict the scope of the invention thereto.

(PAG7-1)

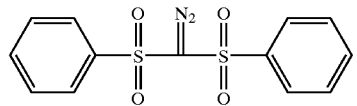

(PAG7-2)

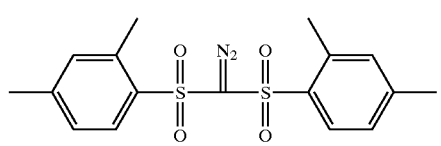

(PAG7-3)

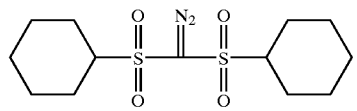

(PAG7-4)

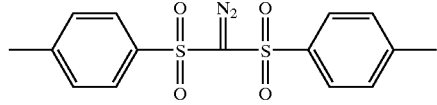

(PAG7-5)

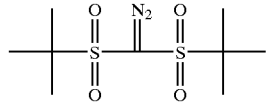

(PAG7-6)

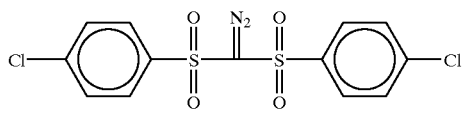

(PAG7-7)

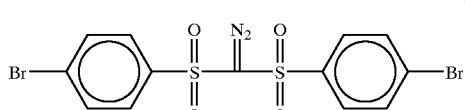

(PAG7-8)

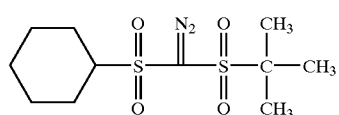

(PAG7-9)

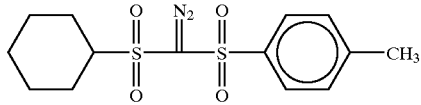

The added amount of such a photo acid-generator usually lies in the range of 0.01 to 30% by weight, preferably 0.3 to 20% by weight, and more preferably 0.5 to 10% by weight based on the total solid content of the composition of the invention. With added amounts below 0.01% by weight, the sensitivity tends to fall, and with added amounts exceeding 30% by weight, the absorption of the resist becomes too large, thus causing the pattern profile to deteriorate and compressing process (in particular, baking) margins too seriously.

[2] (B) A Resin Capable of Decomposing by the Action of an Acid to Increase the Solubility in an Alkali, in which the Resin Contains a Repeating Unit Having at Least One of Groups Represented by Formulae (I-1) to (I-4)

The resin in (B) used in the composition of the invention and decomposed by the action of an acid to increase the solubility in an alkali contains the repeating unit represented by general formulae (I-1) to (I-4) set forth previously.

In general formulae (I-1) to (I-4), the alkyl group for $R_1$ to $R_5$ includes those of straight- or branched-chain structure which may have a substituent. The straight- or branched-chain alkyl group includes those preferably with 1 to 12 carbon atoms, more preferably with 1 to 10 carbon atoms. Specifically, methyl, ethyl, propyl, isopropyl, n-butyl, isobutyl, sec-butyl, t-butyl, pentyl, hexyl, heptyl, octyl, nonyl or dodecyl is still more preferred.

The cycloalkyl group for $R_1$ to $R_5$ includes those with 3 to 8 carbon atoms such as cyclopropyl, cyclopentyl, cyclohexyl, cycloheptyl and cyclooctyl.

The alkenyl group for $R_1$ to $R_5$ includes those with 2 to 6 carbon atoms such as vinyl, propenyl, butenyl and hexenyl.

The ring formed by the coupling of two of $R_1$ to $R_5$ includes 3- to 8-membered ones such as cyclopropane, cyclobutane, cyclopentane, cyclohexane and cyclooctane.

Any of $R_1$ to $R_5$ in general formulae (I-1) and (I-2) may be connected to any of the seven carbon atoms composing the ring structure.

The additional substituent for the alkyl, cycloalkyl and alkenyl groups described hereinabove includes an alkoxy group (preferably with 1 to 4 carbon atoms), a halogen atom (F, Cl, Br or I), an acyl group, an acyloxy group, cyano group, hydroxyl group, a carboxy group, an alkoxycarbonyl group (preferably with 2 to 5 carbon atoms), and nitro group.

Preferable repeating units containing a group represented by general formulae (I-1) to (I-4) include those represented by the following general formula (AI).

(AI)

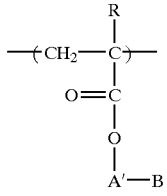

In general formula (AI), R has the same meaning as R in general formula (a) to be shown later. A' represents a single bond, an ether group, an ester group, carbonyl group, an alkylene group or a divalent group comprising the combinations of these. B represents a group represented by one of general formulae (I-1) to (I-4). Examples of the divalent group of A' resulting from the combination of the two or more groups cited above include the following.

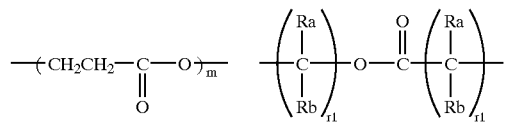

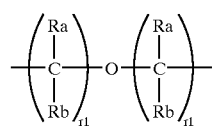

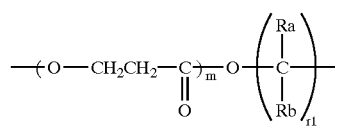

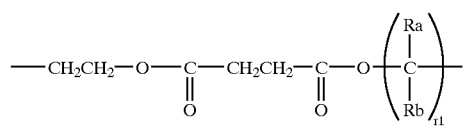

Ra, Rb and r1 have the same meanings as the same symbols to be shown later. m represents an integer of 1 to 3.

In the following, some specific examples of the repeating unit represented by (AI) will be enumerated not to restrict the scope of the invention thereto.

(I-1)

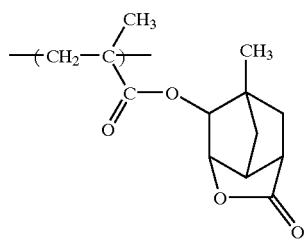

(I-2)

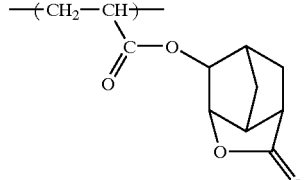

(I-3)

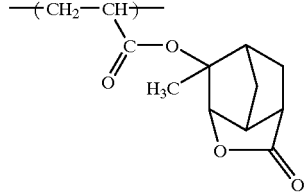

(I-4)

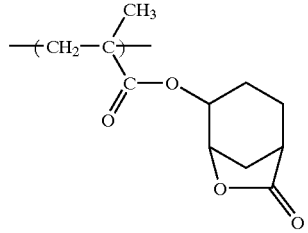

(I-5)

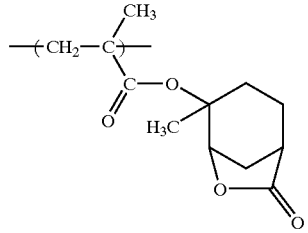

(I-6)

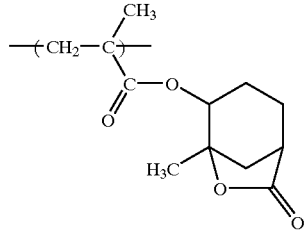

(I-7)

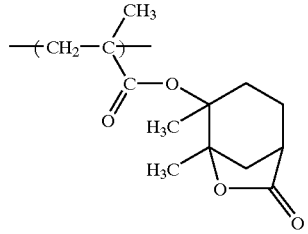

(I-8)

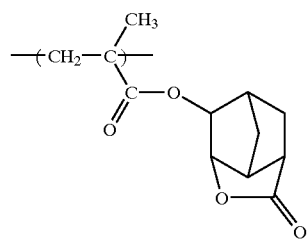

(I-9)

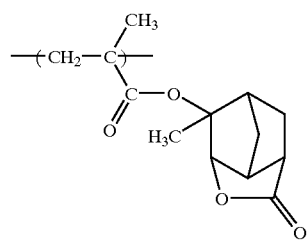

(I-10)

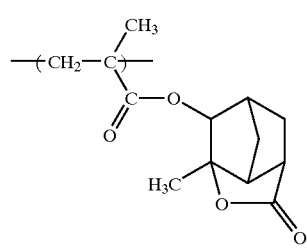

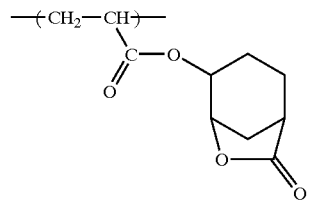
(I-11)
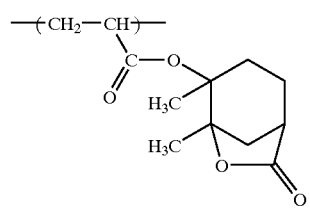
(I-12)
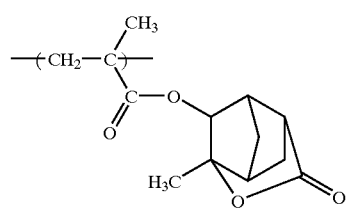
(I-13)
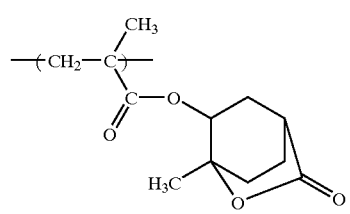
(I-14)
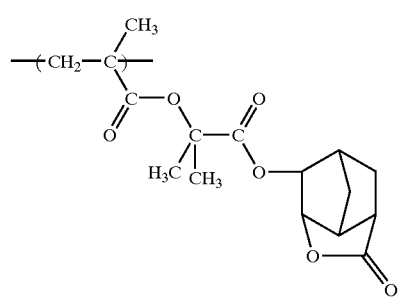
(I-15)
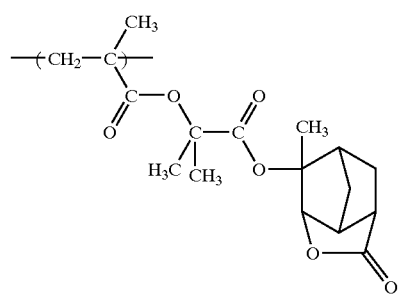
(I-16)

(I-22)
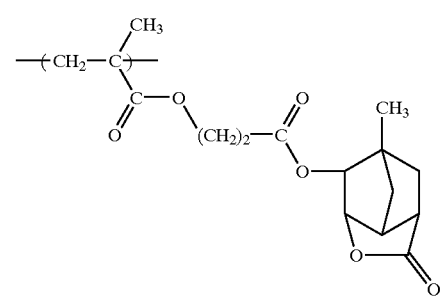
(I-23)
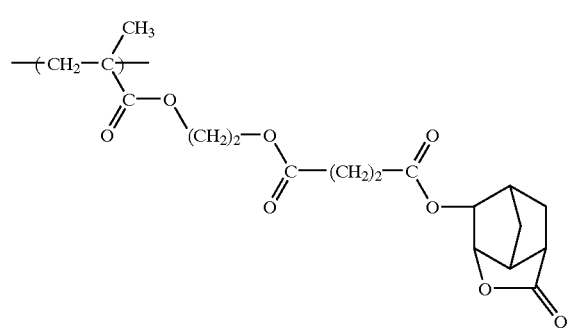
(I-24)
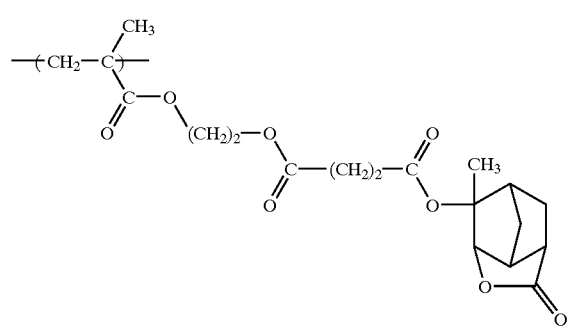
(I-25)
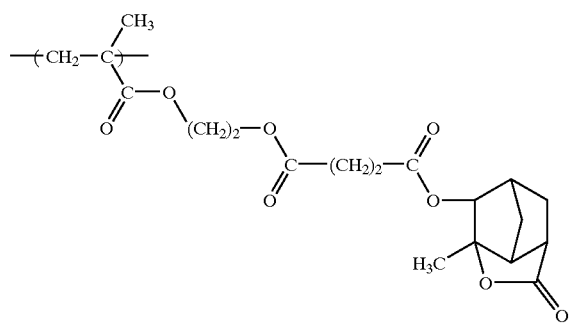
(I-26)
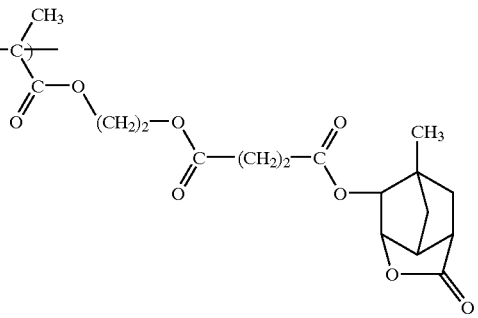
(I-27)
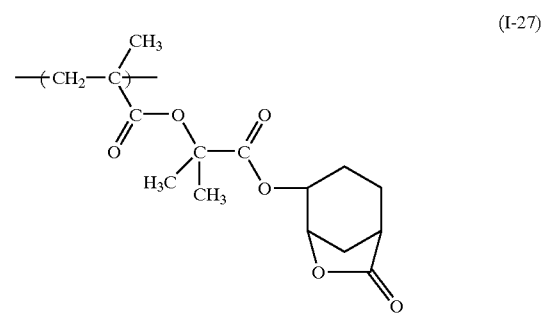
(I-28)
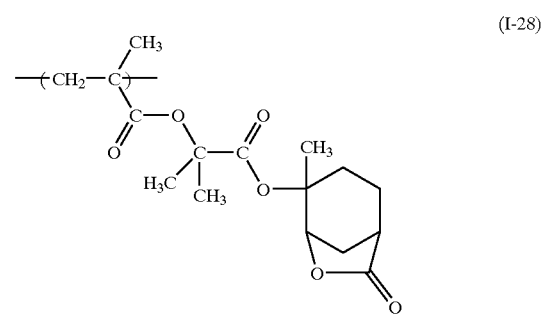
(I-29)
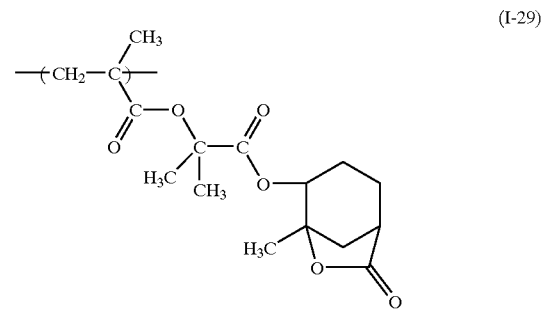
(I-30)
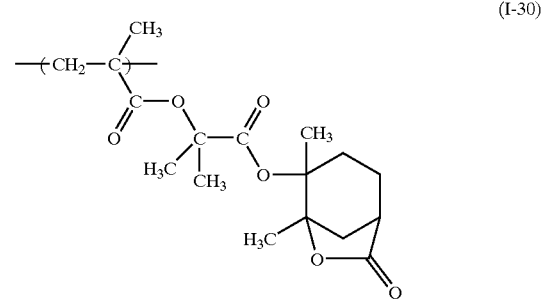

(I-31) 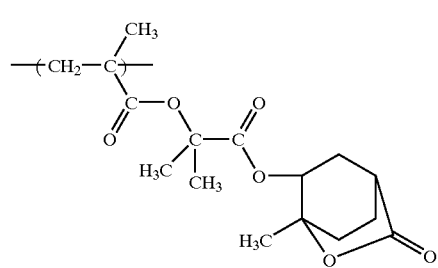
(I-32) 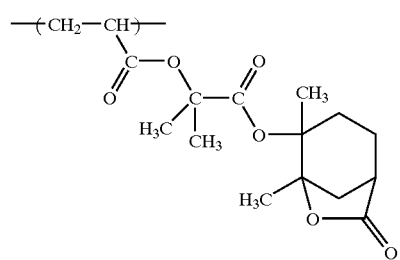
(I-33) 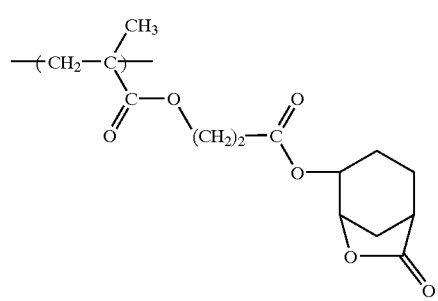
(I-34) 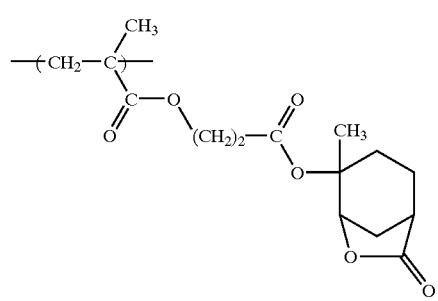
(I-35) 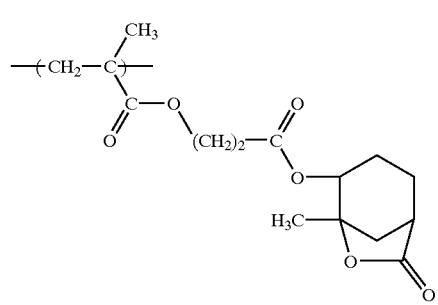
(I-36) 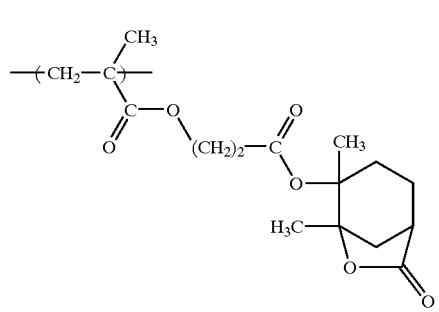
(I-37) 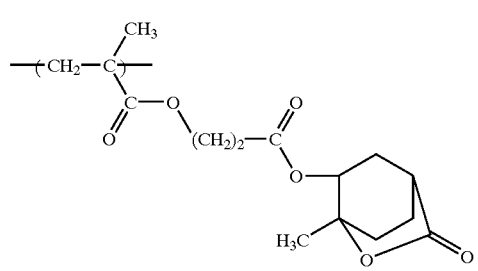
(I-38) 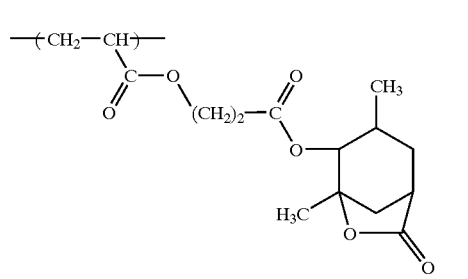
(I-39) 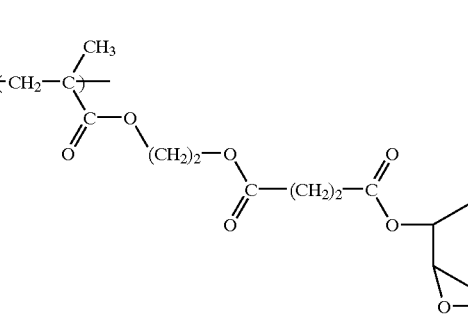
(I-40) 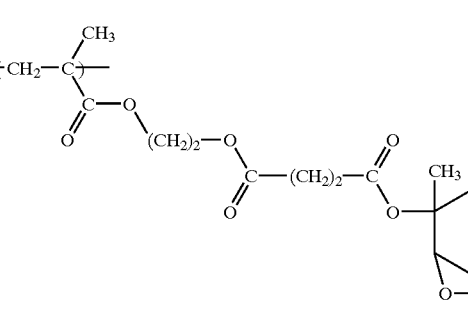

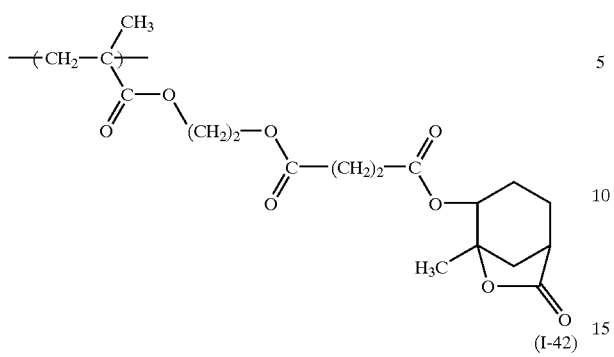

(I-41)

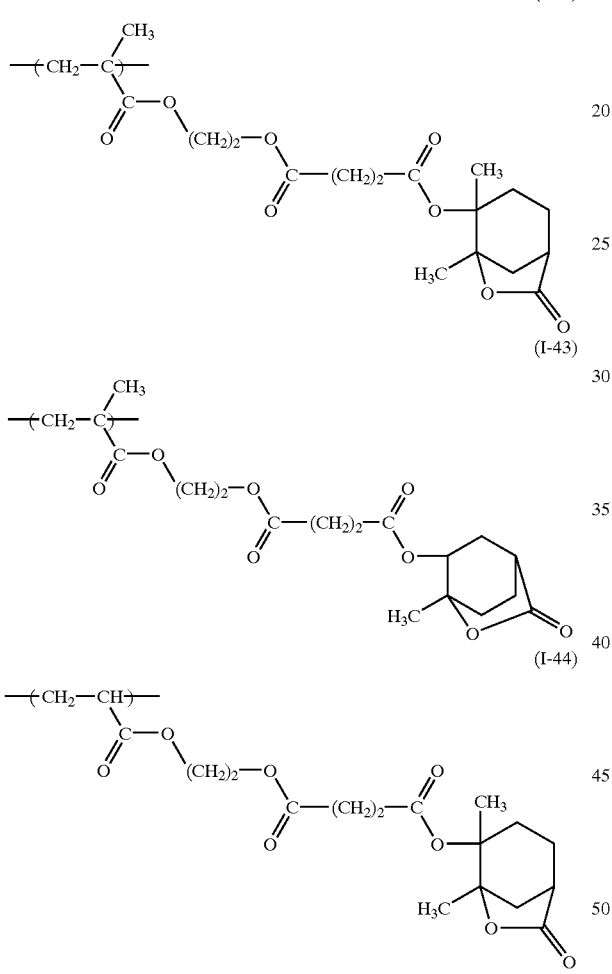

(I-42)

(I-43)

(I-44)

The advantageous features of the invention become further remarkable when the resin in (B) contains a repeating unit having an alkali-soluble group protected by at least one alicyclic hydrocarbon structure represented by the above-cited general formulae (pI) to (pVI).

In general formulae (pI) to (pVI), the alkyl groups for $R_{12}$ to $R_{25}$ each may be substituted or unsubstituted, and represent straight- or branched-chain alkyl groups with 1 to 4 carbon atoms, exemplified by methyl, ethyl, n-propyl, isopropyl, n-butyl, isobutyl, sec-butyl and t-butyl.

The substituent for those alkyl groups includes an alkoxy group with 1 to 4 carbon atoms, a halogen atom (F, Cl, Br and I), an acyl group, an acyloxy group, cyano group, hydroxyl group, carboxyl group, an alkoxycarbonyl group and nitro group.

The alicyclic hydrocarbon group for $R_{11}$ to $R_{25}$ and the one formed by Z together with the carbon atom may be monocyclic or polycyclic. Specifically, groups containing a monocyclo-, bicyclo-, tricyclo- or tetracyclo-structure with at least 5 carbon atoms, preferably 6 to 30 carbon atoms, especially preferably 7 to 25 carbon atoms are included. Such alicyclic hydrocarbon groups may further have a substituent.

In the following, some examples of the alicyclic structural part of the groups containing an alicyclic hydrocarbon structure are shown.

 (1)

 (2)

 (3)

 (4)

 (5)

 (6)

 (7)

 (8)

 (9)

 (10)

 (11)

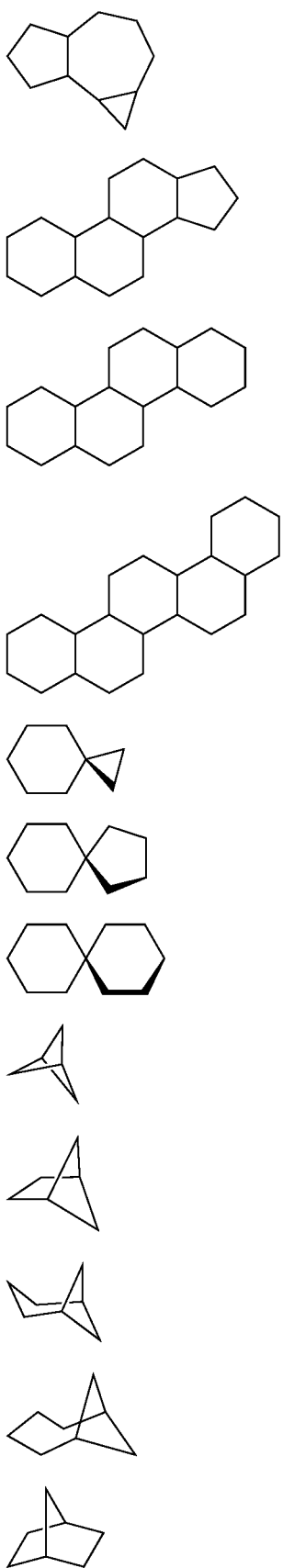
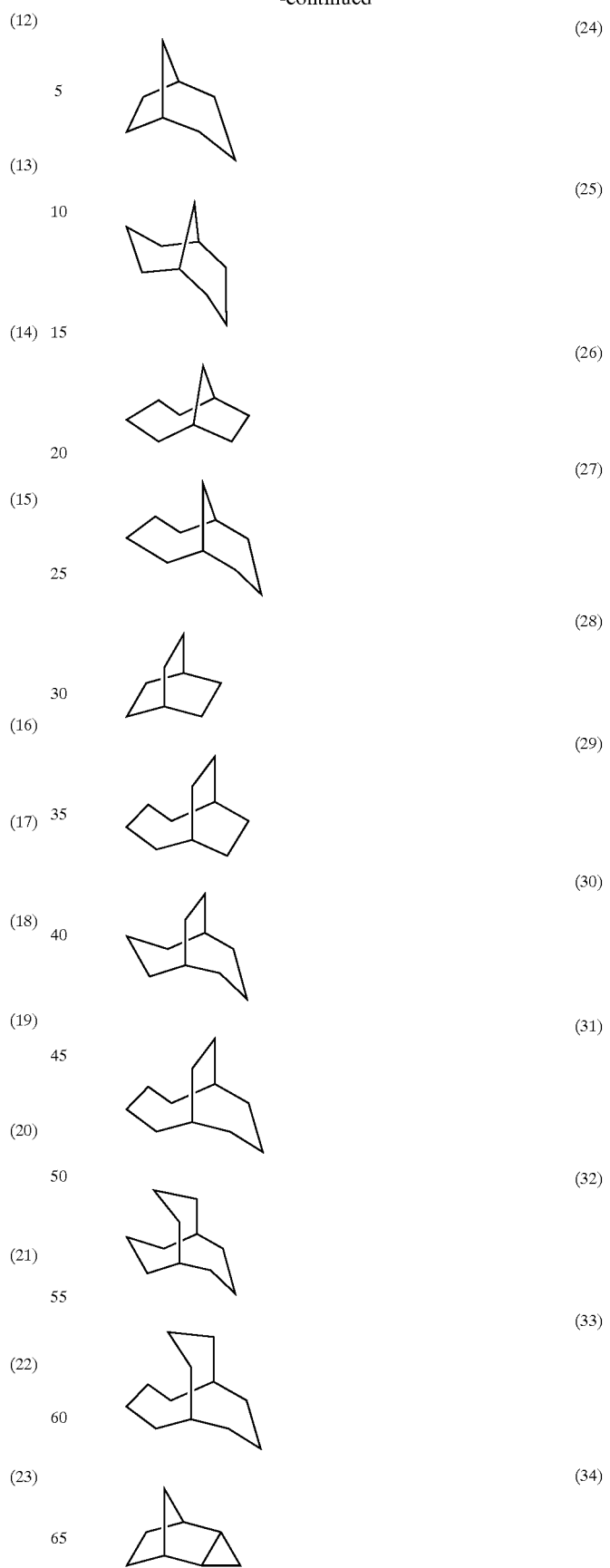

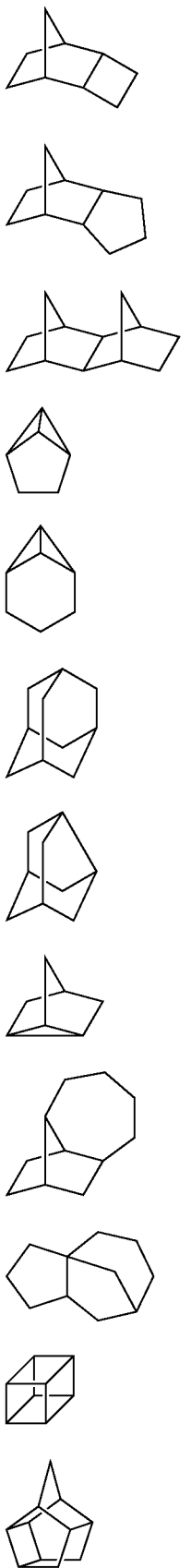
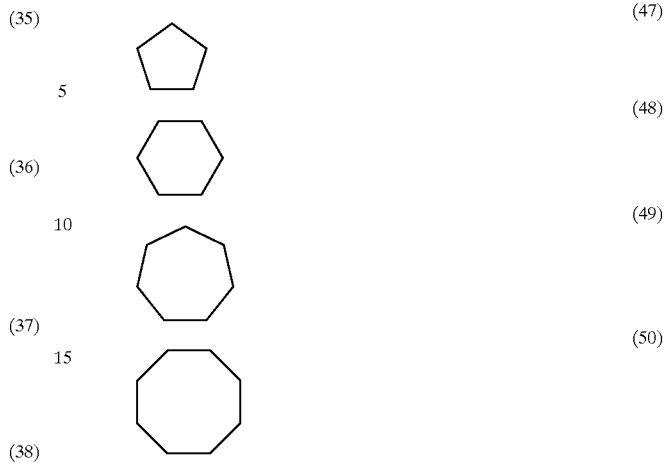

Among the above-cited alicyclic structural parts, those preferable for the invention are adamantyl, noradamantyl, decaline residue, tricyclodecanyl, tetracyclododecanyl, norbornyl, cedrol, cyclohexyl, cycloheptyl, cyclooctyl, cyclodecanyl and cyclododecanyl. Still more preferable groups are adamantyl, decaline residue, norbornyl, cedrol, cyclohexyl, cycloheptyl, cyclooctyl, cyclodecanyl and cyclododecanyl.

Preferable substituents for such alicyclic hydrocarbon groups include an unsubstituted and substituted alkyl group, a cycloalkyl group, an alkenyl group, an acyl group, a halogen atom, hydroxyl group, an alkoxy group, a carboxyl group and an alkoxycarbonyl group. Preferable examples of the alkyl group are lower ones such as methyl, ethyl, propyl, isopropyl and butyl, among which more preferabe ones are methyl, ethyl, propyl and isopropyl. As the substituted alkyl group, those substituted with hydroxyl group, a halogen atom and an alkoxy group are included.

As the alkoxy group (which involves the alkoxy group in the alkoxycarbonyl group), those with 1 to 4 carbon atoms such as methoxy, ethoxy, propoxy and butoxy are included.

As the cycloalkyl group, cyclopropyl, cyclopentyl and cyclohexyl are included.

As the alkenyl group, those with 2 to 6 carbon atoms such as vinyl, propenyl, allyl, butenyl, pentenyl and hexenyl are included.

As the acyl group, acetyl, ethylcarbonyl and propylcarbonyl are included. As the halogen atom, chlorine, bromine, iodine and fluorine are included.

Among the structures represented by general formulae (pI) to (pVI), those represented by general formula (pI) are preferred. More preferable groups are those represented by general formula (II) cited previously. The alkyl group for $R_{28}$ in general formula (II), and the halogen atom, the alkyl group, the cycloalkyl group, the alkenyl group, the alkoxy group, the alkoxycarbonyl group and the acyl group all for $R_{29}$ to $R_{31}$ are the same as those cited as the substituents for the above-cited alicyclic hydrocarbon group.

As the alkali-soluble group to be protected by the structure represented by general formulae (pI) to (pVI) contained in the resin, various groups well known in this technical field can be used, specifically including a carboxylic acid group, a sulfonic acid group, phenol group, and a thiol group. Among them, carboxylic and sulfonic acid groups are preferred.

The alkali-soluble group protected by the structure represented by general formulae (pI) to (pVI) contained in the resin preferably includes those represented by the following general formulae (pVII) to (pXI).

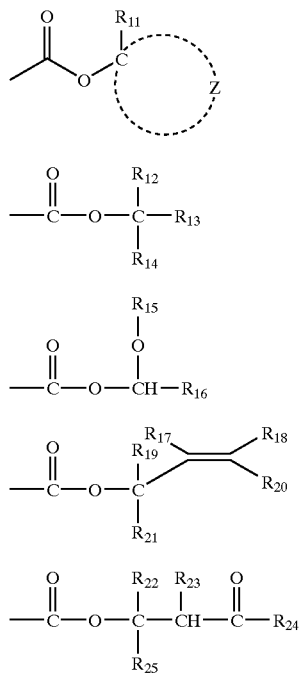

(pVII)
(pVIII)
(pIX)
(pX)
(pXI)

In these formulae, $R_{11}$ to $R_{25}$ and Z have the same meaning as defined hereinabove.

As the repeating unit composing the resin mentioned above and having the alkali-soluble group protected by general formulae (pI) to (pVI), those represented by the following general formula (pA) are preferred.

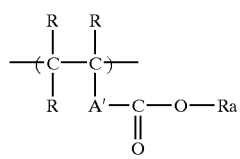

(pA)

In general formula (pA), R represents a hydrogen atom, a halogen atom and a substituted or unsubstituted, straight- or branched-chain alkyl group with 1 to 4 carbon atoms. The plural R's may be the same or different. Halogen atoms or alkyl groups for these R's are common to those for the R in general formula (a) to be shown hereinbelow.

A' has the same meaning as described above.

Ra represents the group represented by one of the above-cited general formulae (pI) to (pVI).

Some specific examples of the monomer corresponding to the repeating unit represented by general formula (pA) will follow.

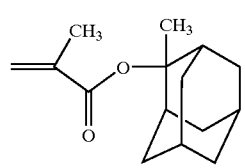

1

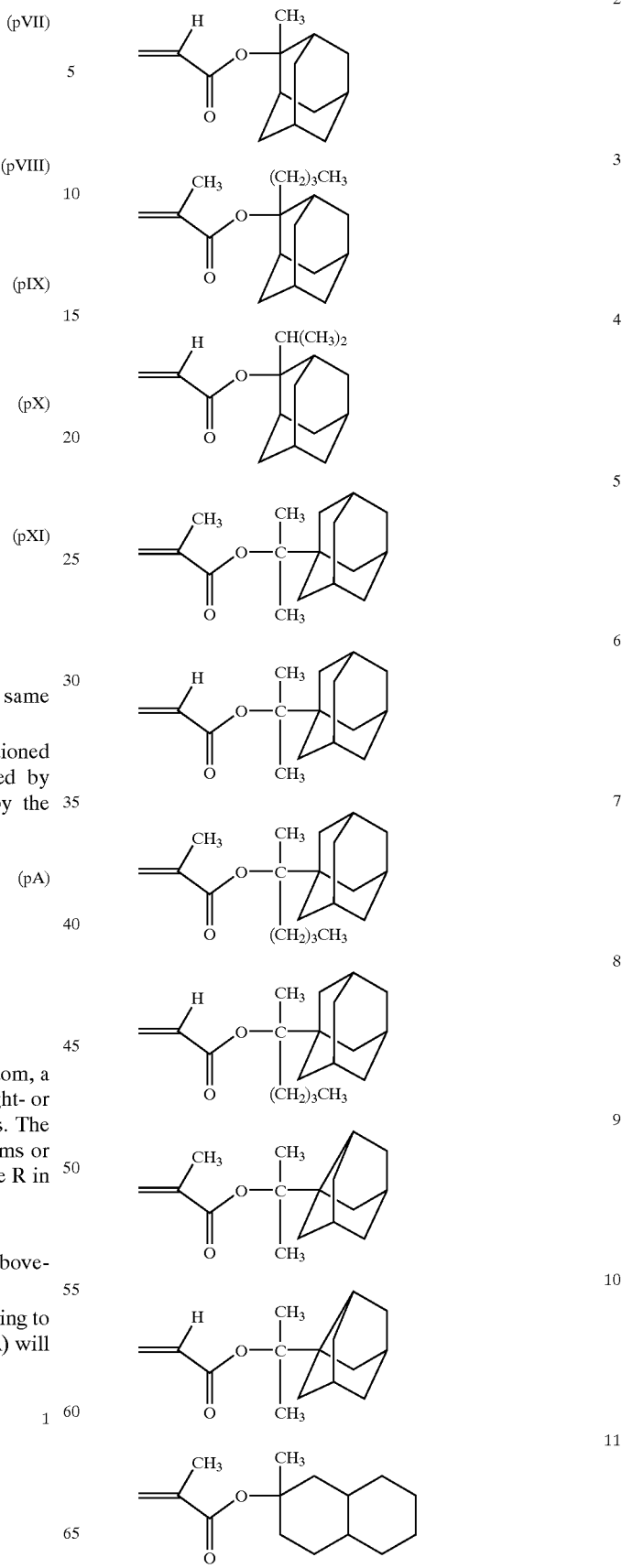

2
3
4
5
6
7
8
9
10
11

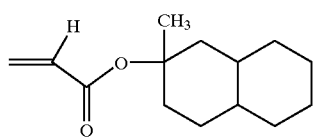
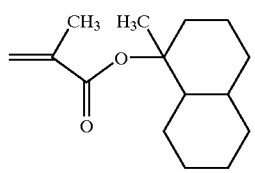
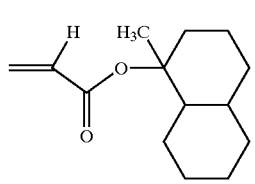
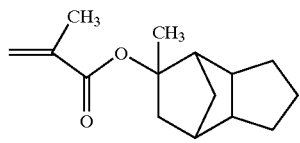
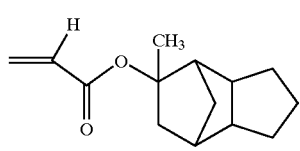
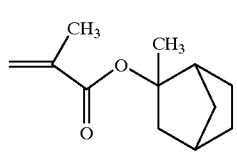
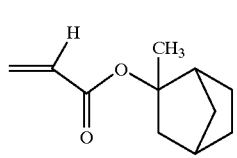
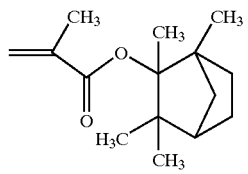
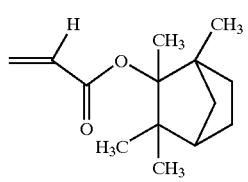
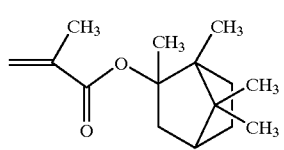
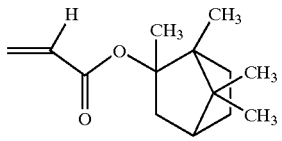
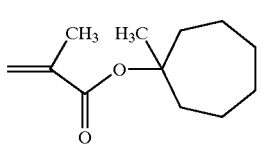
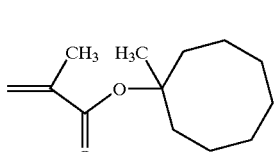
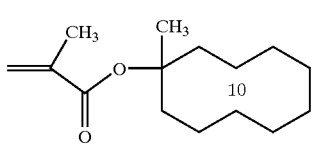
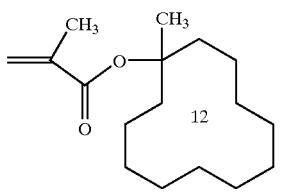
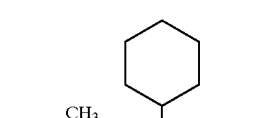
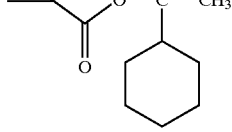
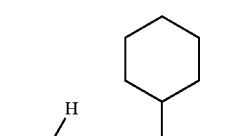
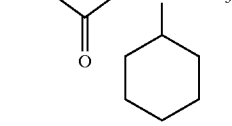
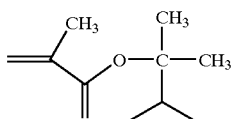
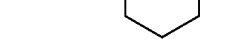

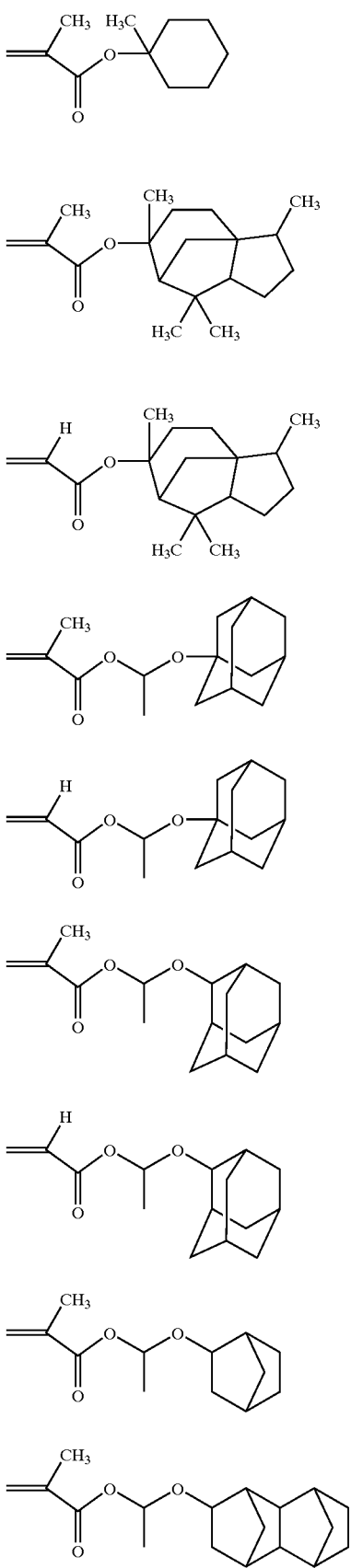

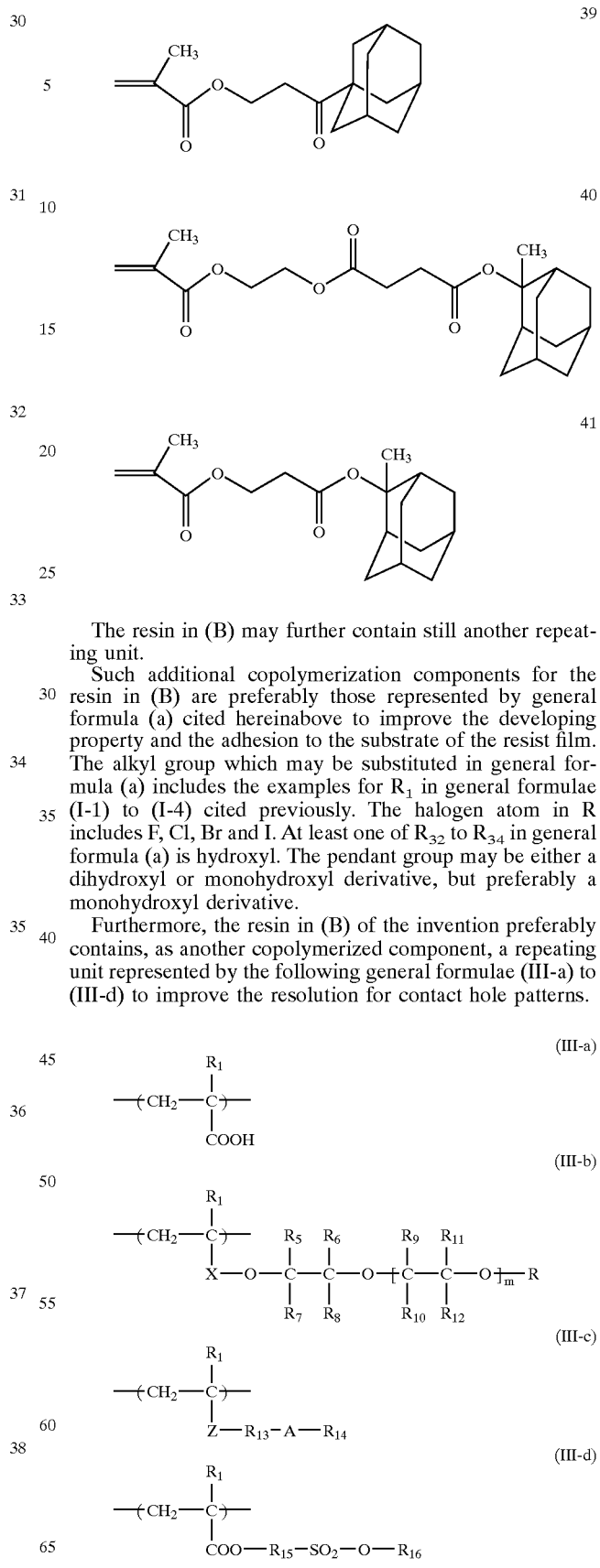

The resin in (B) may further contain still another repeating unit.

Such additional copolymerization components for the resin in (B) are preferably those represented by general formula (a) cited hereinabove to improve the developing property and the adhesion to the substrate of the resist film. The alkyl group which may be substituted in general formula (a) includes the examples for $R_1$ in general formulae (I-1) to (I-4) cited previously. The halogen atom in R includes F, Cl, Br and I. At least one of $R_{32}$ to $R_{34}$ in general formula (a) is hydroxyl. The pendant group may be either a dihydroxyl or monohydroxyl derivative, but preferably a monohydroxyl derivative.

Furthermore, the resin in (B) of the invention preferably contains, as another copolymerized component, a repeating unit represented by the following general formulae (III-a) to (III-d) to improve the resolution for contact hole patterns.

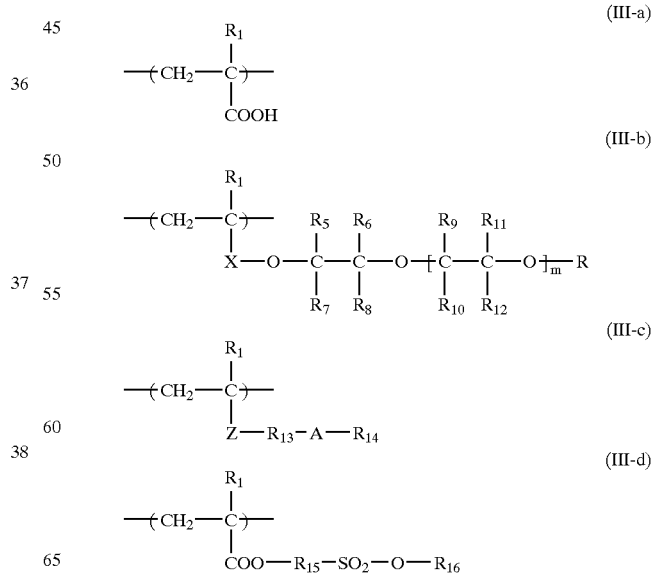

In the above formulae, $R_1$ has the same meaning as the R previously defined. $R_5$ to $R_{12}$ each independently represents a hydrogen atom or an alkyl group that may have a substituent. R represents a hydrogen atom and an alkyl, cycloalkyl, aryl or aralkyl group that may be substituted. m represents an integer of 1 to 10. X represents a single bond or a divalent group which is not decomposed by the action of an acid, and which comprises from one group or combined two groups selected from the group consisting of alkylene, cyclic alkylene, arylene, ether, thioether, carbonyl, ester, amide, sulfonamide, urethane and urea.

Z represents a single bond, an ether group, an ester group, an amide group, an alkylene group, or a divalent group resulting from the combination of two of these. $R_{13}$ represents a single bond, an alkylene group, an arylene group, or a divalent group resulting from the combination of two of these. $R_{15}$ represents an alkylene group, an arylene group, or a divalent group resulting from the combination of an alkylene group and an arylene group. $R_{14}$ represents an alkyl, cycloalkyl, aryl or aralkyl group that may be substituted. $R_{16}$ represents a hydrogen atom, an alkyl, cycloalkyl, alkenyl, aryl or aralkyl group that may be substituted.

A represents one of the following functional groups.

—CO—NH—SO$_2$—

—SO$_2$—NH—CO—

—NH—CO—NH—SO$_2$—

—SO$_2$—NH—CO—NH—

—O—CO—NH—SO$_2$—

—SO$_2$—NH—CO—O—

—SO$_2$—NH—SO$_2$—

The alkyl groups for $R_5$ to $R_{12}$, R, $R_{14}$ and $R_{16}$ maybe straight- or branched-chained, and may be substituted. Such straight- or branched-chained alkyl groups contain preferably 1 to 12 carbon atoms, more preferably 1 to 10 carbon atoms; still more preferably, the alkyl group is methyl, ethyl, propyl isopropyl, n-butyl, isobutyl, sec-butyl, t-butyl, pentyl, hexyl, heptyl, octyl, nonyl or decyl.

The cycloalkyl group for R, $R_{14}$ and $R_{16}$ contain preferably 3 to 30 carbon atoms, specifically including cyclopropyl, cyclopentyl, cyclohexyl, adamantyl, norbornyl, bornyl, tricyclodecanyl, dicyclopentenyl, norbornaneepoxy, menthyl, isomenthyl, neomenthyl and tetracyclododecanyl groups, and a steroid residue.

The aryl group for R, $R_{14}$ and $R_{16}$ includes those with 6 to 20 carbon atoms which may be substituted; specific examples are phenyl, totyl and naphthyl.

The aralkyl group for R, $R_{14}$ and $R_{16}$ includes those with 7 to 20 carbon atoms which maybe substituted, specific examples being benzyl, phenethyl and cumyl. The alkenyl group for $R_{16}$ includes those with 2 to 6 carbon atoms, specific examples being vinyl, propenyl, allyl, butenyl, pentenyl, hexenyl, cyclopentenyl, cyclohexenyl, 3-oxocyclohexenyl, 3-oxocyclopentenyl and 3-oxoindenyl. Among these, the cyclic alkenyl groups may contain an oxygen atom.

The linkage group X includes a divalent group that is not decomposed by the action of acid and that comprises one or combined two or more groups selected from the group consisting of substituted or unsubstituted alkylene, cycloalkylene and arylene groups, an ether group, a thioether group, a carbonyl group, an ester group, an amide group, a sulfonamide group, a urethane group and a urea group.

Z represents a single bond, an ether group, an ester group, an amide group, an alkylene group, or a divalent group resulting from the combination of these. $R_{13}$ represents a single bond, an alkylene group, an arylene group or a divalent group resulting from the combination of these. $R_{15}$ represents an alkylene group, an arylene group or a divalent group resulting from the combination of these.

The aryl group for X, $R_{13}$ and $R_{15}$ includes those with 6 to 10 carbon atoms which may be substituted, specific examples being phenylene, tolylene and naphthylene.

The cycloalkylene group for X includes divalent ones derived from the above-cited cycloalkyl groups.

The alkylene group for X, Z, $R_{13}$ and $R_{15}$ includes those represented by the following structure.

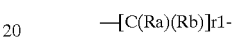

In the structure, Ra and Rb each represents a hydrogen atom, an alkyl group, a substituted alkyl group, a halogen atom, hydroxyl group and an alkoxy group. Ra and Rb may be the same or different. The alkyl group here is preferably a lower one such as methyl, ethyl, propyl, isopropyl and butyl, and more preferably chosen from methyl, ethyl, propyl and isopropyl. The substituent for the substituted alkyl group here includes hydroxy, halogen and alkoxy. As the alkoxy group, those with 1 to 4 carbon atoms are preferred such as methoxy, ethoxy, propoxy and butoxy. As the halogen atom, Cl, Br, F and I are preferred. r1 represents an integer of 1 to 10.

Some practical examples for the linkage group X are shown below not to restrict the scope of the invention thereto.

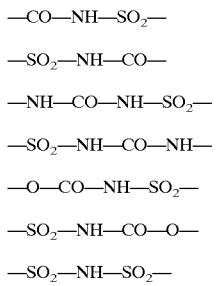

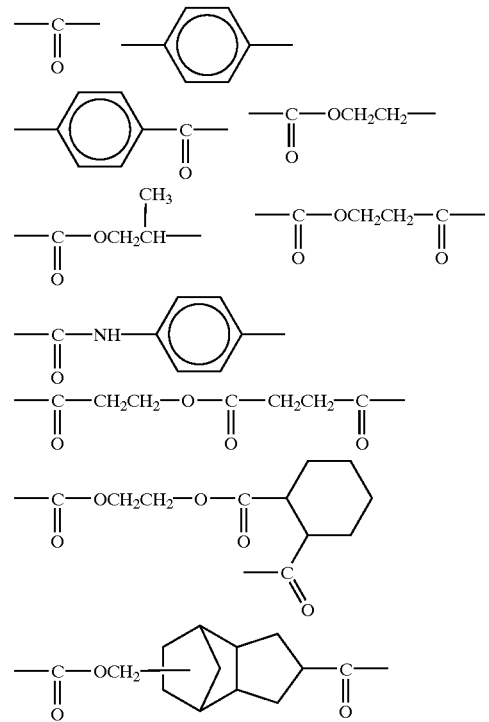

-continued

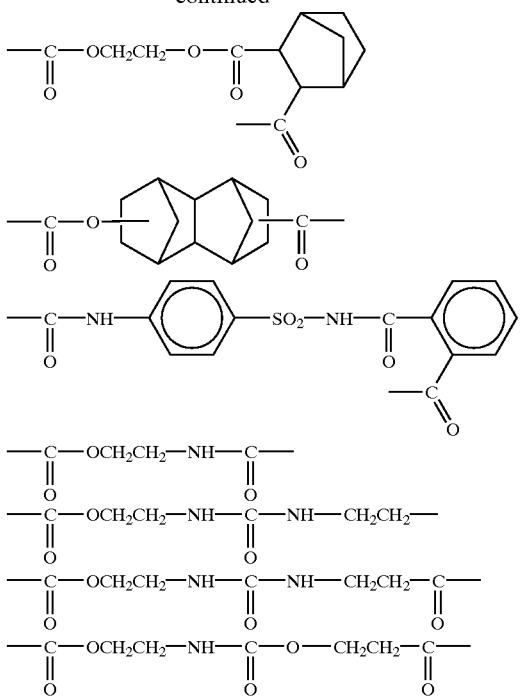

The alkyl, cycloalkyl, alkenyl aryl, aralkyl, alkylene, cycloalkylene and arylene groups described hereinabove may have the following substituent; a carboxyl group, an acyloxy group, cyano group, an alkyl group, a substituted alkyl group, a halogen atom, hydroxyl group, an alkoxy group, acetyl amide group, an alkoxycarbonyl group and an acyl group. The alkyl group here is preferably a lower one such as methyl, ethyl, propyl, isopropyl, butyl, cyclopropyl, cyclobutyl and cyclopentyl. The substituent for the substituted alkyl group here includes hydroxy, halogen and alkoxy. As the alkoxy group, those with 1 to 4 carbon atoms are preferred such as methoxy, ethoxy, propoxy and butoxy. As the acyloxy group, acetoxy group is preferred. As the halogen atom, Cl, Br, F and I are preferred.

In the following, as the specific example of the side-chain structure in general formula (III-b), some terminating structural examples except X are enumerated not to restrict the scope of the invention thereto at all.

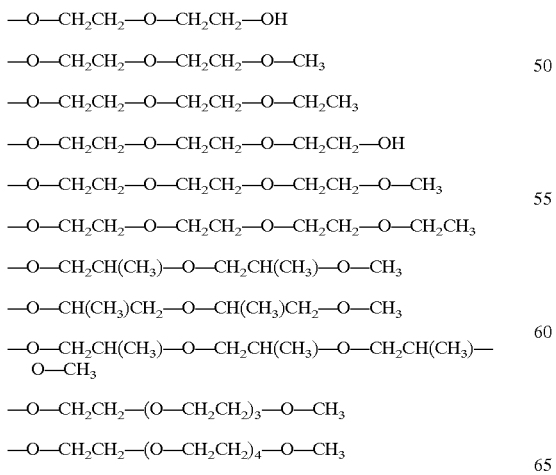

In the following, some specific examples of the monomer corresponding to the repeating unit represented by general formula (III-c) are enumerated not to restrict the scope of the invention thereto at all.

(1)
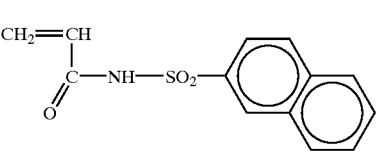

(2)
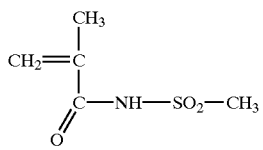

(3)
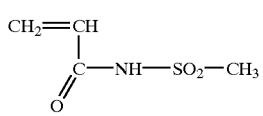

(4)
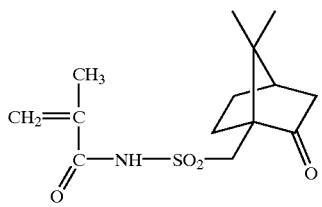

(5)
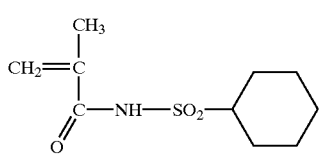

(6)
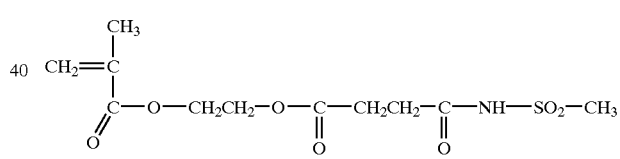

(7)
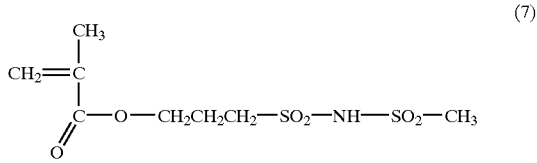

(8)
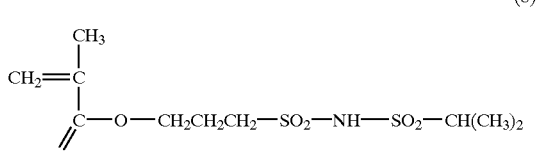

(9)
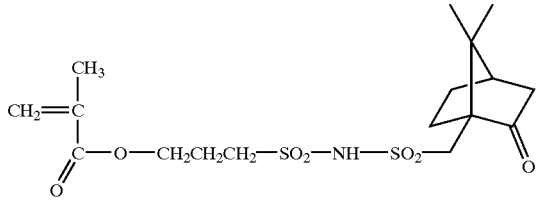

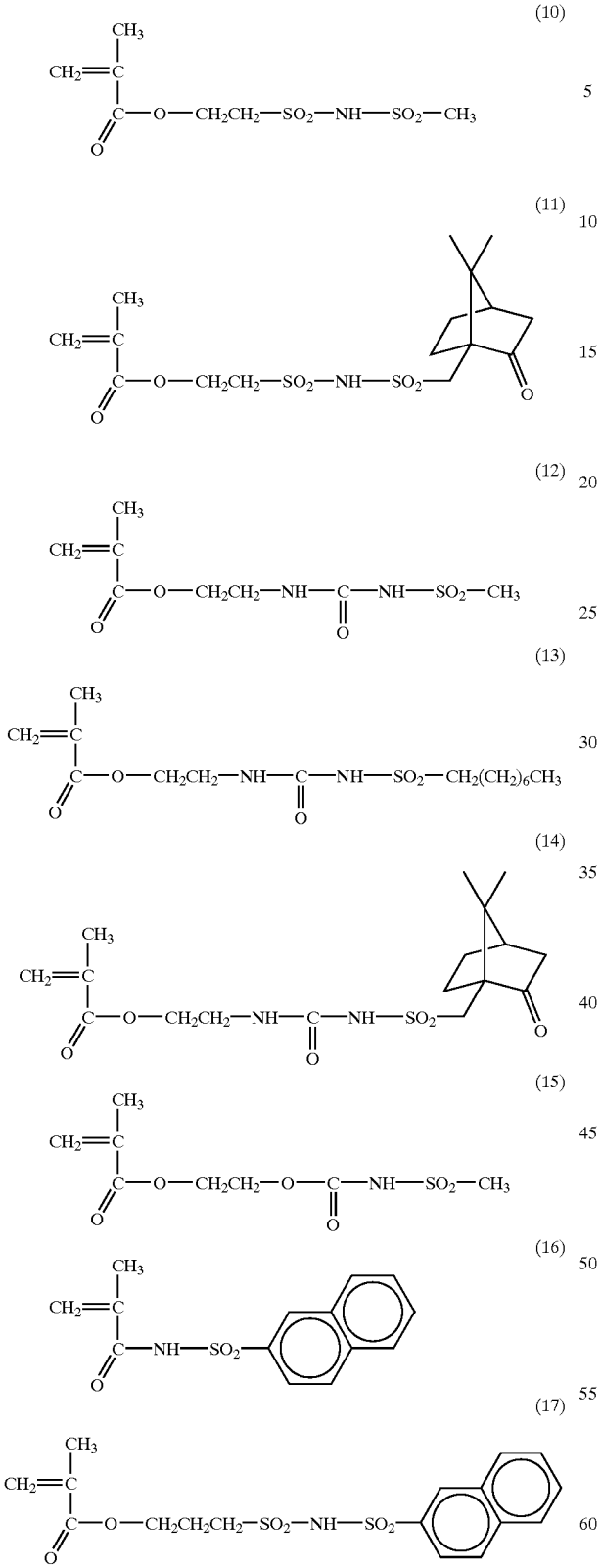
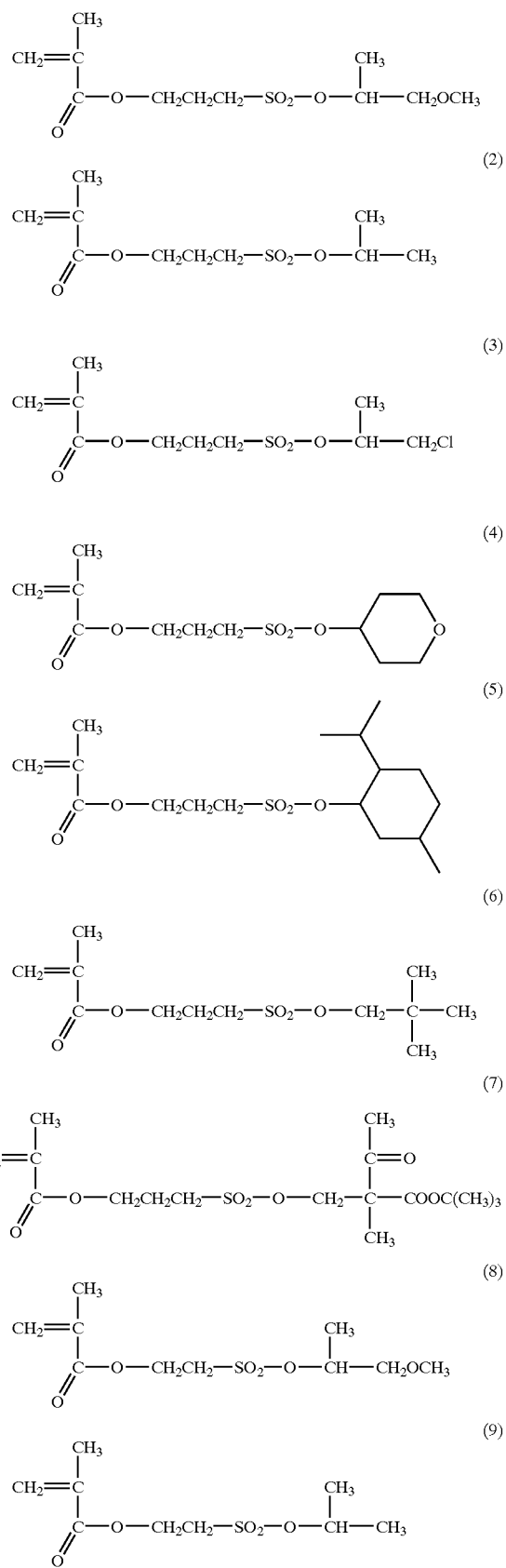
In the following, some specific examples of the repeating unit represented by general formula (III-d) are enumerated not to restrict the scope of the invention thereto at all.

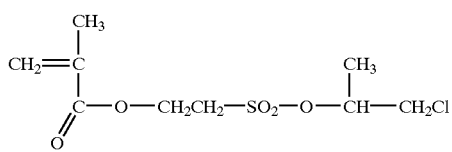
(10)

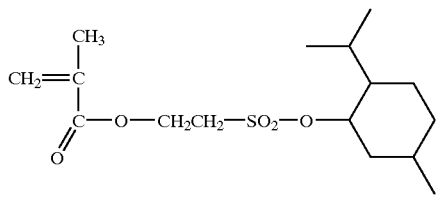
(11)

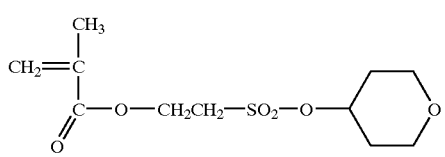
(12)

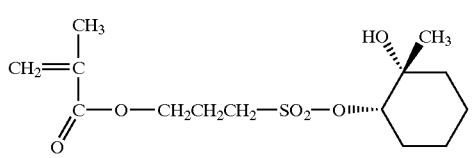
(13)

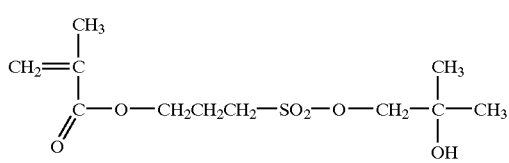
(14)

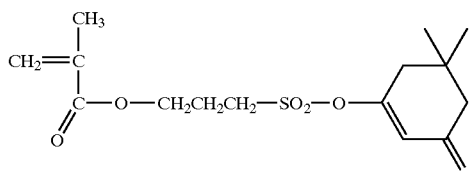
(15)

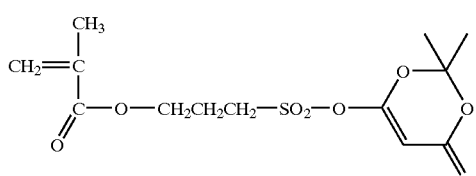
(16)

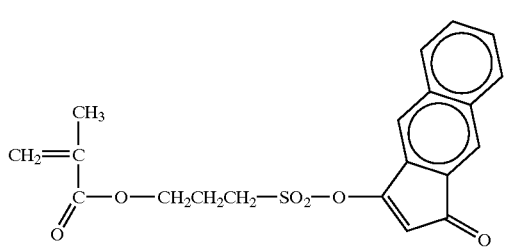
(17)

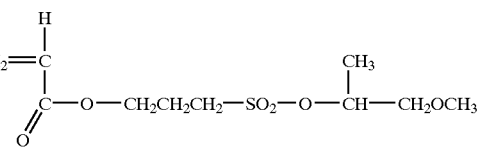
(18)

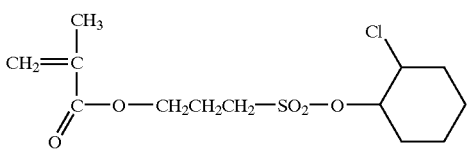
(19)

$R_5$ to $R_{12}$ in general formula (III-b) each preferably represents a hydrogen atom or methyl. As R, a hydrogen atom or an alkyl group with 1 to 4 carbon atoms is preferred. m is preferably 1 to 6.

$R_{13}$ in general formula (III-c) preferably represents a single bond, or an alkylene group such as methylene, ethylene, propylene or butylene. $R_{14}$ preferably represents an alkyl group with 1 to 10 carbon atoms such as methyl and ethyl, an alicyclic group such as cyclopropyl, cyclohexyl and a camphor moiety, naphthyl group and naphthylmethyl group. Z represents a single bond, an ether bond, an ester bond, an alkylene group with 1 to 6 carbon atoms, or a group resulting from the combination of these, preferably representing a single bond or an ester bond.

$R_{15}$ in general formula (III-d) preferably represents an alkylene group with 1 to 4 carbon atoms. $R_{16}$ preferably represents an alkyl group with 1 to 8 carbon atoms that may be substituted including methyl, ethyl, propyl, isopropyl, butyl, neopentyl and octyl, a cyclohexyl group, adamantyl group, norbornyl group, bornyl group, isobornyl group, menthyl group, morpholino group, 4-oxocylcohexyl group, and substituted or unsubstituted phenyl, tolyl, mesityl and naphthyl groups, and a camphor moiety. The substitutent for these preferably includes a halogen atom such as F and an alkoxy group with 1 to 4 carbon atoms.

Among general formulae (III-a) to (III-d), the repeating units represented by formulae (III-b) or (III-d) are particularly preferred for the invention.

In addition to those described heretofore, the resin in (B) can take a form of a copolymer with a repeating unit selected from various monomers for the purpose of regulating not only dry-etching resistance, standard developer adaptability, substrate adhesion and resist profile, but also general essential features requested for resists such as resolution, heat-resistance and sensitivity.

The repeating unit includes those derived from the following monomers, to which, however, the scope of the invention is not restricted at all.

With use of these copolymerization components, various properties required for the resin, in particular, (1) solubility in coating solvents, (2) film-forming capability (glass transition temperature), (3) developability with alkaline developer, (4) resist thickness decrease (balance of hydrophilicity/hydrophobicity, selection of alkali-soluble group), (5) adhesion to the substrate at unexposed area, and (6) dry etching resistance, can be finely regulated.

Copolymerization monomers applicable to the present purpose are those having one addition-polymerizable unsaturated group, including, for example, acrylic acid esters, acrylamide derivatives, methacrylic acid esters, methacrylamide derivatives, allyl compounds, vinyl ethers and vinyl esters.

Specific examples include acrylic acid esters such as, for example, alkyl acrylates in which the alkyl group preferably has 1 to 10 carbon atoms (exemplified by methyl acrylate, ethyl acrylate, propyl acrylate, amyl acrylate, cyclohexyl acrylate, ethylhexyl acrylate, octyl acrylate, chloroethyl acrylate, 2-hydroxyethyl acrylate, 2,2-dimethylhydroxypropyl acrylate, 5-hydroxypentyl acrylate, trimethylolpropane monoacrylate, pentaerythritol monoacrylate, benzyl acrylate, methoxybenzyl acrylate, furfuryl acrylate and tetrahydrofurfuryl acrylate); methacrylic acid esters such as, for example, alkyl methacrylates in which the alkyl group preferably has 1 to 10 carbon atoms (exemplified by methyl methacrylate, ethyl methacrylate, propyl methacrylate, isopropyl methacrylate, amylmethacrylate, hexylmethacrylate, cyclohexylmethacrylate, benzyl methacrylate, chlorobenzyl methacrylate, octyl methacrylate, 2-hydroxyethyl methacrylate, 4-hydroxybutyl methacrylate, 5-hydroxypentyl methacrylate, 2,2-dimethyl-3-hydroxypropyl methacrylate, trimethylolpropane monomethacrylate, pentaerythritol monomethacrylate, furfuryl methacrylate and tetrahydrofurfuryl methacrylate); acrylamides such as acrylamide and N-alkylacrylamides in which the alkyl group preferably has 1 to 10 carbon atoms (exemplified by methyl, ethyl, propyl, butyl, t-butyl, heptyl, octyl, cyclohexyl and hydroxyethyl), N,N-dialkylacrylamide in which the alkyl group preferably has 1 to 10 carbon atoms, including, for example, methyl, ethyl, butyl, isobutyl, ethylhexyl and cyclohexyl), N-hydroxyethyl-N-methylacrylamide and N-2-acetamidoethyl-N-acetylacrylamide; methacrylamides such as methacrylamide and N-alkylmethacrylamides (the alkyl group preferably having 1 to 10 carbon atoms, specifically including, for example, methyl, ethyl, t-butyl, ethylhexyl, hydroxyethyl and cyclohexyl), N,N-dialkylmethacrylamide (the alkyl group including, for example, ethyl, propyl and butyl) and N-hydroxyethyl-N-methylmethacrylamide; allyl compounds such as allyl esters (including, for example, allylacetate, allylcapronate, allylcaprylate, allyllaurate, allyl palmitate, allyl stearate, allyl benzoate, allyl acetoacetate and allyl lactate) and allyloxyethanol; vinyl ethers such as, for example, alkyl vinyl ethers (including, for example, hexyl vinyl ether, octyl vinyl ether, decyl vinyl ether, ethylhexyl vinyl ether, methoxyethyl vinyl ether, ethoxyethyl vinyl ether, chloroethyl vinyl ether, 1-methyl-2,2-dimethylpropyl vinyl ether, 2-ethylbutyl vinyl ether, hydroxyethyl vinyl ether, diethylene glycol vinyl ether, dimethylaminoethyl vinyl ether, diethylaminoethyl vinyl ether, butylaminoethyl vinyl ether, benzyl vinyl ether and tetrahydrofurfuryl vinyl ether); vinyl esters such as, for example, vinyl butyrate, vinyl isobutyrate, vinyl trimethylacetate, vinyl diethylacetate, vinyl valerate, vinyl caproate, vinyl chloroacetate, vinyl dichloroacetate, vinyl methoxyacetate, vinyl butoxyacetate, vinyl acetoacetate, vinyl lactate, vinyl β-phenyl butyrate and vinyl cyclohexylcarboxylate; dialkyl itaconates (including, for example, dimethyl itaconate, diethyl itaconate and dibutyl itaconate); dialkyl esters and monoalkyl esters of fumaric acid (including, for example, dibutyl maleate).

Further, acrylic acid, methacrylic acid, crotonic acid, itaconic acid, maleic anhydride, maleimide, acrylonitrile, methacrylonitrile and maleilonitrile are included. In general, any addition-polymerizable unsaturated compound that is copolymerizable with the various repeating units may be used.

In the resin in (B), the molar ratios of the composing repeating units can be appropriately determined so as to optimize not only acid value, dry-etching resistance, standard developer adaptability and substrate adhesion, but also universal requirements for resists such as the pitch dependency of resist profile, resolution, heat-resistance and sensitivity.

The total content of the repeating unit(s) represented by general formulae (I-1) to (I-4) is usually 30 to 70 mol %, preferably 35 to 65 mol %, and still more preferably 40 to 60 mol % in the total repeating units contained in the polymer in (B).

The total content of the repeating units represented by general formulae (pI) to (pVI) is usually 20 to 75 mol %, preferably 25 to 70 mol %, and still more preferably 30 to 65 mol % in the total repeating units contained in the polymer.

The total content of the repeating units represented by general formula (a) in the resin in (B) is usually 0 to 70 mol %, preferably 10 to 40 mol %, and still more preferably 15 to 30 mol % in the total repeating units contained in the polymer.

The total content of the repeating units represented by general formulae (III-a) to (III-d) in the resin in (B) is usually 0.1 to 30 mol %, preferably 0.5 to 25 mol %, and still more preferably 1 to 20 mol % in the total repeating units contained in the polymer.

Furthermore, the content of the additional repeating unit of the copolymerized monomer, which is properly determined depending on the desired characteristics of the final resist, is preferably 99 mol % or less, more preferably 90 mol % or less, and more preferably 80 mol % or less of the sum of the repeating units represented by one of general formulae (I-1) to (I-4) and those by general formulae (pI) to (pVI).

When the resist composition of the invention is to be used with an ArF light source, the resin should not desirably contain any aromatic group to secure a high transmittance to the ArF light.

The weight-averaged molecular weight Mw of the resin in (B) of the invention should preferably lie in the range of from 1,000 to 1,000,000, more preferably 1,500 to 500,000, still more preferably 2,000 to 200,000, and especially preferably 2,500 to 100,000 in terms of the value determined by gel permeation chromatography with polystyrene reference. Within these ranges, larger weight-averaged molecular weights are advantageous for heat-resistance, but tend to deteriorate developability. These properties are optimally balanced by selecting a proper molecular weight.

The resin in (B) of the invention can be prepared by any conventional synthetic method such as radical polymerization.

In the following, some specific examples of the resin in (B) of the invention will be shown not to restrict the scope of the invention thereto.

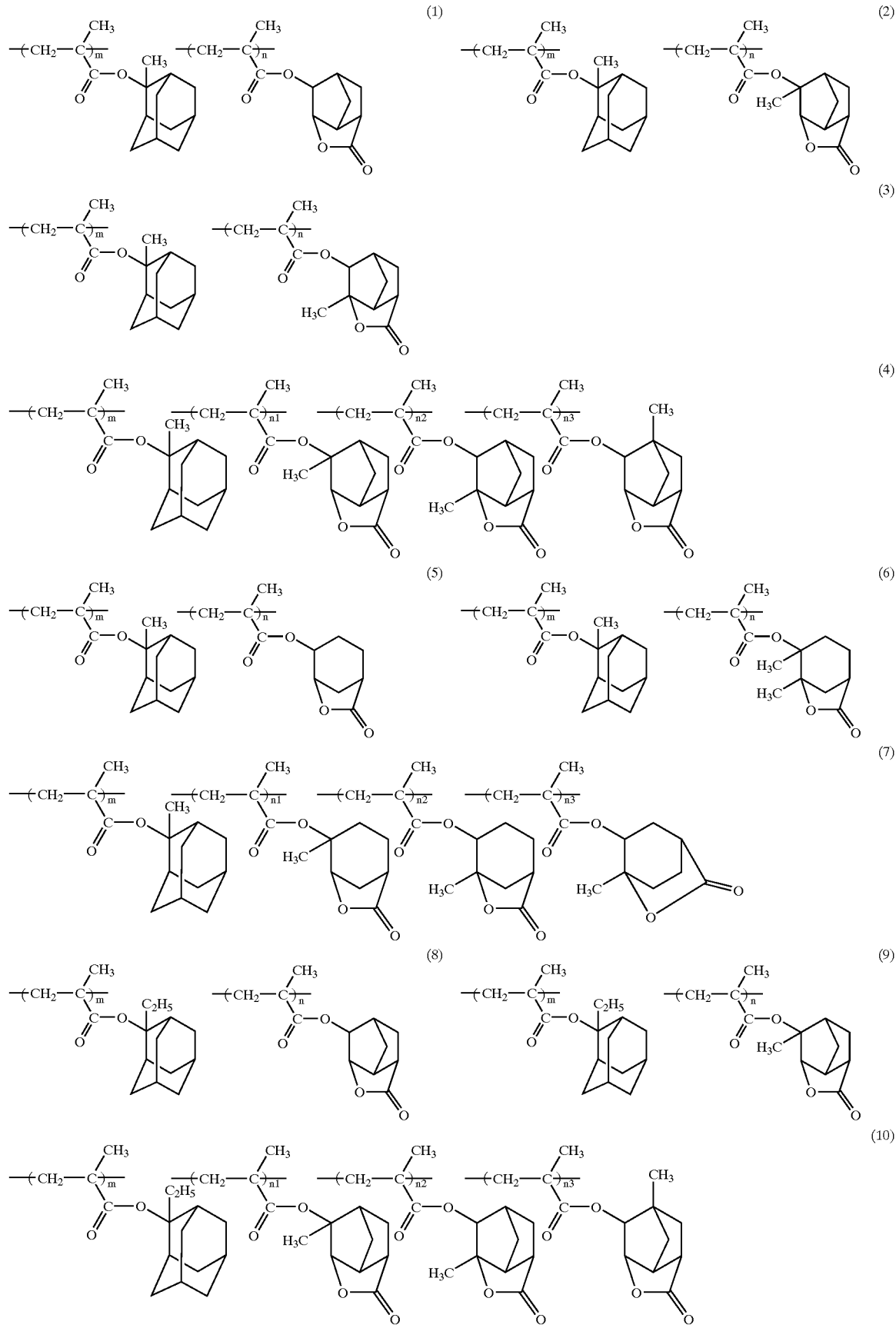

-continued
(11)
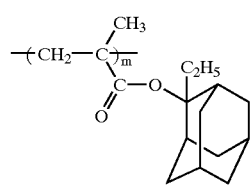
(12)
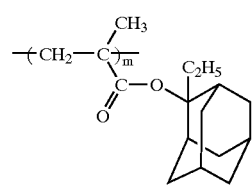
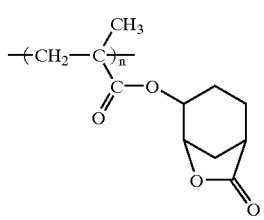 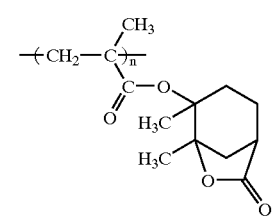
(13)
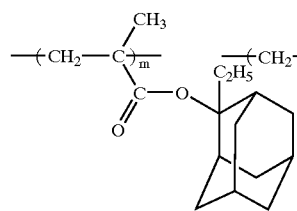 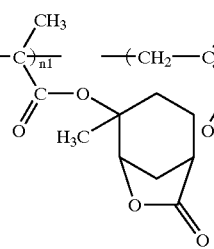 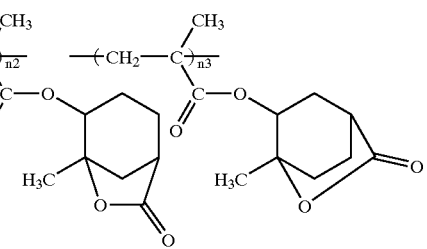
(14)
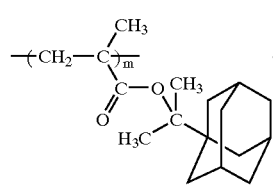
(15)
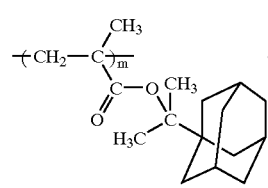
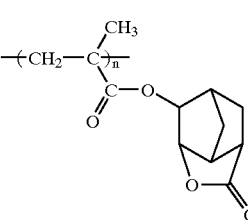 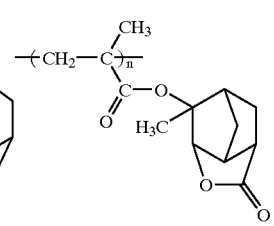
(16)
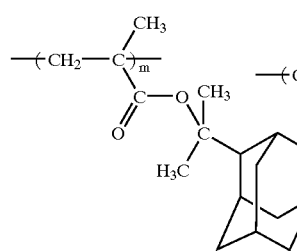 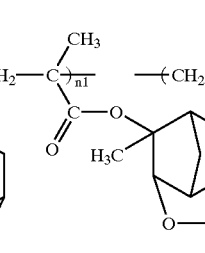 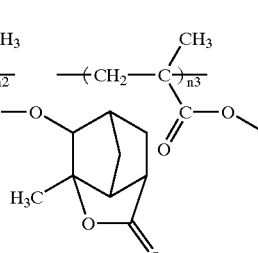 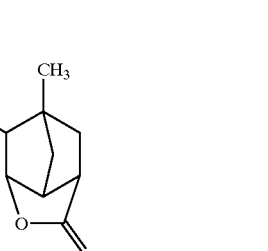
(17)
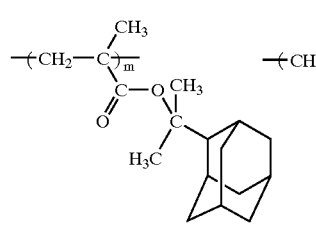
(18)
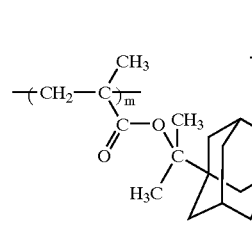
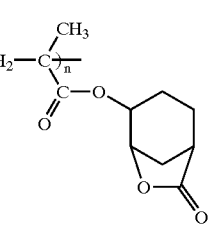 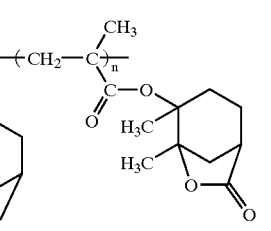
(19)
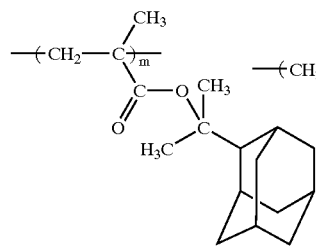 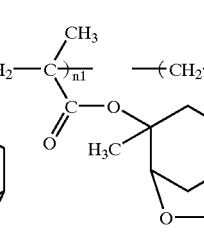 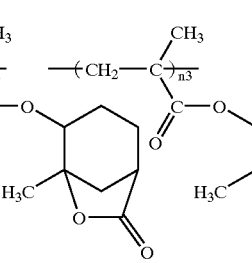 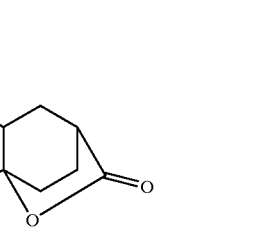

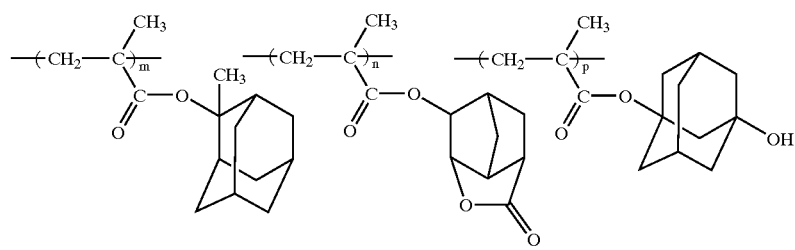
(20)
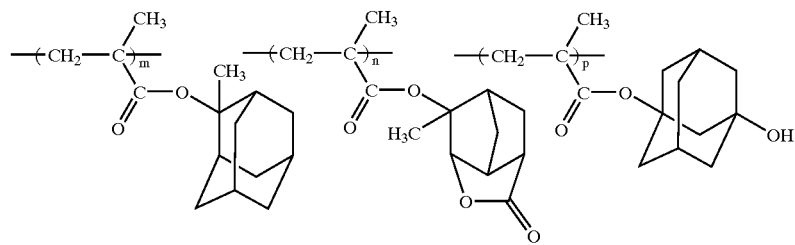
(21)
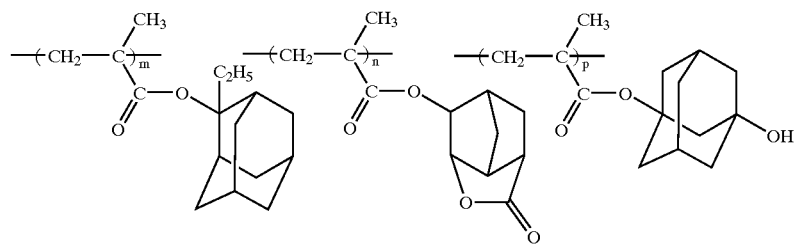
(22)
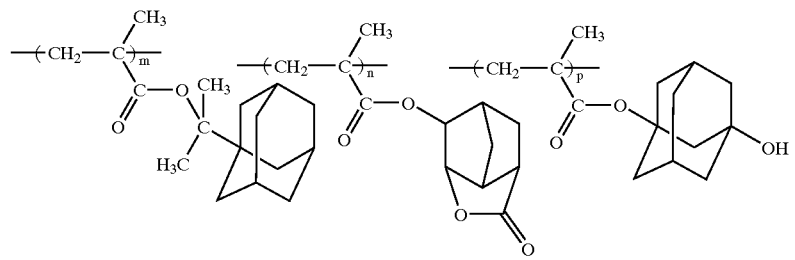
(23)
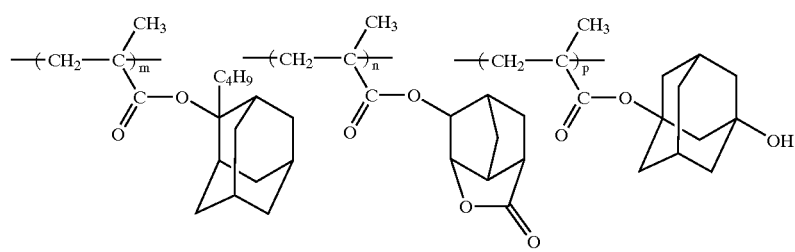
(24)
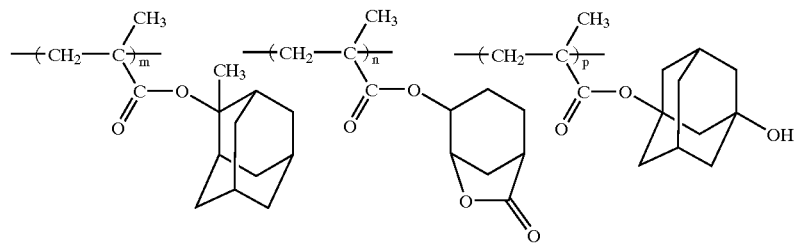
(25)

(26)
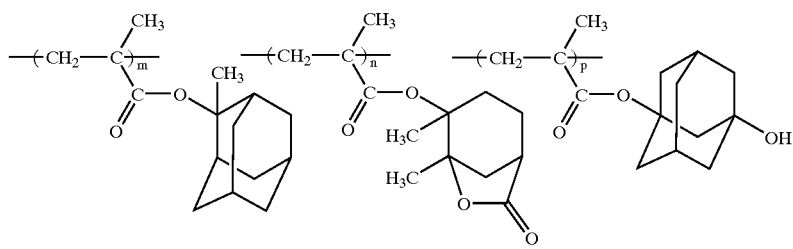
(27)
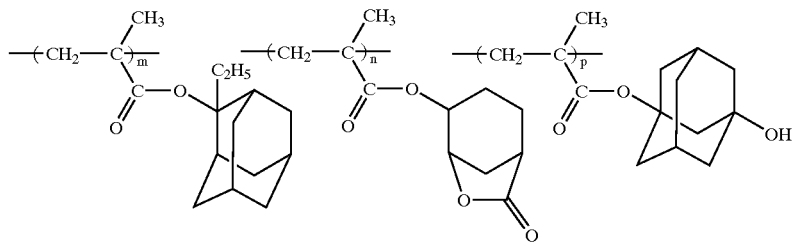
(28)
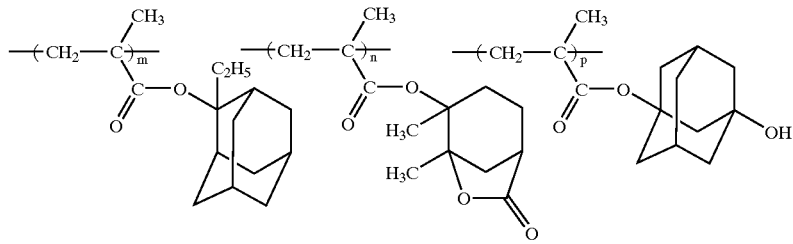
(29)
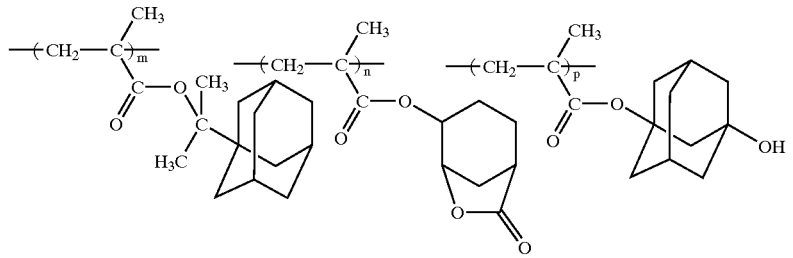
(30)
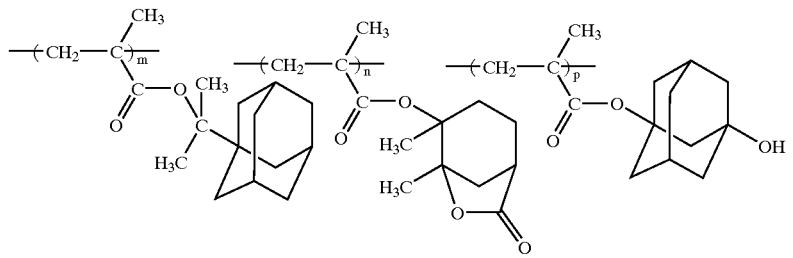
(31) (32)
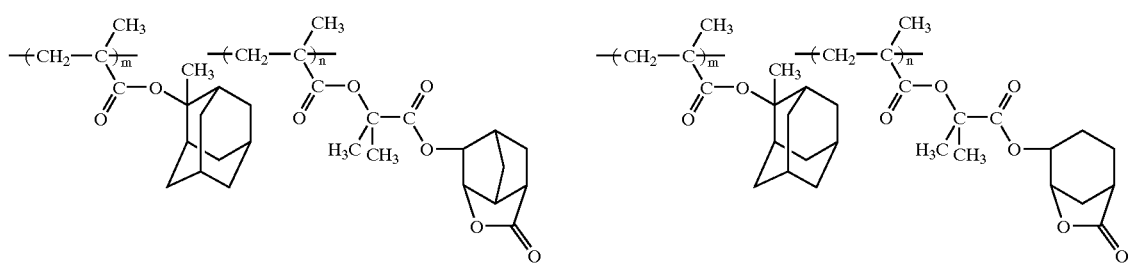

-continued
(33)
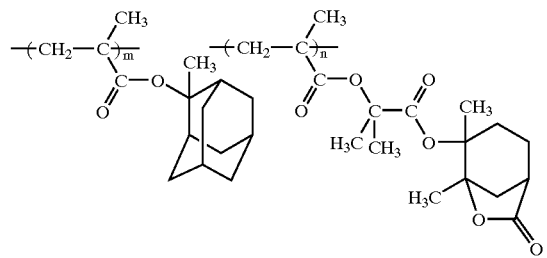
(34)
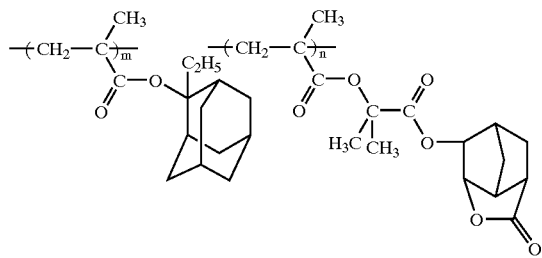
(35)
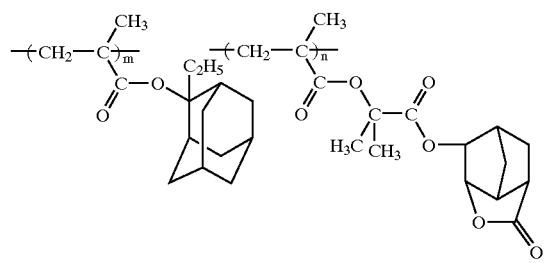
(36)
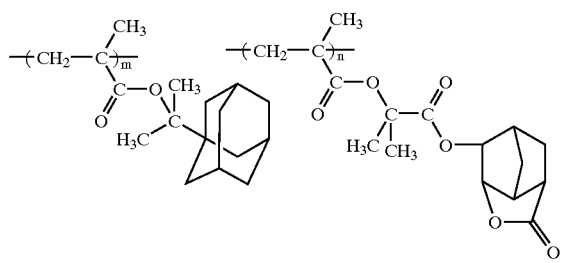
(37)
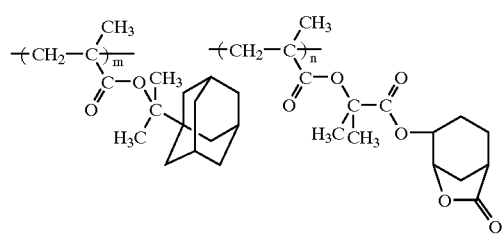
(38)
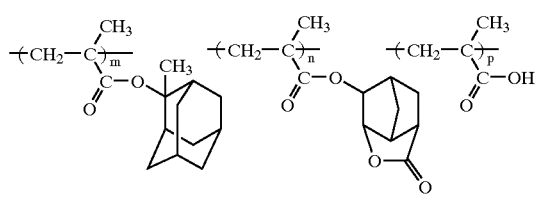
(39)
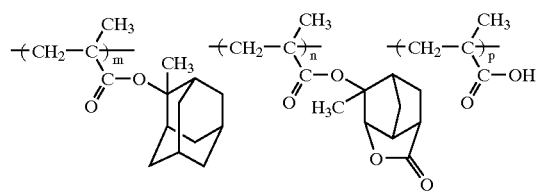
(40)
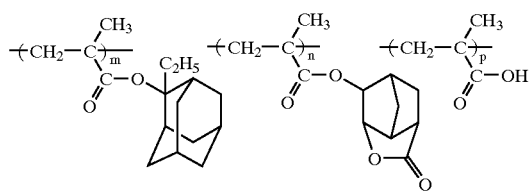
(41)
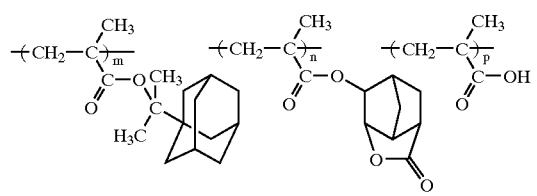
(42)
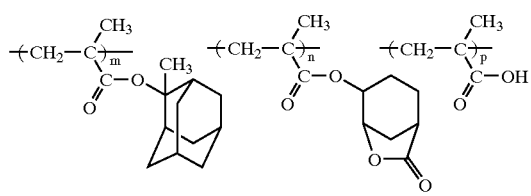
(43)
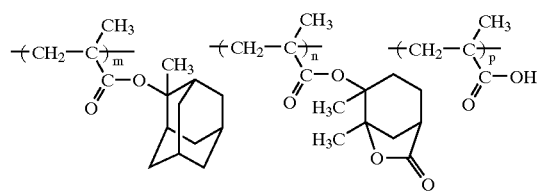
(44)
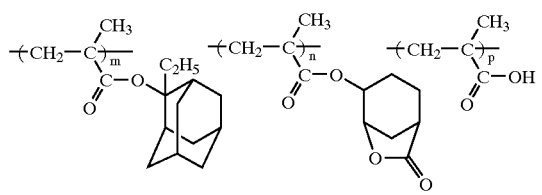

-continued
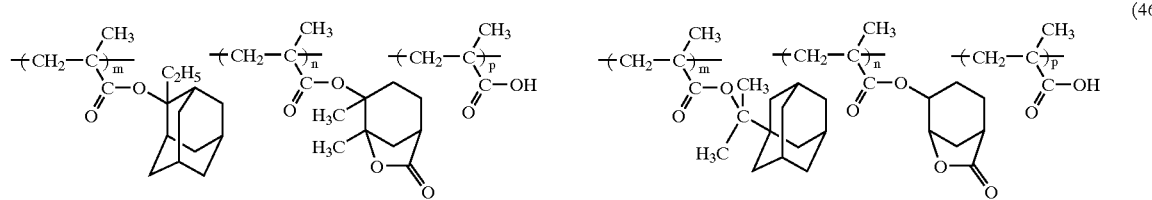
(45)
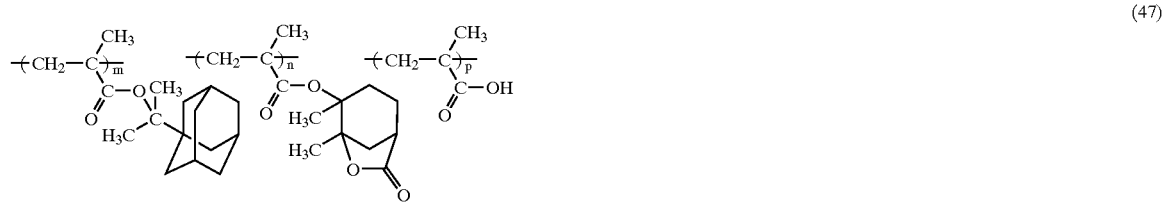
(46)
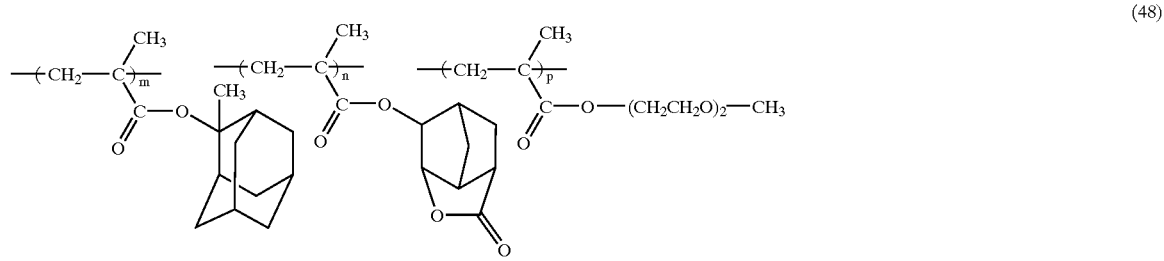
(47)
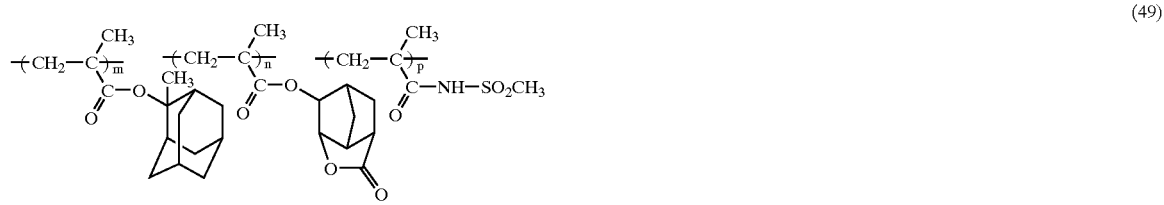
(48)
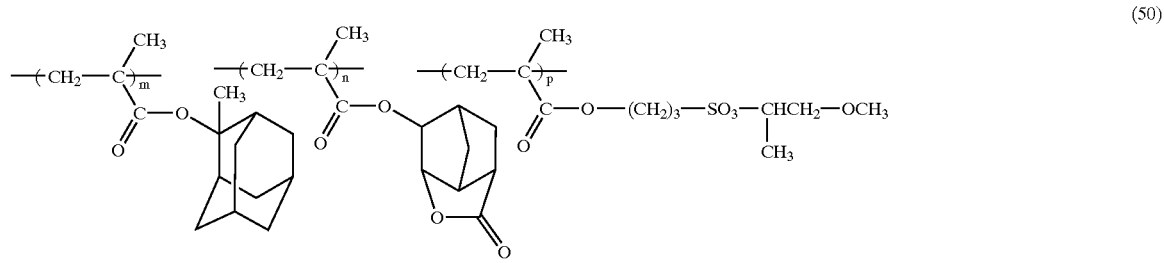
(49)
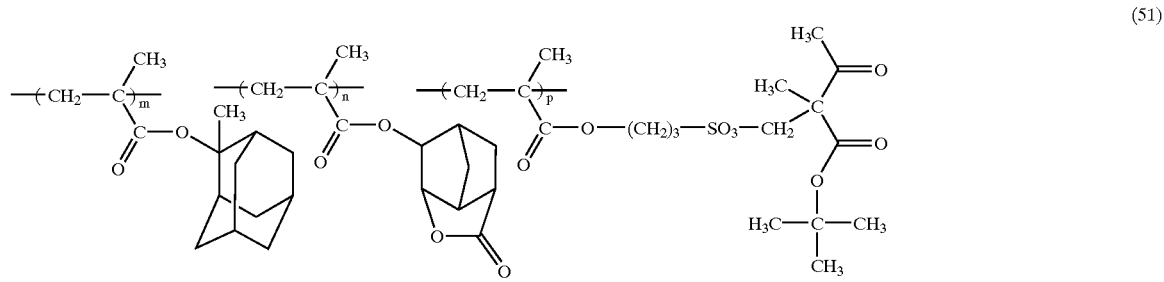
(50)
(51)
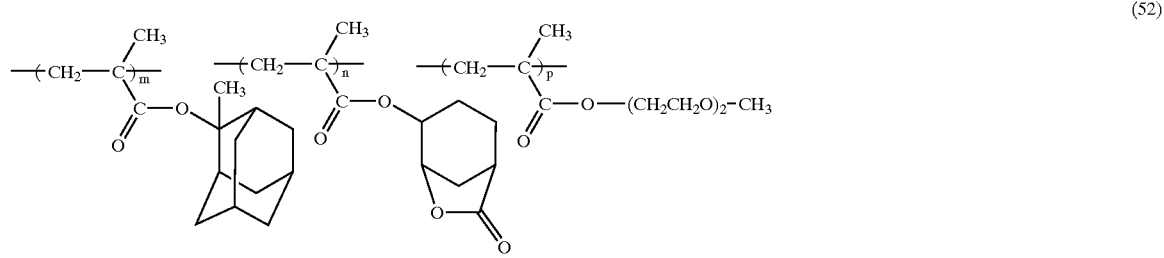
(52)

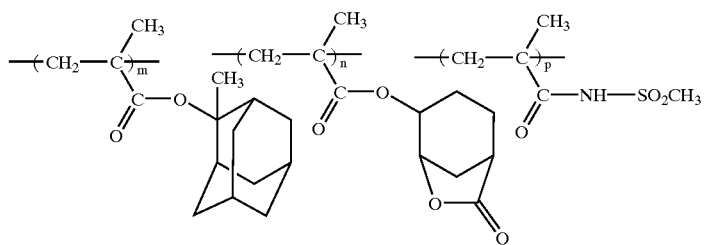
(53)
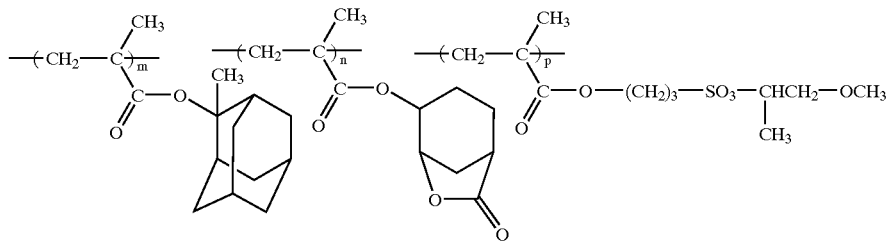
(54)
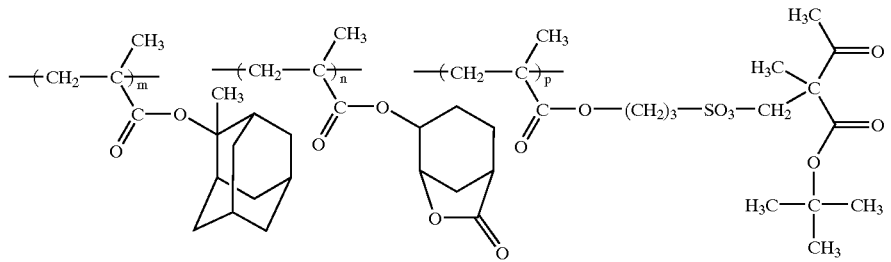
(55)
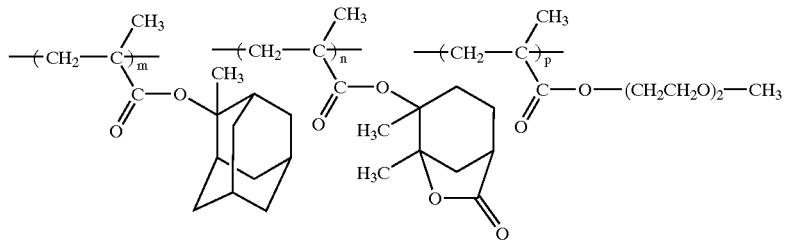
(56)
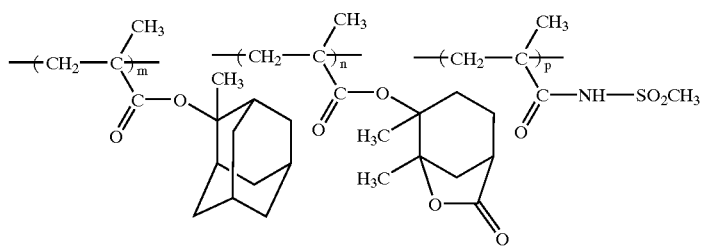
(57)
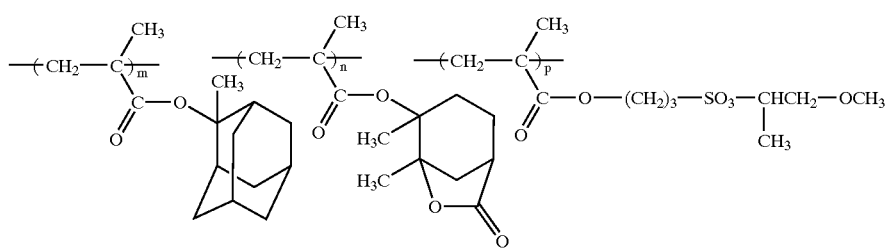
(58)

-continued (59)

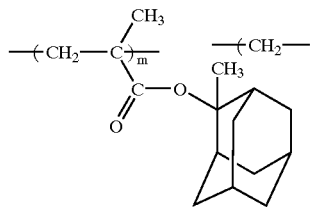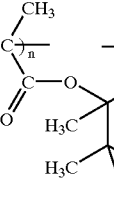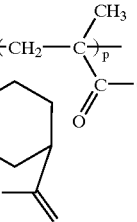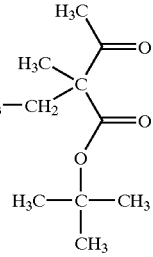

In the above structural formulae, m, n and p, or n1, n2 and n3 each represents the molar ratio of the repeating unit. The molar ratio of the repeating unit represented by one of formulae (I-1) to (I-4) is designated n, and in cases where two or more kinds of repeating units were combined, the molar ratios were designated n1, n2, etc. for differentiation. The molar ratio of the repeating unit having an alicyclic hydrocarbon structure represented by formulae (pI) to (pVI) is designated m. The molar ratio of the repeating unit represented by formulae (III-a) to (III-d) is designated p.

In cases where the repeating unit represented by formulae (III-a) to (III-d) is included, the ratio of m/n/p lies in the range of (25–70)/(25–65)/(3–40). On the other hand, when the repeating unit represented by formulae (III-a) to (III-d) is not included, the ratio of m/n lies in the range of (30–70)/(70–30). These resins may be block or random copolymers, and regularly or irregularly structured.

In the positive photoresist composition for deep UV exposure of the invention, the content of the resin in (B) should preferably be 40 to 99.99% by weight, more preferably 50 to 99.97% by weight of the total solid content of the composition.

[3] (C) Dissolution-inhibiting Compound

In addition to the resin and a photo-acid generator described hereinabove, the positive photo-sensitive composition of the invention contains, as a dissolution-inhibiting compound, a compound represented by the above-cited general formula (CI) or (CII), or a compound that has at least two structures comprising at least one substituent including a carboxylic acid protected with an acid-labile group on a polycyclic structure represented by the above-cited general formula (CIII).

In general formula (CI), X represents an oxygen atom or a sulfur atom, —N(R$_{53}$)— or a single bond.

The alkyl group for R$_{51}$, R$_{52}$ and R$_{53}$ in general formula (CI) is preferably those with 1 to 8 carbon atoms such as methyl, ethyl, n-propyl, isopropyl, n-butyl, isobutyl sec-butyl, t-butyl, hexyl, 2-ethylhexyl or octyl.

In general formula (CI), —C(=O)—O—R' is the group that is decomposed by the action of an acid, sometimes called acid-decomposable group.

Here, R' represents a tertiary alkyl group (preferably with 4 to 20 carbon atoms) such as t-butyl, methoxy-t-butyl and t-amyl, isobornyl group, a substituted or unsubstituted 1-alkoxyethyl group (preferably with 2 to 10 carbon atoms) such as 1-ethoxyethyl, 1-butoxyethyl, 1-isobutoxyethyl, 1-cyclohexyloxyethyl and 1-[2-(n-butoxy)ethoxy], an alkoxymethyl group (preferably with 2 to 10 carbon atoms) such as 1-methoxymethyl and 1-ethoxymethyl, substituted or unsubstituted tetrahydropyranyl and tetrahydrofuranyl groups, a trialkylsilyl group (preferably with 3 to 20 carbon atoms) such as trimethylsilyl, t-butylsilyl and diisopropylmethylsilyl, and 3-oxocyclohexyl group.

The tertiary alkyl group represented by R' may form an alicyclic ring. Preferable substituents for the alkoxymethyl and alkoxyethyl groups include a halogen atom, —(OCH$_2$CH$_2$)$_2$OCH$_3$, —S(CH$_2$)$_2$CH$_3$, —SC(CH$_3$)$_3$, —O-adamantane and —O—CO-admantane. Preferable substitutents for the tetrahydropyranyl and tetrahydrofuranyl groups include a carbonyl group and an alkyl group with 1 to 5 carbon atoms.

R represents an n1-valent moiety containing a bridge-containing hydrocarbon, a saturated cyclic hydrocarbon or a naphthalene ring. The n1-valent moiety containing a bridge-containing hydrocarbon includes adamantane, norbornane, tricyclodecane, tetracycloundecane or pynene having n1 bonding hands. The n1-valent moiety containing the saturated cyclic hydrocarbon includes a terpene and steroid having n1 bonding hands. The n1-valent moiety containing naphthalene ring includes the naphthalene ring having n1 bonding hands.

The above-cited bridge-containing hydrocarbon, the saturated cyclic hydrocarbon or the naphthalene ring may have a substituent at the position except the sites of the bonding hands. Preferable substituents include hydroxyl group, a halogen atom, cyano group, an alkyl group with 1 to 4 carbon atoms, an alkoxy group with 1 to 4 carbon atoms, an acyl group with 2 to 5 carbon atoms, an acyloxy group with 2 to 5 carbon atoms, an alkoxycarbonyl group with 2 to 5 carbon atoms and an alkoxyalkyleneoxy group with 2 to 10 carbon atoms and which may be substituted with an alkoxy or alkoxyalkyleneoxy group.

q1 represents an integer of 0 to 10, preferably of 0 to 7, and more preferably 0 to 5.

R$_{60}$ in general formula (CII) includes an alkyl group with 1 to 8 carbon atoms such as methyl, ethyl, n-propyl, isopropyl, n-butyl, isobutyl, sec-butyl, t-butyl, hexyl, 2-ethylhexyl and octyl.

The group —O—R$_{61}$ in general formula (CII) indicates the group that is decomposed by the action of an acid also called acid-decomposable group.

Preferable groups for R$_{61}$ include a tertiary alkyl group preferably with 4 to 20 carbon atoms such as t-butyl, methoxy-t-butyl and t-amyl, a 1-alkoxyethyl group preferably with 2 to 10 carbon atoms that may be substituted such as 1-ethoxyethyl, 1-butoxyethyl, 1-isobutoxyethyl, 1-cyclohexyloxyethyl and 1-[2-(n-butoxy)ethoxy]ethyl, an alkoxymethyl group preferably with 2 to 10 carbon atoms that maybe substituted such as 1-methoxymethyl and 1-ethoxymethyl, a tertiary alkoxycarbonyl group preferably with 4 to 20 carbon atoms such as t-butoxycarbonyl group and t-amyloxycarbonyl, tetrahydropyranyl group that may be substituted, tetrahydrofuranyl group that maybe substituted, trialkylsilyl groups such as trimethylsilyl, t-butyldimethylsilyl and diisopropylmethylsilyl, and 3-oxocyclohexyl group.

When one of q1, n1, m1 and p1 represents an integer of 2 or more, the represented plural moieties may be the same or different.

The compound represented by general formula (CI) or (CII) of the invention can be synthesized by reacting a carboxylic acid derivative such as the corresponding carboxylic acid or acid chloride or a corresponding naphthol derivative with R'—OH, R'—X (X represents halogen.) or the corresponding olefin, or by reacting a naphthol derivative with a dialkoxycarbonyl ether.

In the positive photosensitive composition of the invention, the dissolution-suppressing agent (dissolution-inhibiting agent) represented by general formula (CI) or (CII) may be used individually or in combination of two or more thereof.

The total amount of the compound represented by general formula (CI) or (CII) is usually 1 to 40% by weight, preferably 3 to 30% by weight of the total solid content in the composition of the invention.

Some specific examples of the compound represented by general formulae (CI) and (CII) will be given below with the codes of from [CI-1] to [CI-108] for the former, and from [CII-1] to [CII-52] for the latter. However, the scope of the invention is not restricted to those examples at all.

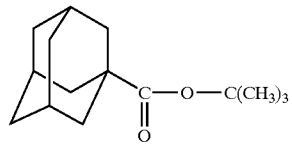
[CI-1]

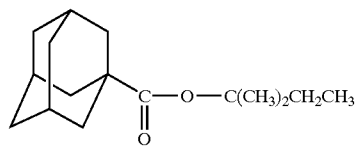
[CI-2]

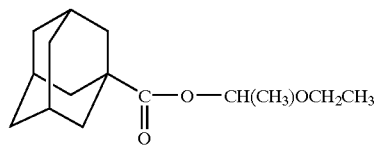
[CI-3]

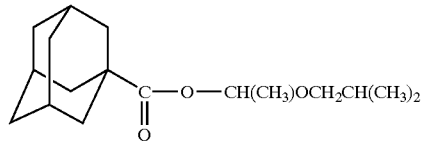
[CI-4]

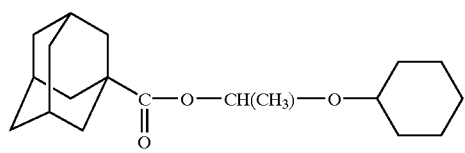
[CI-5]

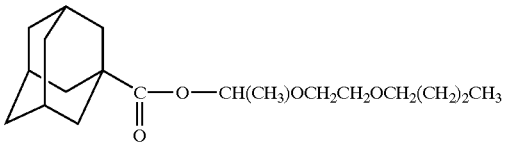
[CI-6]

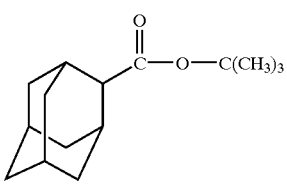
[CI-7]

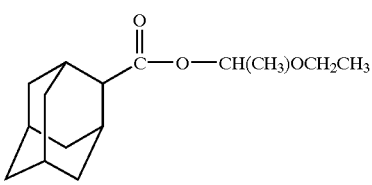
[CI-8]

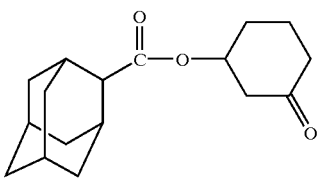
[CI-9]

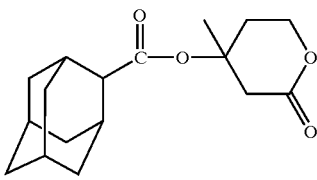
[CI-10]

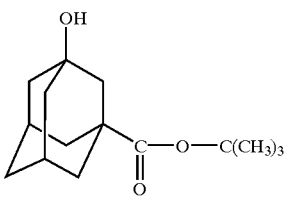
[CI-11]

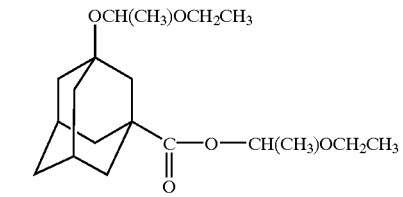
[CI-12]

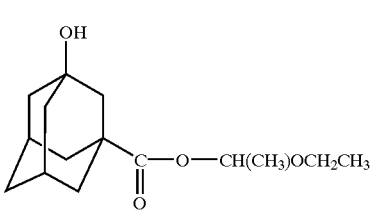
[CI-13]

[CI-14]
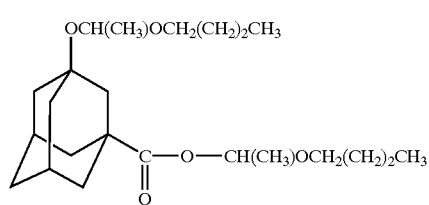
[CI-15]
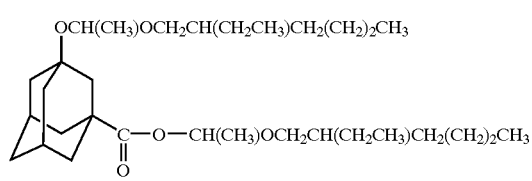
[CI-16]
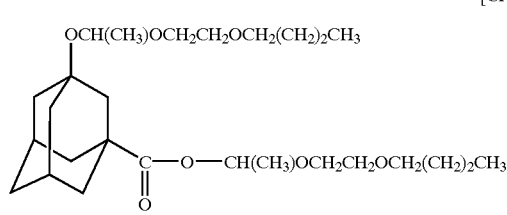
[CI-17]
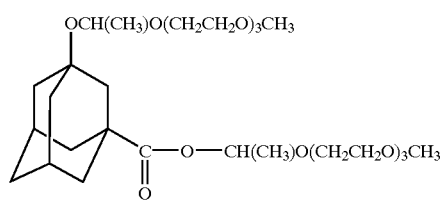
[CI-18]
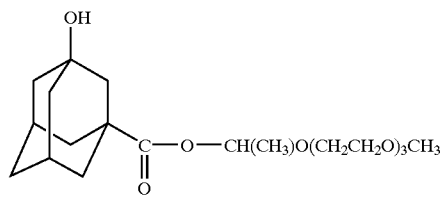
[CI-19]
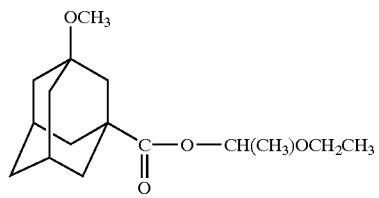
[CI-20]
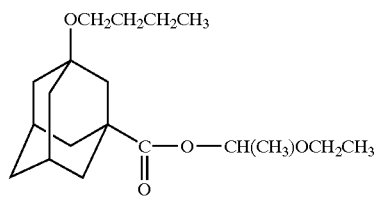
[CI-21]
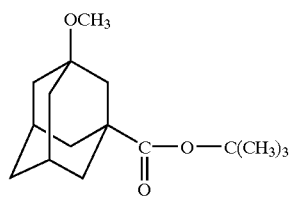
[CI-22]
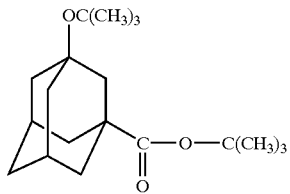
[CI-23]
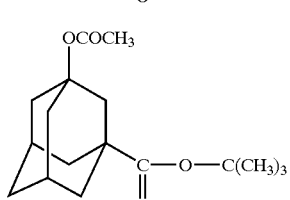
[CI-24]
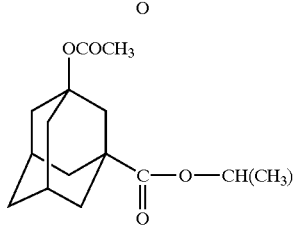
[CI-25]
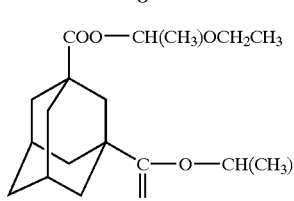
[CI-26]
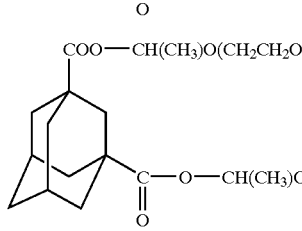
[CI-27]
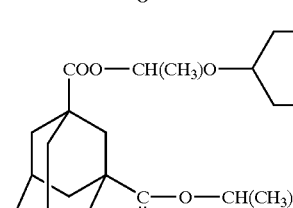
[CI-28]
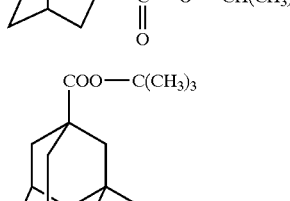
[CI-29]
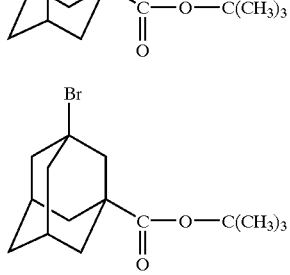

-continued
[CI-30] 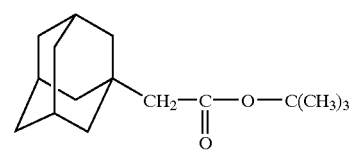
[CI-31] 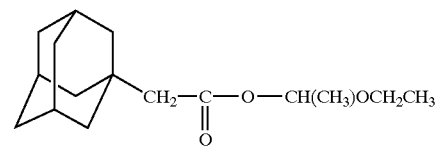
[CI-32] 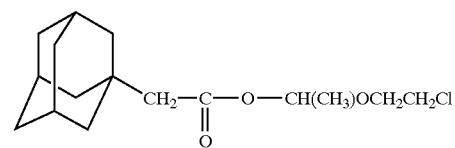
[CI-33] 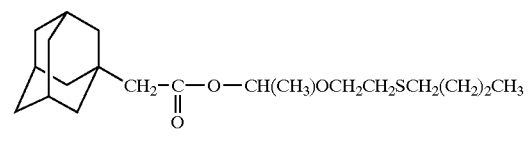
[CI-34] 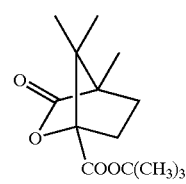
[CI-35] 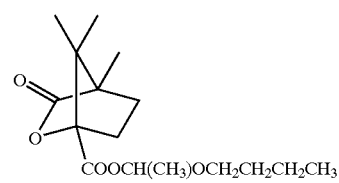
[CI-36] 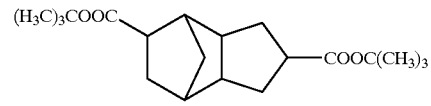
[CI-37] 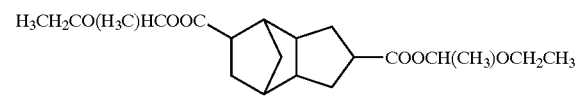
[CI-38] 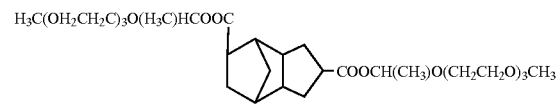
[CI-39] 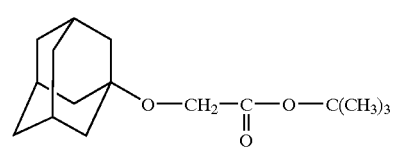
-continued
[CI-40] 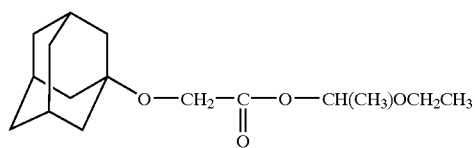
[CI-41] 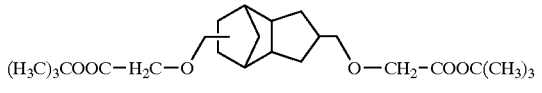
[CI-42] 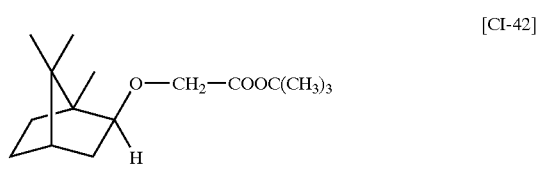
[CI-43] 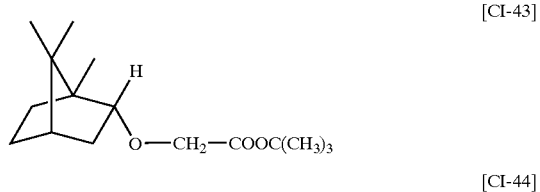
[CI-44] 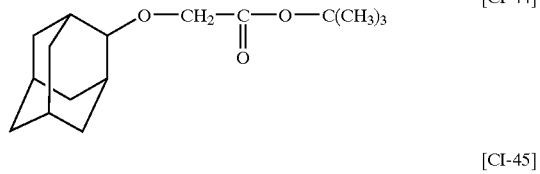
[CI-45] 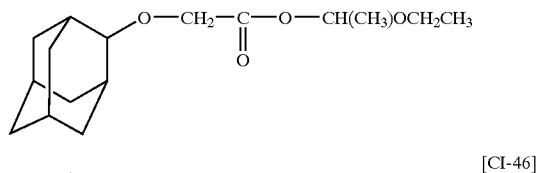
[CI-46] 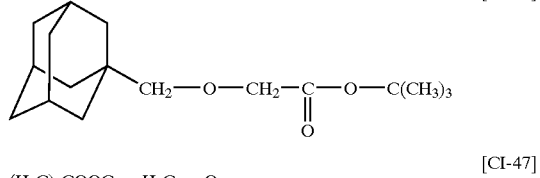
[CI-47] 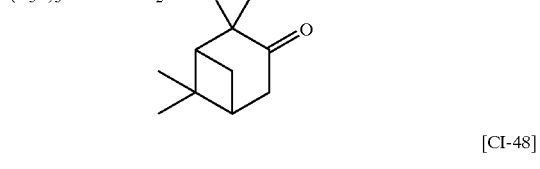
[CI-48] 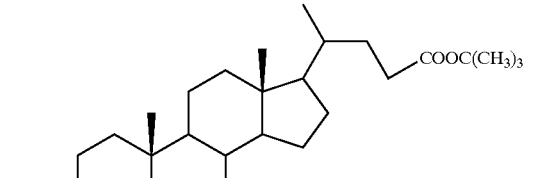

-continued
[CI-49]
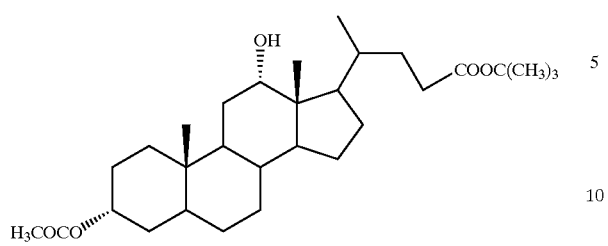
[CI-50]
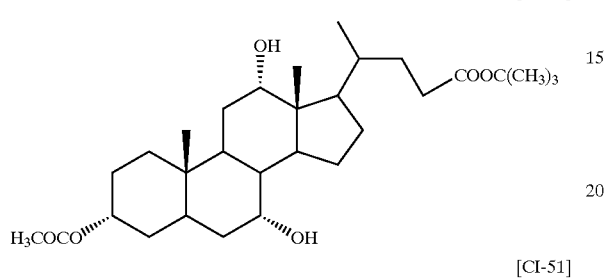
[CI-51]
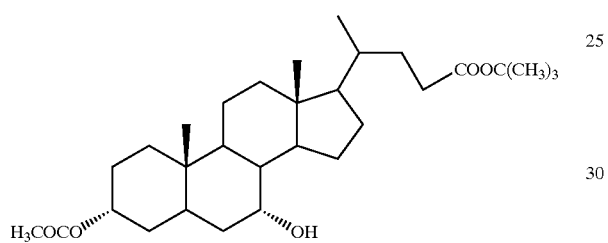
[CI-52]
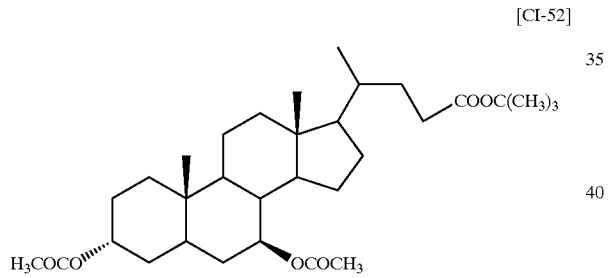
[CI-53]
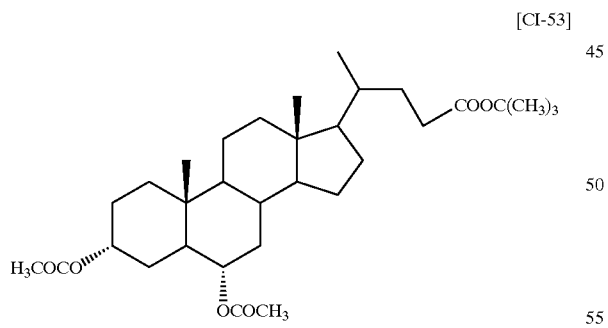
[CI-54]
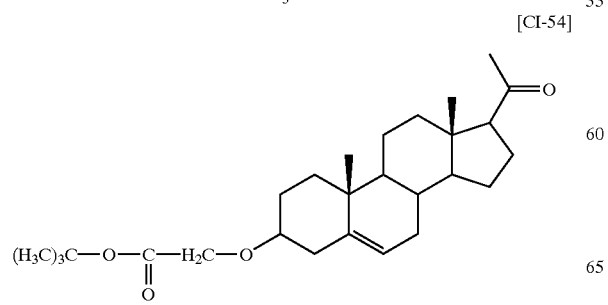
-continued
[CI-55]
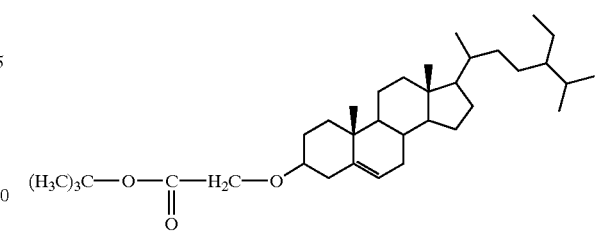
[CI-56]
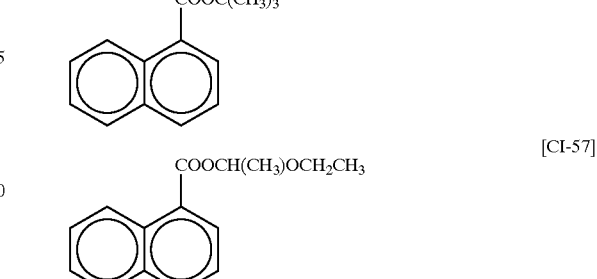
[CI-57]
[CI-58]
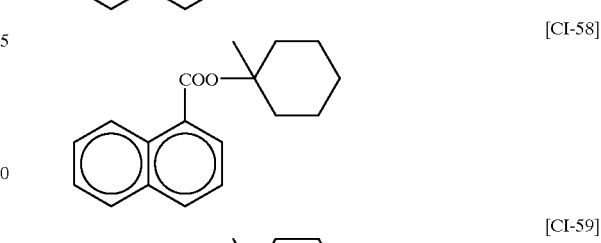
[CI-59]
[CI-60]
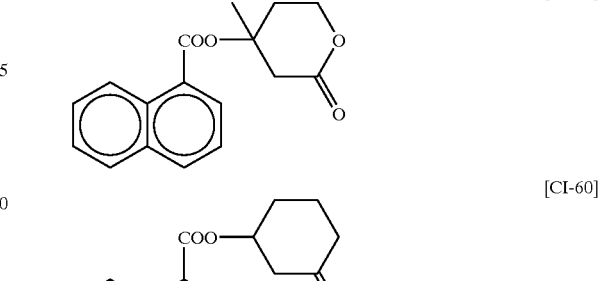
[CI-61]
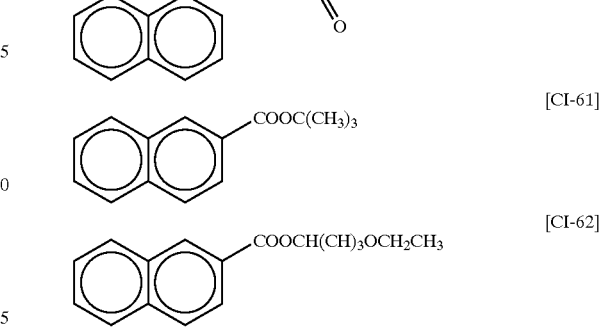
[CI-62]
[CI-63]
[CI-64]
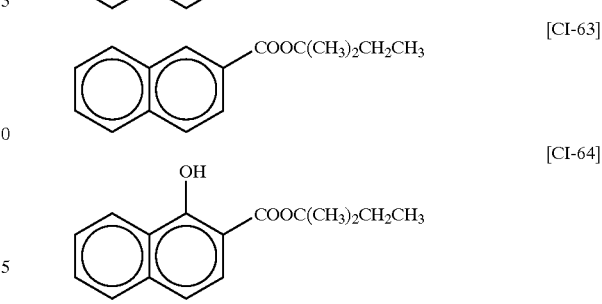

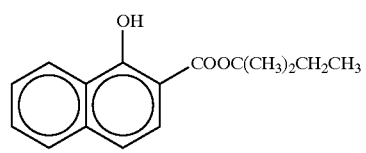
[CI-65]
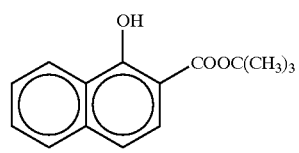
[CI-66]
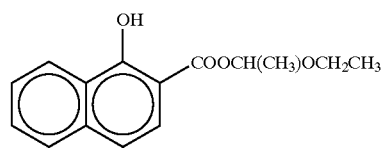
[CI-67]
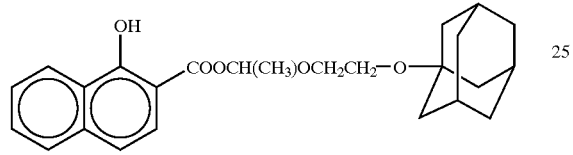
[CI-68]
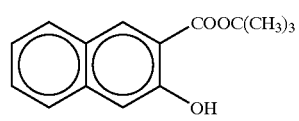
[CI-69]
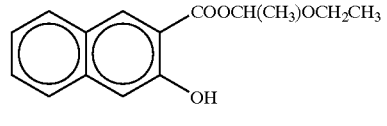
[CI-70]
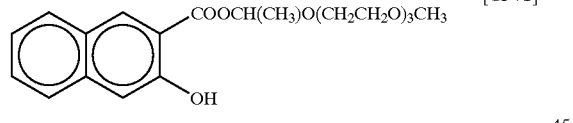
[CI-71]
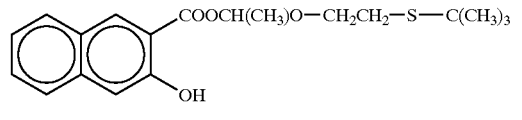
[CI-72]
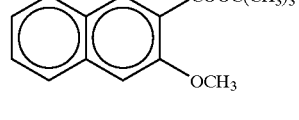
[CI-73]
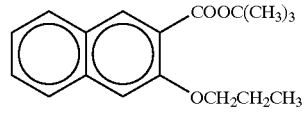
[CI-74]
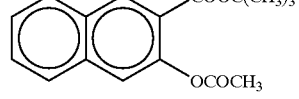
[CI-75]
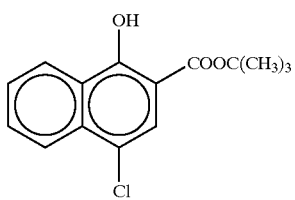
[CI-76]
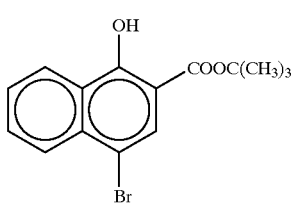
[CI-77]
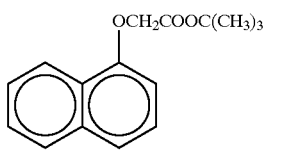
[CI-78]
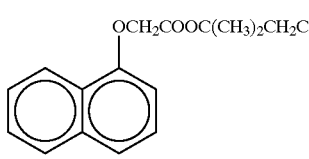
[CI-79]
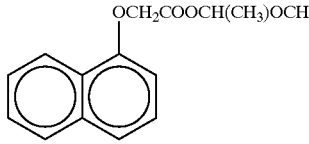
[CI-80]
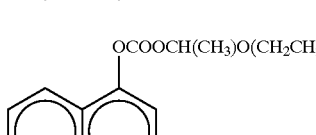
[CI-81]
[CI-82]
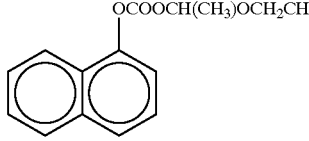
[CI-83]
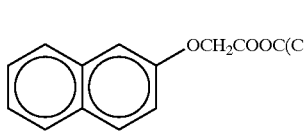
[CI-84]
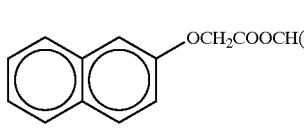

-continued
[CI-85]
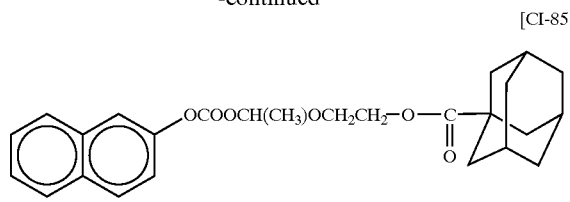
[CI-86]
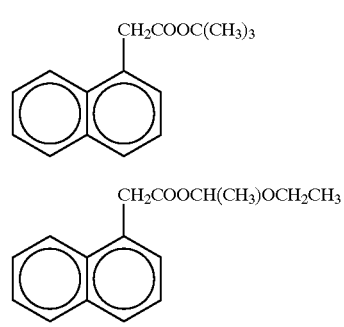
[CI-87]
[CI-88]
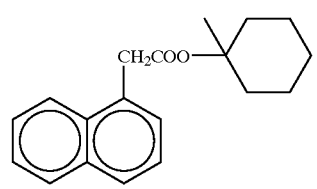
[CI-89]
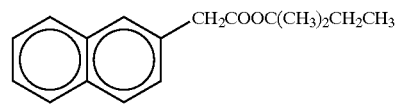
[CI-90]
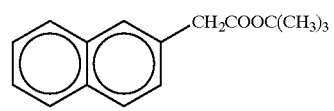
[CI-91]
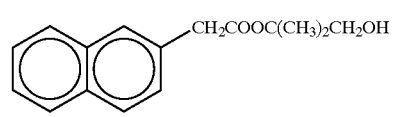
[CI-92]
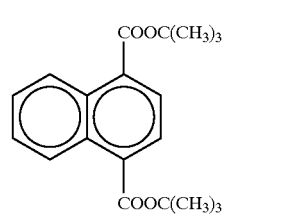
[CI-93]
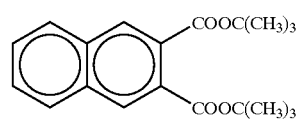
[CI-94]
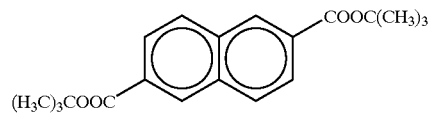
[CI-95]
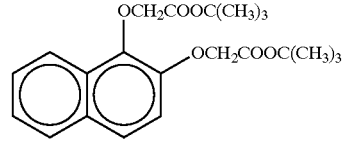
-continued
[CI-96]
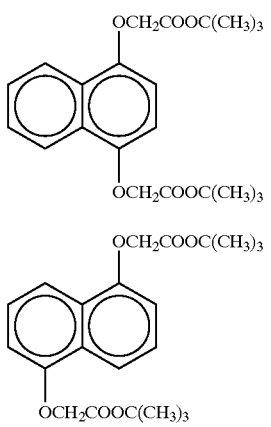
[CI-97]
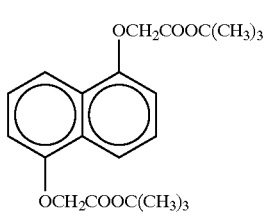
[CI-98]
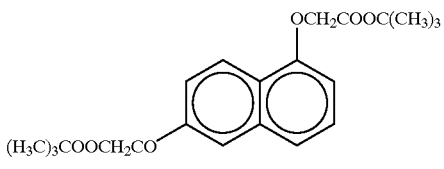
[CI-99]
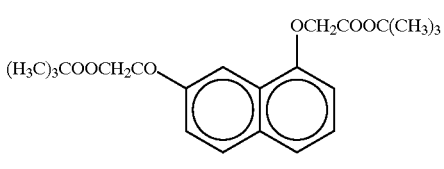
[CI-100]
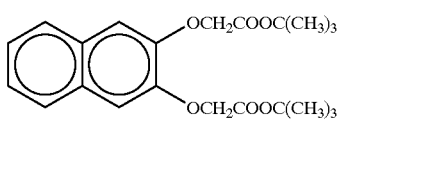
[CI-101]
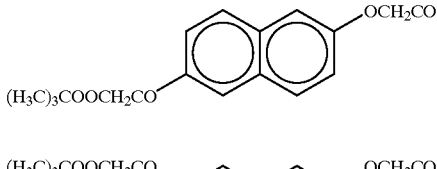
[CI-102]
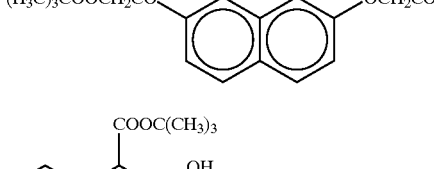
[CI-103]
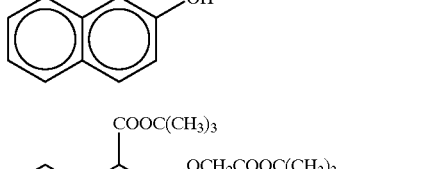
[CI-104]
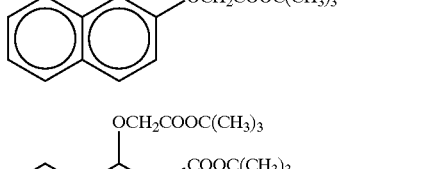
[CI-105]

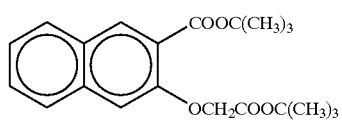
[CI-106]
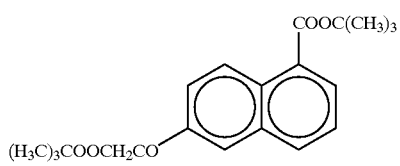
[CI-107]
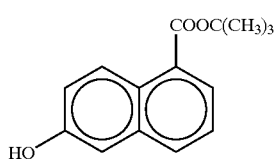
[CI-108]
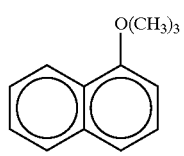
[CII-1]
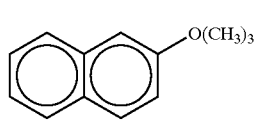
[CII-2]
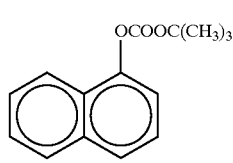
[CII-3]
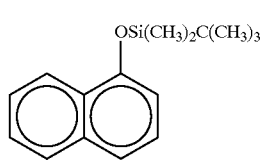
[CII-4]
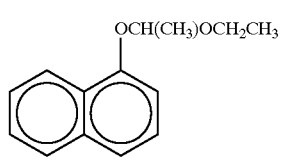
[CII-5]
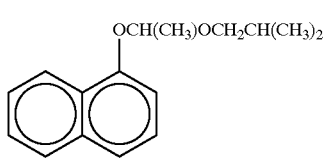
[CII-6]
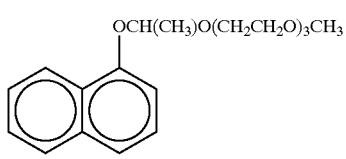
[CII-7]
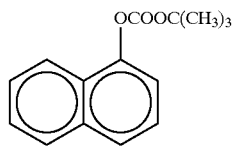
[CII-8]
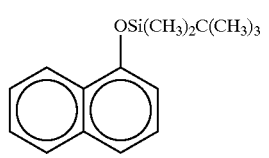
[CII-9]
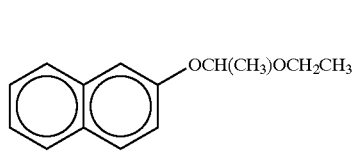
[CII-10]
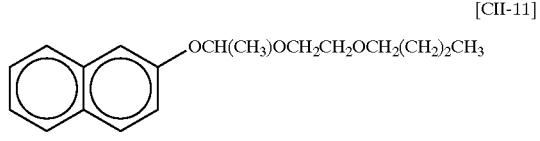
[CII-11]
[CII-12]
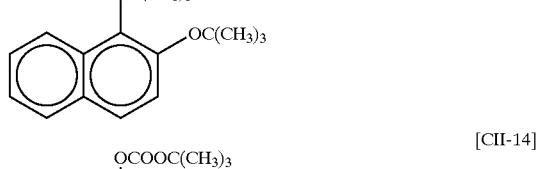
[CII-13]
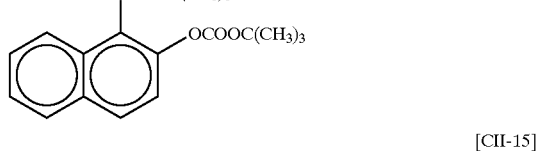
[CII-14]
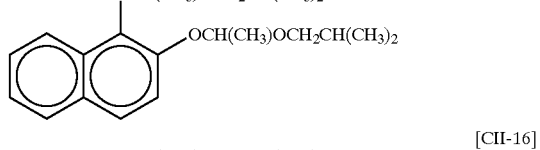
[CII-15]
[CII-16]
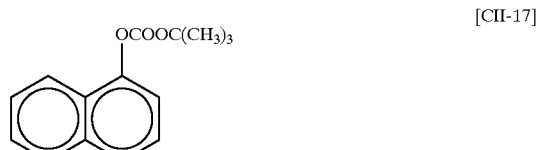
[CII-17]
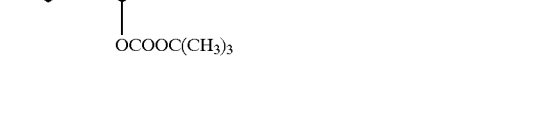

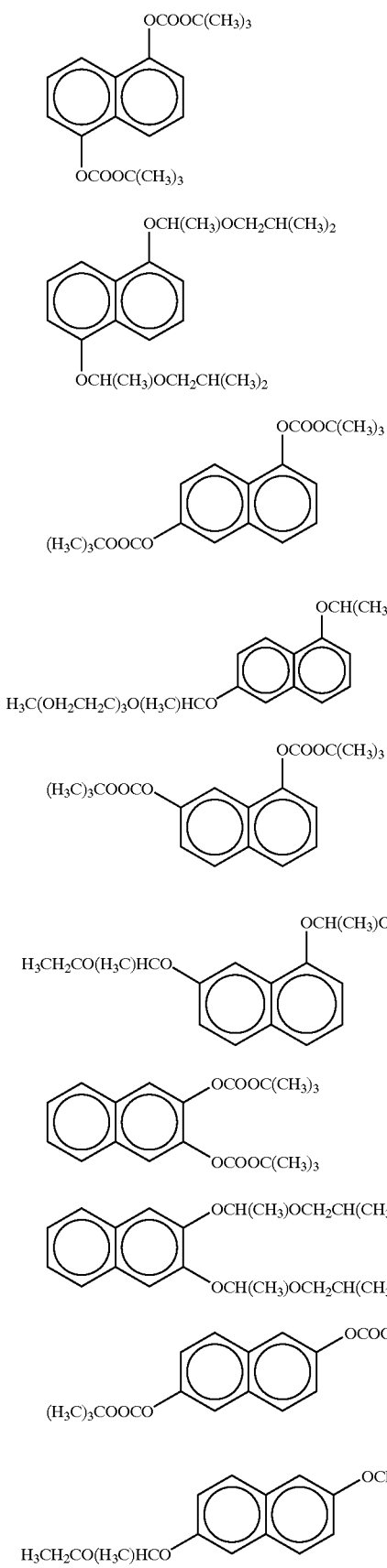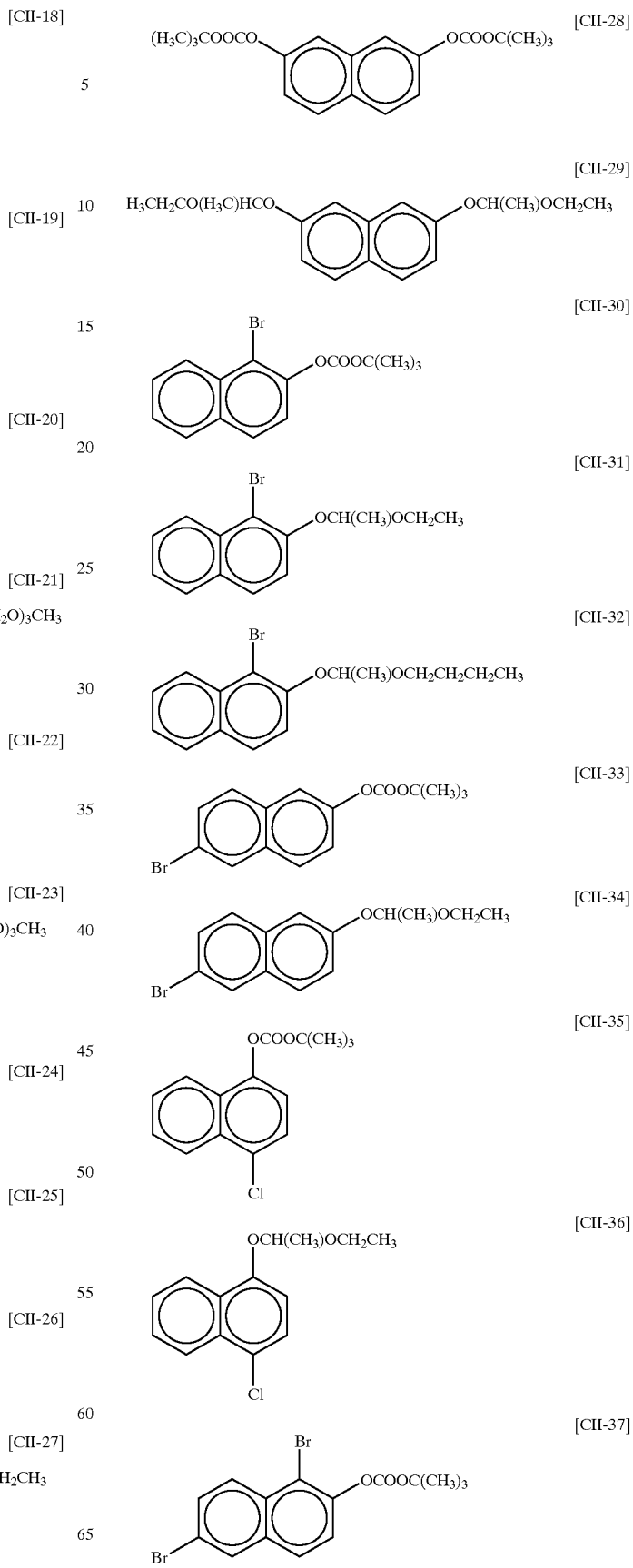

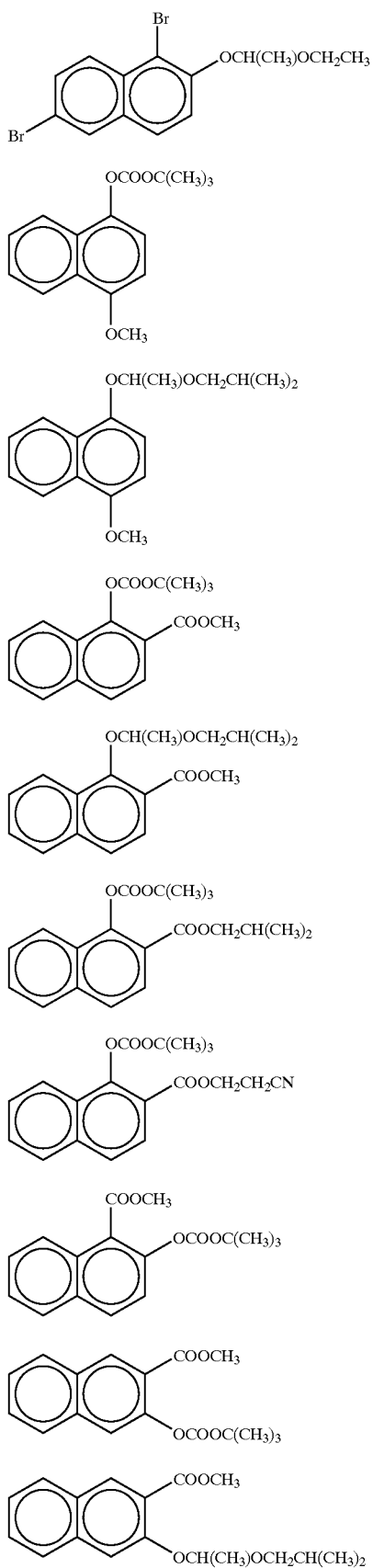

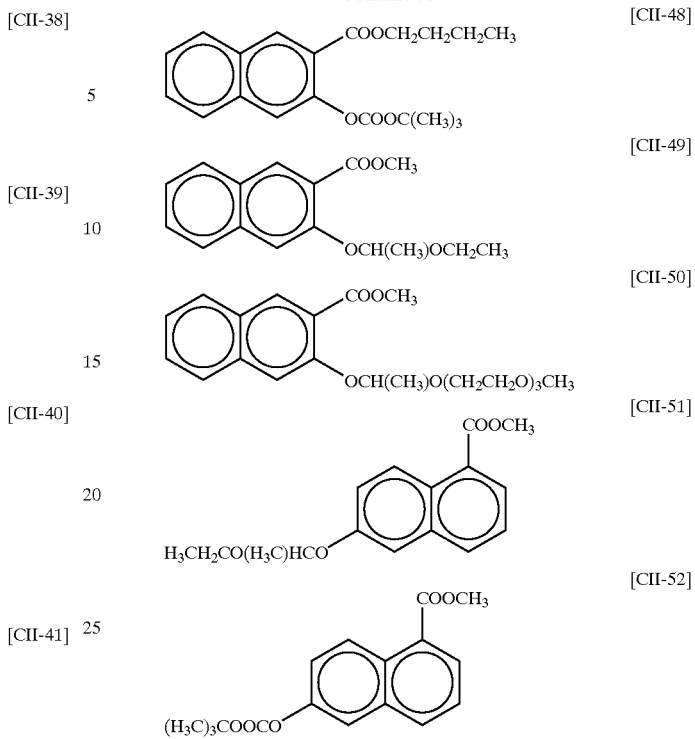

Now, as another embodiment of the invention, a dissolution-suppressing compound that has at least two structures each comprising at least one substituent including a carboxylic acid protected by an acid-labile group on a polycyclic structure represented by the above-cited general formula (CIII) will be described. This kind of dissolution-suppressing agent is called oligomer type.

The oligomer type dissolution-suppressing agent can be obtained by reacting a saturated polycyclic hydrocarbon (A) that preferably comprises a polycyclic structure represented by the general formula (CIII) and at least one substituent thereon containing one of the acid-labile groups mentioned previously and at least one hydroxyl group with a linear, branched-chain or cyclic bifunctional saturated hydrocarbon (B) (wherein the functional group is a carboxylic acid or carboxylic acid halide exemplified by chloride). The reaction gives rise to a condensation product.

Such a condensation reaction product contains 2 to 50 polycyclic parts originating from the saturated polycyclic hydrocarbon (A). The number of the polycyclic parts per molecule fluctuates depending on the advance of condensation reaction. The condensation reaction product usually contains 2 to 30, preferably 2 to 10, polycyclic parts on average.

As the bifunctional saturated hydrocarbon (B), those with 1 to 15 carbon atoms are preferred including the dicarboxylic acid or dicarboxylic acid halide of an alkane, alkoxyalkane, cycloalkane and polycycloalkane.

The substituent (except the functional group) having an acid-labile group in the saturated polycyclic hydrocarbon (A) should preferably contain 2 to 12 carbon atoms. In cases where the substituent contains 9 or more carbon atoms, the saturated polycyclic hydrocarbon (A) should preferably have at least 2 hydroxyl groups.

The saturated polycyclic hydrocarbon compound (A) contains a carboxylic group protected by an acid-labile group. The protection of a carboxylic acid group by an acid-labile group reduces the solubility of the resulting compound in an aqueous alkaline solution. Accordingly, the dissolution-suppressing agent containing such an acid-labile group provides the resist composition prior to the exposure to an active radiation with a desirable insolubility in aqueous alkalis.

The exposure to an active radiation, or generally a post-baking operation yields a carboxylic acid group through the separation of the acid-labile group in an amount enough to make the resist composition dissolvable in aqueous alkalis. Preferable acid-labile groups include, for example, t-butyl, t-amyl, 1-methylcyclohexyl, 3-oxocyclohexyl, bis(2-trimethylsilyl)ethyl and still other substituents readily released under the presence of a photo-acid. These various acid-labile groups are well known in the art. Further, as the acid-labile group, a tertiary alkyl group preferably with 4 to 20 carbon atoms such as t-butyl, methoxy-t-butyl and t-amyl, a 1-alkoxyethyl group preferably with 2 to 10 carbon atoms that may be substituted such as 1-ethoxyethyl, 1-butoxyethyl, 1-isobutoxyethyl, 1-cyclohexyloxyethyl and 1-[2-(n-butoxy) ethoxy] ethyl, an alkoxymethyl group preferably with 2 to 10 carbon atoms that may be substituted such as 1-methoxymethyl and 1-ethoxymethyl, tetrahydrofuranyl group that may be substituted, trialkylsilyl groups such as trimethylsilyl, t-butyldimethylsilyl and diisopropylmethylsilyl, and 3-oxocyclohexyl group are exemplified, which are the groups defined as $R_{61}$ of formula (CII). In the presence of an acid, these groups yield a free carboxylic acid and, an acidolysis or acid-catalyzed hydrolysed product.

Saturated polycyclic hydrocarbon compound (A) preferably contains 1 to 3 hydroxyl groups, which are preferably attached to a 6-membered ring. Cholic acid esters are examples of the polycyclic compound having three hydroxyl groups in the polycyclic part wherein one hydroxyl group is attached to each 6-membered ring. Deoxycholic acid esters are examples of the polycyclic compounds having two hydroxyl groups in the polycyclic part wherein one hydroxyl group is attached to each of two 6-membered rings.

The positive photoresist composition of the invention may contain, as a dissolution-suppressing agent, a cholic acid ester having the following molecular structure represented by the following general formula (IV), in addition to the oligomer-type dissolution-suppressing agent.

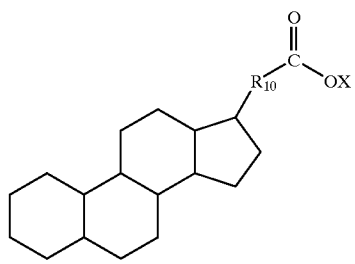

(IV)

(In the formula (IV), X represents an acid-labile group, $R_{10}$ may not be present, but, when present, represents a lower alkylene group with up to 6 carbon atoms exemplified by butylene and isobutylene. The polycyclic part contains one or more hydroxyl groups.)

The polycyclic part of the compound represented by the general formula (IV) contains one or more hydroxyl groups, and the hydroxyl group is generally attached to a 6-membered ring. Cholic acid esters are examples of the polycyclic compound having three hydroxyl groups in the polycyclic part wherein one hydroxyl group is attached to each 6-membered ring. Deoxycholic acid esters are examples of two hydroxyl groups in the polycyclic part wherein one hydroxyl group is attached to each of two 6-membered rings.

In the case where the oligomer-type dissolution-suppressing agent is used in conjunction with the cholic acid ester (which will be called monomeric compound hereinafter), the oligomer-type agent should preferably occupy 90 to 10% by weight of all the dissolution-suppressing agent while the monomeric compound occupies 10 to 90% by weight.

The content of the oligomer-type dissolution-suppressing agent, or that of the sum with the monomeric compound for the case of joint use thereof should preferably be 1 to 40% by weight, more preferably 3 to 30% by weight of the total solid content of the composition.

[4] (D) Organic Basic Compound

Organic basic compounds (D) preferably used in the invention are those that are more basic than phenol. In particular, nitrogen-containing basic compounds are favorable.

By incorporating an organic basic compound (D) to the composition, sensitivity shift taking place in time elapsing is minimized. Examples of the organic basic compound (D) include those containing a structure represented by the following formula.

(A)

In the formula, $R^{250}$, $R^{251}$ and $R^{252}$ each independently represents a hydrogen atom, an alkyl group with 1 to 6 carbon atoms, an aminoalkyl group with 1 to 6 carbon atoms, a hydroxyalkyl group with 1 to 6 carbon atoms, a substituted or unsubstituted aryl group with 6 to 20 carbon atoms: and $R^{251}$ and $R^{252}$ may combine together to form a ring.

(B)

(C)

(D)

(E)

(In the formula, $R^{253}$, $R^{254}$, $R^{255}$ and $R^{256}$ each independently represents an alkyl group with 1 to 6 carbon atoms.)

More preferable compounds are nitrogen-containing basic compounds having two or more nitrogen atoms each lying in different chemical environments within a single molecule. Particularly preferable compounds are those containing a substituted or unsubstituted amino group together with a nitrogen-containing cyclic structure, or those containing an alkylamino group. Preferable examples of such compounds include substituted or unsubstituted guanidines, substituted or unsubstituted aminopyridines, substituted or unsubstituted aminoalkylpyridines, substituted or unsubstituted aminopyrrolidines, substituted or unsubstituted indazoles, substituted or unsubstituted pyrazoles, substituted or unsubstituted pyrazines, substituted or unsubstituted pyrimidines, substituted or unsubstituted purines, substituted or unsubstituted imidazolines, substituted or unsubstituted pyrazolines, substituted or unsubstituted piperazines, substituted or unsubstituted aminomorpholines and substituted or unsubstituted aminoalkylmorpholines. Preferable substituents include an amino group, an aminoalkyl group, an alkylamino group, an aminoaryl group, an arylamino group, an alkyl group, an alkoxy group, an acyl group, an acyloxy group, an aryl group, an aryloxy group, nitro group, hydroxyl group and cyano group.

Specific examples of preferable nitrogen-containing basic compounds include guanidine, 1,1-dimethylguanidine, 1,1,3,3-tetramethylguanidine, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-aminoethylpyridine, 4-aminoethylpyridine, 3-aminopyrrolidine, piperazine, N-(2-aminoethyl)piperadine, N-(2-aminoethyl)piperidine, 4-amino-2,2,6,6-tetramethylpiperidine, 4-piperidinopiperidine, 2-iminopiperidine, 1-(2-aminoethyl)pyrrolidine, pyrazole, 3-amino-5-methylpyrazole, 5-amino-3-methyl-1-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine, N-(2-aminoethyl)morpholine, 1,5-diazabicyclo{4.3.0}nona-5-ene, 1,8-diazabicyclo[5.4.0]undeca-7-ene, 1,4-diazabicyclo[2.2.2]octane, 2,4,5-triphenylimidazole, tertiary morpholine derivatives such as N-methylmorpholine, N-ethylmorpholine, N-hydroxyethylmorpholine, N-benzylmorpholine and cyclohexylmorpholinoethylthiourea (CHMETU) and the hindered amines set forth in Japanese Patent Laid-Open No. 52575/1999 (for example, those described in item [0005] therein). However, the scope of the invention is not restricted to these compounds.

More preferable examples include 1,5-diazabicyclo[4.3.0]nona-5-ene, 1,8-diazabicyclo[5.4.0]undeca-7-ene, 1,4-diazabicyclo[2.2.2]octane, 4-dimethylaminopyridine, hexamethylenetetramine, 4,4-dimethylimidazoline, pyrroles, pyrrazoles, imidazoles, pyridazine, pyrimidines, tertiary morpholines such as CHMETU, and hindered amines such as bis(1,2,2,6,6-pentamethyl-4-piperidyl) sebacate.

Among them, 1,5-diazabicyclo[4.3.0]nona-5-ene, 1,8-diazabicyclo[5.4.0]undeca-7-ene, 1,4-diazabicyclo[2.2.2] octane, 4-dimethylaminopyridine, hexamethylenetetramine, CHMETU, and bis(1,2,2,6,6-pentamethyl-4-piperidyl) sebacate are particularly preferred.

These nitrogen-containing compounds may be used individually or in combination of two or more thereof. The use amount of the organic basic compound is usually 0.001 to 10% by weight, preferably 0.01 to 5% by weight of the total solid content of the photo-sensitive resist composition. With a use amount below 0.001% by weight, no advantageous effect to be obtained by the addition of the organic basic compound is achieved.

On the other hand, a use amount exceeding 10% by weight tends to deteriorate the sensitivity of the resist as well as the developability at unexposed areas.

[5] (F) Surfactant Containing at Least One of a Fluorine Atom and a Silicon Atom, Applicable to the Composition of the Invention The positive photoresist composition of the invention preferably contains (F) surfactant containing at least one of a fluorine atom and a silicon atom. More specifically, the positive photoresist composition of the invention can contain one or more compounds selected from the group consisting of fluorine-containing surfactants, silicone-containing surfactants and those containing both of fluorine and silicon atoms.

By incorporating both of the acid-decomposable resin and the surfactant in the positive photoresist composition of the invention, one can improve the characteristic dependence on pattern pitch.

As such surfactants, those set forth, for example, in the following patents can be used. Japanese Patent Laid-Open Nos. 36,663/1987, 226,746/1986, 226,745/1986, 170,950/1987, 34,540/1988, 230,165/1995, 62,834/1996, 54,432/1997 and 5,988/1997, U.S. Pat. Nos. 5,405,720, 5,360,692, 5,529,881, 5,296,330, 5,436,098, 5,576,143, 5,296,143, 5,294,511 and 5,824,451. Moreover, the following commercially available surfactants can be used as they are.

Fluorine-containing or silicone-based surfactants such as Eftop EF301, EF303 and EF352 (all being products of Shin Akita Kasei Co., Ltd.), Florad FC430 and 431 (both being products of Sumitomo 3M, Ltd.), Megafac F171, F173, F176, F189 and R08 (all being products of Dainippon Ink and Chemicals, Inc.), Surflon S-382, SC101, 102, 103, 104, 105 and 106, (all being products of Asahi Glass Co., Ltd.), Troysol S-366 (a product of Troy Chemical Industries, Inc.). Apolysiloxane KP-341 (made by Shin-Etsu Chemical Co., Ltd.) can also be used as a silicone-based surfactant.

Such surfactants are added at an amount of usually 0.001 to 2% by weight, preferably 0.01 to 1% by weight of the total solid content in the composition of the invention. These surfactants may be used individually or in combination of two or more thereof.

In addition to those enumerated above, other useful surfactants specifically include noninic ones such as polyoxyethylene alkyl ethers exemplified by polyoxyethylene lauryl ether, polyoxyethylene stearyl ether, polyoxyethylene cetyl ether and polyoxyethylene oleyl ether; polyoxyethylene alkylaryl ether exemplified by polyoxyethylene octylphenol ether and polyoxyethylene nonylphenol ether; polyoxyethylene-polyoxypropylene block copolymers; fatty acid esters of sorbitan exemplified by sorbitan monolaurate, sorbitan monopalmitate, sorbitan monostearate, sorbitan monooleate, sorbitan trioleate and sorbitan tristearate; and fatty acid esters of polyoxyethylene sorbitans exemplified by polyoxyethylene sorbitan monolaurate, polyoxyethylene sorbitan monopalmitate, polyoxyethylene sorbitan monostearate, polyoxyethylene sorbitan trioleate and polyoxyethylene sorbitan tristearate.

These and other surfactants are added in the composition of the invention preferably at an amount not exceeding 2 parts by weight, more preferably 1 part by weight of the 100 parts by weight of the total solid content.

The positive photoresist composition of the invention can further be incorporated with another acid-decomposable, dissolution-suppressing agent, a dye, a plasticizer, a sensitizer and a compound promoting the dissolution of the resist in developers.

The composition of the invention is dissolved in a solvent that can solve all the ingredients described heretofore, and the resulting solution is coated on a substrate. The solvent material used for such a purpose includes propylene glycol monoalkyl ether acetates such as propylene glycol monomethyl ether acetate and propylene glycol monoethyl ether acetate, alkyl esters of lactic acid such as methyl lactate and ethyl lactate, propylene glycol monoalkyl ethers such as propylene glycol monomethyl ether and propylene glycol monoethyl ether, ethylene glycol monoalkyl ethers such as ethylene glycol monomethyl ether and ethylene glycol monoethyl ether, ethylene glycol monoalkyl ether acetates such as ethylene glycol monomethyl ether acetate and ethylene glycol monoethyl ether acetate, 2-heptanone, acetic acid esters such as butyl acetate, γ-butylolactone, alkyl alkoxypropionates such as methyl methoxypropionate and ethyl ethoxypropionate, alkyl pyruvates such as methyl pyruvate and ethyl pyruvate, N-methylpyrrolidone, N,N-dimethylacetamide and dimethylsulfoxide. A coating solution can be prepared by using at least one kind of solvent selected from these.

Among these, propylene glycol monomethyl ether acetate, propylene glycolmonoethyl ether acetate, methyl lactate, ethyl lactate, heptanone and butyl acetate are preferred. These solvents may be used individually or in combination, but the joint use of at least one propylene glycol monoalkyl ether acetate and at least one alkyl lactate is especially preferred because of the capability of decreasing development defect. These two ingredients are preferably mixed in a weight ratio of from 95/5 to 30/70.

In the invention, the solid ingredients comprising each essential ingredient for the resist are dissolved in the solvent at a solid concentration of 3 to 25% by weight, more preferably 5 to 22% by weight, and still more preferably 7 to 20%by weight.

The positive photoresist composition prepared according to the invention is coated on a substrate to form a thin film. The thickness of the film is preferably from 0.2 to 1.2 μm. In the invention, an inorganic or organic anti-reflective coating may be adopted according to needs.

A anti-reflective coating has two classes, i.e., an inorganic type and an organic type. The former is exemplified by titanium, titanium dioxide, titanium nitride, chromium chloride, carbon and α-silicon, while the latter comprises a light-absorber and a polymer material. The inorganic coating requires various equipments such as a vacuum depositing apparatus, a CVD apparatus and a sputtering apparatus. Compositions for the organic anti-reflective coating include, for example, one set forth in Japanese Patent Publication No. 69611/1995 and comprising a condensation product of a diphenylamine derivative with a formaldehyde-modified melamine resin, an alkali-soluble resin and a light absorber, one set forth in U.S. Pat. No. 529480 based on the reaction product of a maleic anhydride copolymer and a diamine-type light absorber, one set forth in Japanese Patent Laid-Open No. 11831/1994 containing a resin binder and a methylolmelamine-type heat cross-linking agent, an acrylic resin-based one set forth in Japanese Patent Laid-Open No. 118656/1994 in which a carboxylic acid group, an epoxy group and a light-absorbing group are present in the same molecule, one set forth in Japanese Patent Laid-Open No. g 87115/1996comprising methylolmelamine and a benzophenone-type light absorber and one set forth in Japanese Patent Laid-Open No. 179509/1996 in which a low molecular weight light absorber is added in a poly(vinyl alcohol) resin.

As the organic anti-reflective coating, DUV 30 series and DUV 40 series produced by Brewer Science Inc., and AC-2 and AC-3 produced by Shipley Co., Ltd. can also be applied.

To form a desirable resist pattern, the resist solution is coated on a substrate that is used for the manufacture of precise LSI elements (such as, for example, a silicon dioxide-covered silicon wafer), or a substrate provided with an anti-reflective coating if required and necessary by a suitable coating method with use of a spinner or a coater. The coated resist layer is exposed through a pre-determined mask, and then subjected to post baking and development. As the exposure radiation, the light having a wavelength of from 150 nm to 250 nm is preferred. Specifically, the light emitted by KrF excimer lasers (248 nm), ArF excimer lasers (193 nm) or $F_2$ excimer lasers (157 nm), x-rays and electron beams are included.

The developer for the positive photoresist of the invention comprises an aqueous solution of an basic compound including inorganic ones such as sodium hydroxide, potassium hydroxide, sodium carbonate, sodium silicate, sodium meta-silicate and aqueous ammonia, and organic ones such as primary amines exemplified by ethylamine and n-propylamine, secondary amines exemplified by diethylamine and di-n-butylamine, tertiary amines exemplified by triethylamine and methyldiethylamine, alcohol amines exemplified by dimethylethanolamine and triethanolamine, quaternary ammonium salts exemplified by tetramethylammonium hydroxide and tetraethylammonium hydroxide, and cyclic amines exemplified by pyrole and piperidine.

The aqueous alkaline solution enumerated above can further contain an alcohol and a surfactant each at an appropriate amount.

EXAMPLES

More detailed descriptions of the invention will follow with reference to some examples, but the scope of the invention is not limited to the examples at all.

Synthetic Example 1

Synthesis of Example Resin (1) of the Invention

By dissolving 2-methyl-2-adamantyl methacrylate and the 5-exo-methacrylate of 6-endo-hydroxybicyclo[2.2.1] heptane-2-endo-carboxylic acid-γ-lactone at 50/50 molar ratio in a solvent comprising equal amounts of N,N-dimethylacetamide and tetrahydrofuran, 100 ml of a 20% by weight solid content solution was prepared.

The 5-exo-methacrylate of 6-endo-hydroxybicyclo[2.2.1] heptane-2-endo-carboxylic acid-γ-lactone had been synthesized by first acetoxy-lactonating 6-endo-hydroxybicyclo [2.2.1] heptane-2-endo-carboxylic acid, hydrolyzing the acetoxy group to hydroxyl group with use of alkali, and then esterifying with methacryl chloride. I.e., the method given in J. Chem. Soc., 227 (1959), and Tetrahedron, 21, 1501 (1965) was adopted.

To the solution thus prepared was added 3 mol % of V-65, a product of Wako Pure Chemical Industries, Ltd. The resulting solution was added dropwise to 10 ml of N,N-dimethylacetamide kept at 60° C. over the period of 3 hours under nitrogen atmosphere. After the termination of the addition, the reaction mixture was heated for 3 hours, then 1 mol % of V-65 was further added followed by 3 hour agitation. Then the reaction mixture was cooled to room temperature, and thrown into 3 L distilled water. The white powdery deposit was collected. A $C^{13}$ NMR measurement proved that the copolymerization ratio of the polymer was 51/49. The weight-averaged molecular weight based on the polystyrene reference was 7,200 according to GPC measurement.

Synthetic Examples 2 to 10

Synthesis of Resins of the Invention

By repeating the procedures of SYNTHETIC EXAMPLE 1, Resin (2) to Resin (17) having the compositions and molecular weights shown in Table 1 were prepared.

TABLE 1

| Synthetic Example | Resin of the Invention | Composition (Molar Ratio) m/n or m/n/p | Molecular Weight |
|---|---|---|---|
| 2 | (2) | 50/50 | 7,500 |
| 3 | (5) | 51/49 | 7,900 |
| 4 | (8) | 53/47 | 8,800 |
| 5 | (9) | 52/48 | 9,600 |
| 6 | (14) | 50/50 | 7,700 |
| 7 | (15) | 49/51 | 9,300 |
| 8 | (17) | 51/49 | 10,300 |
| 9 | (18) | 50/50 | 8,500 |
| 10 | (20) | 47/28/25 | 8,900 |
| 11 | (21) | 45/29/26 | 11,500 |
| 12 | (22) | 48/22/30 | 9,800 |
| 13 | (23) | 50/24/26 | 8,400 |
| 14 | (25) | 46/31/23 | 7,800 |
| 15 | (29) | 50/27/23 | 7,500 |
| 16 | (38) | 51/41/8 | 9,800 |
| 17 | (41) | 52/38/10 | 9,900 |

Comparative Example

Synthesis of Comparative Resin-A4

According to the synthetic method described in p.8 of Japanese Patent Laid-Open No. 274852/1998, the compound A4 defined therein was synthesized as follows.

2-Methyl-2-adamantyl methacrylate and α-methacryloyloxy-γ-butylolactone were charged in a reaction vessel at a mixing molar ratio of 50:50 (40.0 g: 29.0 g), to which was added twice the total weight of the monomers of methyl isobutyl ketone. To the resulting solution, azobisisobutylonitrile as polymerization initiator was added in an amount of 2 mol %, and the reaction mixture was heated to and kept at 80° C. for about 8 hours. Thereafter, the mixture was poured into a large quantity of heptane to form a precipitate. This operation was repeated twice for purification. As a result, a copolymer represented by the following formula was obtained.

The copolymerization ratio for each monomer unit was 50:50, and the weight-averaged molecular weight was about 8,000.

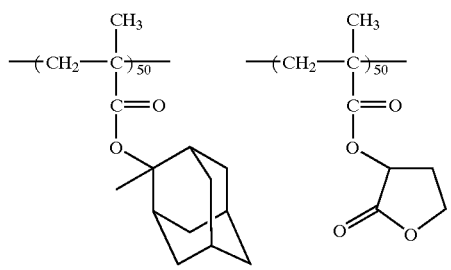

(A-4)

Synthesis of Oligomer-type Dissolution-suppressing Agent A

A Schlenk tube that had been dried in an oven followed by purging with argon was filled with t-butyl deoxycholate (2 g, 4.457 milimol) (vacuum dried at 60° C. overnight in advance), N-methylmorpholine distilled with $CaH_2$ (1.1 mL, 10 milimol) and methylene chloride (8 mL) to synthesize t-butyl deoxycholate.

To the reaction product cooled to 0°0 C., glutaryl dichloride that had been purified by distillation (0.552 g, 4.324 milimol and 97 mol %) was added slowly with use of an airtight injector. Toward the end of the addition, the salt began to precipitate. The resulting slurry was agitated, and heated to room temperature in 30 min. Thereafter, it was heated at 40° C. for 30 min.

The resulting mixture was poured in a separation funnel containing 40 mL methylene chloride and 40 mL water. After rinsed with a dilute aqueous ammonium acetate solution four times, the organic layer was condensed to form a solid product. The solid product was freeze-dried with dioxane. A powdery product resulted.

The powder was dispersed in 100 mL water and the dispersion was stirred for 1 hour. The powder was again collected by filtration and dried in vacuum. The yield was 1.5 g with a yielding ratio of 64%. When the same operations were repeated with use of THF, the yield rose to 1.7 g giving a yielding ratio of 74%. The structure of the oligomer thus obtained is shown below. This oligomer is named dissolution-suppressing agent A.

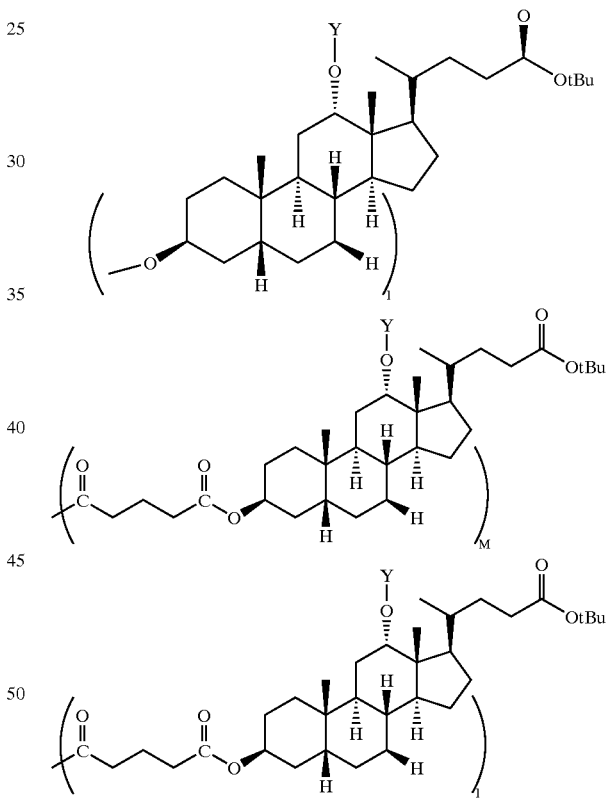

The structure shows an oligo(t-butyl deoxycholate-co-glutarate terminal-sealed with t-butyl deoxycholate (In the formula, tBu represents t-butyl substituent group, and Y represents hydrogen or another unit defined by the parentheses having a subscript M or 1.)

The number of unit M per molecule is from about 5 to about 20. As has been described previously, the condensation reaction proceeds at any OH group attached to the polycyclic compound. Accordingly, the above structure is drawn with the purpose of helping understanding the reaction product, but not to show the actual molecular structure of the product.

Synthesis of Oligomer-type Dissolution-suppressing Agent B

A Schlenk tube that had been dried in an oven followed by purging with argon was filled with t-butyl deoxycholate (2 g, 4.457 milimol) (vacuum dried at 60° C. overnight in advance), N-methylmorpholine distilled with CaH$_2$ (3.26 g, 32.2 mL, 2 milimol) and THF (35 mL) to synthesize t-butyl deoxycholate.

To the reaction product cooled to 0° C., glutaryl dichloride that had been purified by distillation (1.232 mL, 9.654 milimol, 1.632 g) was added slowly with use of an airtight injector. The Schlenk tube was tightly closed and heated to and kept at 60° C. overnight. After diluted with 20% volume methanol, the reaction mixture was mixed with 500 mL water containing acetic acid that acts to neutralize the N-methylmorpholine whereby a precipitate was formed.

The operations of dilution and precipitation were repeated twice. The polymer was again collected by filtration, rinsed with distilled water and dried in vacuum at 60° C. The yield was 4 g with a yielding rate of 74%. The structure of the oligomer thus prepared is shown below. This oligomer is named dissolution-suppressing agent B.

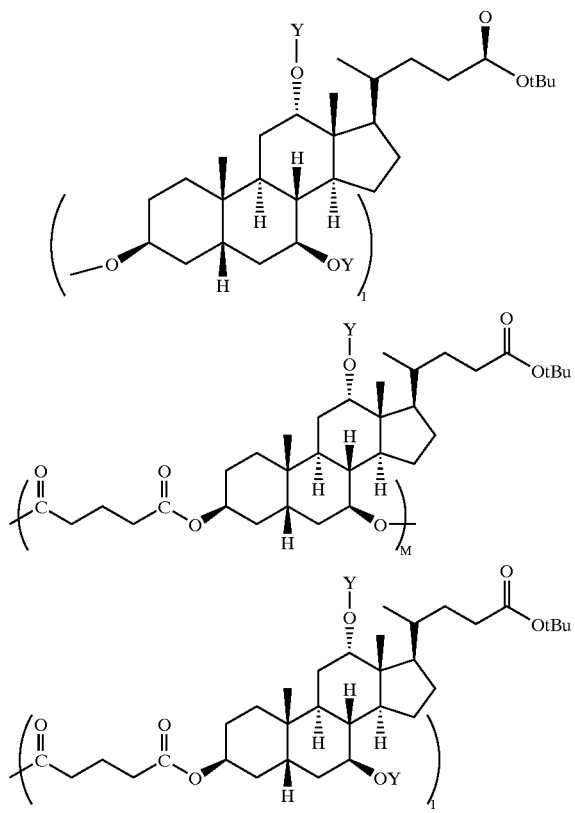

The structure shows an oligo(t-butyl cholate-co-glutarate terminal-sealed with t-butyl cholate (In the formula, tBu represents t-butyl substituent group, and Y represents hydrogen or another unit defined by the parentheses having a subscript M or 1.)

The number of unit M per molecule is from about 5 to about 20. As has been described previously, the condensation reaction proceeds at any OH group attached to the polycyclic compound. Accordingly, the condensation product of the cholate having three hydroxyl groups tends to assume a branched structure. The above structure is drawn with the purpose of helping the explanation of the reaction product, but not to show the actual molecular structure of the product.

Examples 1 to 20 and Comparative Example 1

Preparation and Evaluation of Positive Photoresist Compositions

Positive photoresist compositions of Examples 1 to 17 and of Comparative Example 1 were prepared by combining 2 g of each resin shown in Table 2, 45 mg of a photo-acid generator, 200 mg of a dissolution-suppressing agent, 5 mg of an organic basic compound and 5 mg of a surfactant, dissolving each ingredient in propylene glycol monomethyl ether acetate to give a 10% by weight solid content solution, which was filtered through a 0.1 μm micro-filter.

The surfactants shown in Table 2 are as follows.
1: Megafac F176 (fluorine-containing, made by Dainippon Ink and Chemicals, Inc.)
2: Megafac R08 (fluorine-containing and silicon-based, made by Dainippon Ink and Chemicals, Inc.)
3: Polysiloxane polymer KR-341 (made by Shin-Etsu Chemical Co., Ltd.)
4: Polyoxyethylene nonylphenyl ether
5: Troysol S-366 (made by Troy Chemical Industries, Inc.)

The organic basic compounds shown in Table 2 are as follows.
1: DBU (1,8-diazabicyclo[5.4.0]-7-undecene)
2: 4-DMAP (4-dimethylaminopyridine)
3: TPI (2,4,5-triphenylimidazole)
4: 2,6-diisopropylaniline

TABLE 2

| Example | Resin | Photo-acid Generator | Dissol.-suppressing Agent | Basic Compound | Surfact. |
|---|---|---|---|---|---|
| 1 | (1) | PAG4-7 | CI-2 | 1 | 4 |
| 2 | (2) | PAG4-8 | CI-7 | 3 | 1 |
| 3 | (5) | PAG4-5 | CI-1 | 1 | 5 |
| 4 | (8) | PAG4-6 | CI-11 | 2 | 3 |
| 5 | (9) | PAG4-36 | A | 2 | 2 |
| 6 | (14) | PAG3-23 | CI-39 | 3 | 1 |
| 7 | (15) | PAG3-21 | CI-53 | 1 | 3 |
| 8 | (17) | PAG4-34 | B | 1 | 4 |
| 9 | (18) | PAG4-26 | CI-48 | 3 | 1 |
| 10 | (20) | PAG4-38 | CI-50 | 2 | 5 |
| 11 | (21) | PAG4-41 | CII-8 | 3 | 4 |
| 12 | (22) | PAG4-45 | CI-46 | 1 | 3 |
| 13 | (23) | PAG4-52 | CI-52 | 3 | 2 |
| 14 | (25) | PAG4-48 | CII-41 | 2 | 5 |
| 15 | (29) | PAG6-24 | CI-61 | 3 | 4 |
| 16 | (38) | PAG3-22 | CI-68 | 1 | 2 |
| 17 | (41) | PAG4-6 | CI-22 | 3 | 1 |
| Compar. Example 1 | (A-4) | PAG4-5 | — | 4 | — |

1: DBU (1,8-diazabicyclo[5.4.0]-7-undecene)
2: 4-DMAP (4-dimethylaminopyridine)
3: TPI (2,4,5-triphenylimidazole)
4: 2,6-diisopropylaniline Evaluation Tests On a silicon wafer was coated AR19, a anti-reflective coating made by Shipley Co., Ltd., which was baked at 215° C. for 90 sec to give a 850 A thick coating. Each of the resist compositions was coated on the wafer thus treated and baked at 135° C. for 90 sec to give a 0.30 μm thick film.

The coated wafer was installed in an ArF excimer laser stepper (an ArF exposing machine made by ISI, Ltd.) and subjected to exposure with varying exposure amounts. Then, after heated at 150° C. for 90 sec in a clean room, the exposed wafer was developed with a tetramethylammonium hydroxide developer (2.38% by weight) for 60 sec, rinsed with water, and dried to give rise to resist patterns.

Contact Hole Pattern Resolution

For each resist, contact hole pattern resolution was defined by the contact hole diameter ($\mu$m) resolvable with the minimal exposure required to reproduce a 0.18 diameter contact hole.

Pitch Dependency of Contact Hole Pattern

Each resist was exposed to dense patterns (0.18 $\mu$m diameter contact holes with 0.36 $\mu$m pitch) with the exposure required to reproduce isolated 0.18 $\mu$m contact hole patterns (with 1.80 $\mu$m pitch) The actual dimensions of the two patterns were measured and the dimensional difference in $\mu$m between the two was calculated. A smaller value of this difference indicates that the dependence on pattern pitch is weaker and more desirable.

Trench Pattern Resolution

For each resist, trench pattern resolution was defined by the pattern slit width in $\mu$m resolvable with the minimum exposure amount required to reproduce a 0.16 $\mu$m diameter trench pattern with use of a binary mask.

TABLE 3

| Example | Contact Hole Pat. Resolution ($\mu$m) | Pitch dependency ($\mu$m) | Trench Pat. Resolution ($\mu$m) |
|---|---|---|---|
| 1 | 0.13 | 0.033 | 0.125 |
| 2 | 0.145 | 0.031 | 0.13 |
| 3 | 0.14 | 0.043 | 0.12 |
| 4 | 0.145 | 0.035 | 0.125 |
| 5 | 0.135 | 0.038 | 0.125 |
| 6 | 0.14 | 0.020 | 0.12 |
| 7 | 0.125 | 0.023 | 0.115 |
| 8 | 0.13 | 0.025 | 0.11 |
| 9 | 0.13 | 0.027 | 0.11 |
| 10 | 0.15 | 0.030 | 0.13 |
| 11 | 0.15 | 0.035 | 0.125 |
| 12 | 0.145 | 0.032 | 0.13 |
| 13 | 0.125 | 0.015 | 0.105 |
| 14 | 0.14 | 0.030 | 0.135 |
| 15 | 0.125 | 0.025 | 0.105 |
| 16 | 0.145 | 0.041 | 0.13 |
| 17 | 0.13 | 0.030 | 0.11 |
| Compar. Example 1 | 0.18 | 0.085 | 0.16 |

As is shown in Table 2, the positive photoresist composition exhibits an excellent contact hole pattern as well as trench pattern resolution, and at the same time a low pitch dependency.

According to the invention, a positive photoresist composition used for the manufacture of semiconductor devices is provided which can resolve fine contact hole patterns and trench patterns, and exhibit a low pattern pitch dependency.

The entire disclosure of each and every foreign patent application from which the benefit of foreign priority has been claimed in the present application is incorporated herein by reference, as if fully set forth.

What is claimed is:

1. A positive photoresist composition comprising:
    (A) a compound capable of generating an acid upon irradiation with one of an actinic ray and a radiation;
    (B) a resin capable of decomposing by the action of an acid to increase the solubility in an alkali, in which the resin contains a repeating unit having at least one of groups represented by formulae (I-1) to (I-4) below and a repeating unit containing an alkali-soluble group protected by at least one of groups containing an alicyclic hydrocarbon structure, which are represented by formulae (pI) to (pVI) below; and
    (C) at least one compound selected from the group consisting of:
    a compound represented by formula (CI) below;
    a compound represented by formula (CII) below; and
    a compound containing at least two structures, each of which includes a polycyclic structure represented by formula (CIII) below, wherein the polycyclic structure has at least one substituent containing a carboxylic acid group protected by an acid-labile group:

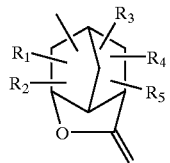

(I-1)

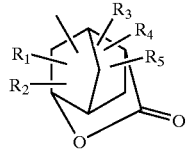

(I-2)

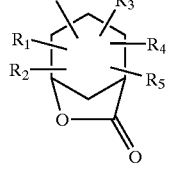

(I-3)

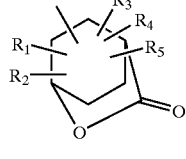

(I-4)

wherein $R_1$ to $R_5$, which are the same or different, each represents a hydrogen atom, an alkyl, a cycloalkyl or an alkenyl group; two of $R_1$ to $R_5$ may combine together to form a ring;

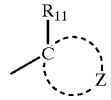

(pI)

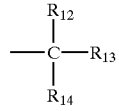

(pII)

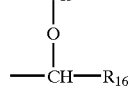

(pIII)

-continued

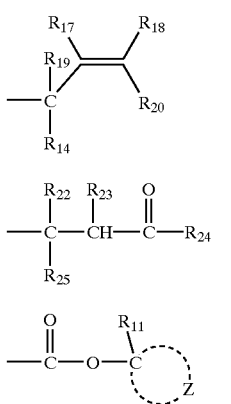

wherein $R_{11}$ represents methyl, ethyl, n-propyl, isopropyl, n-butyl, isobutyl or sec-butyl group; Z represents an atomic group necessary to form an alicyclic hydrocarbon group having 7 to 25 carbon atoms together with the carbon atom; $R_{12}$ to $R_{16}$ each independently represents a straight chain or branched alkyl group having 1 to 4 carbon atoms or an alicyclic hydrocarbon group, and at least one of $R_{12}$ to $R_{14}$, or at least one of $R_{15}$ and $R_{16}$ represents an alicyclic hydrocarbon group; $R_{17}$ to $R_{21}$ each independently represents a hydrogen atom, a straight chain or branched alkyl group having 1 to 4 carbon atoms or an alicyclic hydrocarbon group, and at least one of $R_{17}$ to $R_{21}$ represents an alicyclic hydrocarbon group; $R_{19}$ or $R_{21}$ represents a straight chain or branched alkyl group having 1 to 4 carbon atoms, or an alicyclic hydrocarbon group; $R_{22}$ to $R_{25}$ each independently represents a straight chain or branched alkyl group having 1 to 4 carbon atoms or an alicyclic hydrocarbon group, and at least one of $R_{22}$ to $R_{25}$ represents an alicyclic hydrocarbon group;

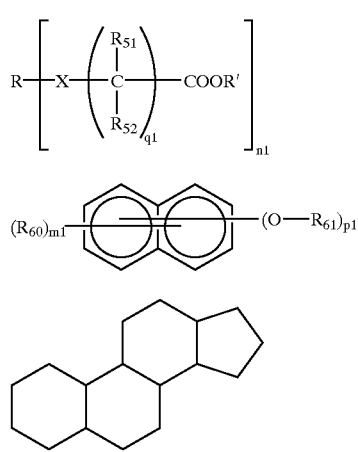

wherein X represents an oxygen atom, a sulfur atom, —N($R_{53}$)— or a single bond; $R_{51}$, $R_{52}$ and $R_{53}$ each independently represents a hydrogen atom or an alkyl group; R' represents a group necessary to form an acid-decomposable group of —COOR'; R represents a n1-valent residue containing a bridge-containing hydrocarbon, a saturated cyclic hydrocarbon or a naphthalene ring; n1 represents an integer of 1 to 4; q1 represents an integer of 0 to 10; $R_{60}$ represents an alkyl group or a halogen atom; $R_{61}$, represents a group necessary to form an acid-decomposable group of —O—$R_{61}$; m1 represents an integer of 0 to 4; p1 represents an integer of 1 to 4.

2. The positive photoresist composition according to claim 1, wherein the at least one of the groups represented by formulae (pI) to (pVI) is represented by formula (II):

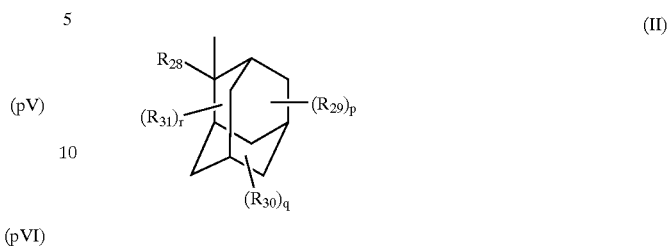

wherein $R_{28}$ represents an alkyl group; $R_{29}$ to $R_{31}$, which are the same or different, each represents hydroxyl group, a halogen atom, carboxyl group, alkyl, cycloalkyl, alkenyl, alkoxy, alkoxycarbonyl or acyl group; p, q and r each independently represents an integer of 0 to 3.

3. The positive photoresist composition according to claim 1, wherein the resin (B) further contains a repeating unit represented by formula (a):

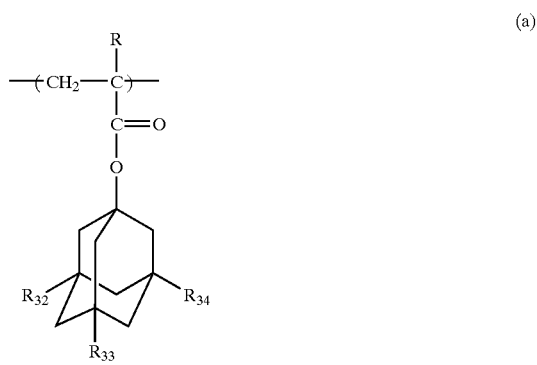

wherein R represents a hydrogen atom, a halogen atom, an alkyl group having 1 to 4 carbon atoms; $R_{32}$ to $R_{34}$, which are the same or different, each represents a hydrogen atom or hydroxyl group, and at least one of $R_{32}$ to $R_{34}$ represents hydroxyl group.

4. The positive photoresist composition according to claim 1, wherein the resin (B) further contains at least one of repeating units represented by formulae (III-a) to (III-d):

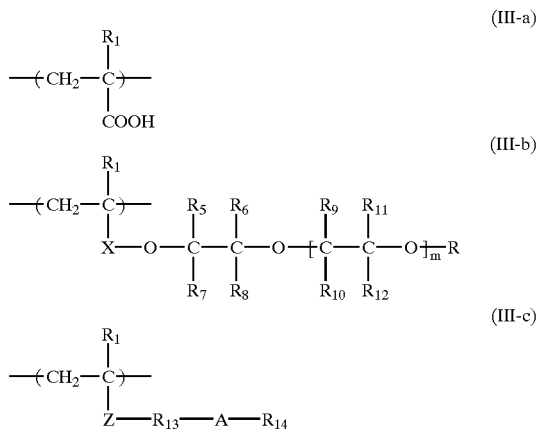

(III-d)

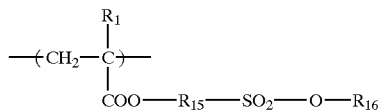

wherein $R_1$ represents a hydrogen atom, a halogen atom, an alkyl group having 1 to 4 carbon atoms; $R_5$ to $R_{12}$ each independently represents a hydrogen atom or an alkyl group; R represents a hydrogen atom, an alkyl, cycloalkyl, aryl or aralkyl group; m represents an integer of 1 to 10; X represents a single bond, an alkylene group, a cycloalkylene group, an arylene group, an ether group, a thioether group, a carbonyl group, an ester group, an amide group, a sulfonamide group, an urethane group, an urea group, or a divalent group which is not decomposed by the action of an acid, and which is a divalent group resulting from the combination of at least two groups selected from the group consisting of an alkylene group, a cycloalkylene group, an arylene group, an ether group, a thioether group, a carbonyl group, an ester group, an amide group, a sulfonamide group, an urethane group and an urea group; Z represents a single bond, an ether group, an ester group, an amide group, an alkylene group, or a divalent group resulting from the combination of at least two group of an ether group, an ester group, an amide group and an alkylene group; $R_{13}$ represents a single bond, an alkylene group, an arylene group, or a divalent group resulting from the combination of an alkylene group and an arylene group; $R_{15}$ represents an alkylene group, an arylene group, or a divalent group resulting from the combination of an alkylene group and an arylene group; $R_{14}$ represents an alkyl, cycloalkyl, aryl or aralkyl group; $R_{16}$ represents a hydrogen atom, an alkyl, cycloalkyl, alkenyl, aryl or aralkyl group; A represents one of the following functional groups:

—CO—NH—SO$_2$—

—SO$_2$—NH—CO—

—NH—CO—NH—SO$_2$—

—SO$_2$—NH—CO—NH—

—O—CO—NH—SO$_2$—

—SO$_2$—NH—CO—O—

—SO$_2$—NH—SO$_2$—

5. The positive photoresist composition according to claim 1, wherein the resin (B) contains the repeating unit having at least one of groups represented by formulae (I-1) to (I-4) in an amount of 30 to 70 mol %, base on the total repeating units.

6. The positive photoresist composition according to claim 1, wherein the resin (B) contains the repeating unit containing an alkali-soluble group protected by at least one of groups represented by formulae (pI) to (pVI) in an amount of 20 to 75 mol %, based on the total repeating units.

7. The positive photoresist composition according to claim 3, wherein the resin (B) contains the repeating unit represented by formula (a) in an amount of 10 to 40 mol %, based on the total repeating units.

8. The positive photoresist composition according to claim 4, wherein the resin (B) contains the repeating unit represented by formulae (III-a) to (III-d) in an amount of 0.1 to 30 mol %, based on the total repeating units.

9. The positive photoresist composition according to claim 1, which further comprises (D) an organic basic compound.

10. The positive photoresist composition according to claim 1, which further comprises (F) surfactant containing at least one of a fluorine atom and a silicon atom.

11. The positive photoresist composition according to claim 1, wherein the compound (A) is at least one of a sulfonic acid salt of sulfonium and a sulfonic acid salt of iodonium.

12. The positive photoresist composition according to claim 1, wherein the compound (A) is at least one of a sulfonate compound of N-hydroxy-imide and a sulfonyldiazomethane compound.

13. The positive photoresist composition according to claim 1, which comprises the compound (A) i n an amount of 0.01 to 30% by weight, based on the total solid content of the composition.

14. The positive photoresist composition according to claim 1, which comprises the resin (B) in an amount of 40 to 99.99% by weight, based on the total solid content of the composition.

15. The positive photoresist composition according to claim 1, which comprises the compound (C) in an amount of 1 to 40% by weight, based on the total solid content of the composition.

16. The positive photoresist composition according to claim 1, which is a positive photoresist composition to be irradiated with a deep UV light having the wavelength range of from 150 to 220 nm.

* * * * *